US012560639B2

(12) United States Patent
Lehmer et al.

(10) Patent No.: US 12,560,639 B2
(45) Date of Patent: Feb. 24, 2026

(54) TRACKING OF HEALTH AND RESILIENCE OF PHYSICAL EQUIPMENT AND RELATED SYSTEMS

(71) Applicants: Battelle Energy Alliance, LLC, Idaho Falls, ID (US); Virginia Commonwealth University, Richmond, VA (US); University of Idaho, Moscow, ID (US)

(72) Inventors: Jacob P. Lehmer, Idaho Falls, ID (US); Craig G. Rieger, Pocatello, ID (US); Bjorn C. Vaagensmith, Idaho Falls, ID (US); Tyler B. Phillips, Idaho Falls, ID (US); Timothy R. McJunkin, Idaho Falls, ID (US); Robert C. Ivans, Ammon, ID (US); Vivek Kumar Singh, Ammon, ID (US); Justin J. Welch, Idaho Falls, ID (US); Ruixuan Li, Idaho Falls, ID (US); Daniel Marino Lizarazo, Richmond, VA (US); Chathurika Mudiyanselage Wickramasinghe Brahmana Mudiyanselage, Richmond, VA (US); Milos Manic, Henrico, VA (US); Brian Johnson, Richmond, VA (US)

(73) Assignees: Battelle Energy Alliance, LLC, Idaho Falls, ID (US); Virginia Commonwealth University, Richmond, CA (US); University of Idaho, Moscow, ID (US)

( * ) Notice: Subject to any disclaimer, the term of this patent is extended or adjusted under 35 U.S.C. 154(b) by 432 days.

(21) Appl. No.: 17/811,843

(22) Filed: Jul. 11, 2022

(65) Prior Publication Data

US 2023/0021214 A1 Jan. 19, 2023

Related U.S. Application Data

(60) Provisional application No. 63/203,146, filed on Jul. 9, 2021.

(51) Int. Cl.
  *G01R 31/08* (2020.01)
  *G01R 31/36* (2020.01)
  (Continued)

(52) U.S. Cl.
  CPC ........... *G01R 31/086* (2013.01); *G01R 31/36* (2013.01); *G06T 11/206* (2013.01); *H02S 50/10* (2014.12);
  (Continued)

(58) Field of Classification Search
  CPC ....... G01R 31/086; G01R 31/36; H02S 50/10; G06T 11/206; G06T 2200/24; H04L 43/028
  See application file for complete search history.

(56) References Cited

U.S. PATENT DOCUMENTS 9,203,859 B2 12/2015 Sampigethaya
9,405,900 B2 8/2016 Dixit et al.
(Continued)

FOREIGN PATENT DOCUMENTS

CN 107704670 A 2/2018
CN 111953657 A 11/2020
(Continued)

OTHER PUBLICATIONS

Best et al., "7 Key Challenges for Visualization in Cyber Network Defense", VizSec '14: Proceedings of the Eleventh Workshop on Visualization for Cyber Security, (Nov. 2014), (https://doi.org/10.1145/2671491.2671497), 8 pages.
(Continued)

*Primary Examiner* — Lisa M Caputo
*Assistant Examiner* — Nyla Gavia
(74) *Attorney, Agent, or Firm* — TraskBritt

(57) ABSTRACT

Tracking of health and resilience of physical equipment and related systems are disclosed. A system includes physical
(Continued)

equipment and one or more processors. The physical equipment includes one or more assets. The one or more processors are configured to determine a resilience metric for the physical equipment. The resilience metric includes a real power component and a reactive power component based, at least in part, on an aggregation of real components and reactive components of adaptive capacities of the one or more assets. A cyber-physical system includes physical equipment, network equipment configured to enable the physical equipment to communicate over one or more networks, a physical anomaly detection system (ADS) configured to detect anomalies in operation of the physical equipment and provide a physical component of a cyber-physical metric, and a cyber ADS configured to detect anomalies in network communications over the one or more networks.

21 Claims, 37 Drawing Sheets

(51) Int. Cl.
G06T 11/20 (2006.01)
H02S 50/10 (2014.01)
H04L 43/028 (2022.01)

(52) U.S. Cl.
CPC ........ H04L 43/028 (2013.01); G06T 2200/24 (2013.01)

(56) References Cited

U.S. PATENT DOCUMENTS

| | | | |
|---|---|---|---|
| 9,652,213 B2 | 5/2017 | Maccleery et al. | |
| 10,686,806 B2 | 6/2020 | Abbaszadeh et al. | |
| 10,826,932 B2 | 11/2020 | Abbaszadeh et al. | |
| 10,841,322 B2 | 11/2020 | Giani et al. | |
| 10,896,261 B2 | 1/2021 | Rieger et al. | |
| 10,931,706 B2 | 2/2021 | Sant-Miller et al. | |
| 11,005,870 B2 | 5/2021 | Yan et al. | |
| 11,902,318 B2 * | 2/2024 | Rivera | H04L 63/1441 |
| 2012/0077527 A1 * | 3/2012 | Santiago | H02J 13/00034 |
| | | | 702/58 |
| 2014/0156031 A1 | 6/2014 | Anderson et al. | |
| 2018/0262525 A1 | 9/2018 | Yan et al. | |
| 2019/0188797 A1 | 6/2019 | Przechocki et al. | |
| 2019/0228110 A1 * | 7/2019 | Yan | G06N 3/047 |
| 2020/0026253 A1 * | 1/2020 | Fuhr | G06F 21/602 |
| 2020/0112573 A1 | 4/2020 | Adamski | |
| 2020/0233956 A1 * | 7/2020 | Wang | B60L 53/305 |
| 2020/0292608 A1 * | 9/2020 | Yan | G06N 3/044 |
| 2020/0322366 A1 | 10/2020 | Yan et al. | |
| 2020/0327205 A1 * | 10/2020 | Wang | G06F 7/58 |
| 2020/0389478 A1 | 12/2020 | Abbaszadeh et al. | |
| 2021/0037044 A1 | 2/2021 | Achanta et al. | |
| 2021/0089661 A1 | 3/2021 | Rieger et al. | |
| 2021/0110319 A1 | 4/2021 | Gourisetti et al. | |
| 2021/0112090 A1 | 4/2021 | Rivera et al. | |

FOREIGN PATENT DOCUMENTS

| | | | | | |
|---|---|---|---|---|---|
| CN | 112966375 A | * | 6/2021 | ............. | G06F 30/20 |
| WO | WO-2014116888 A1 | * | 7/2014 | ........... | H04L 63/145 |
| WO | WO-2020096560 A1 | * | 5/2020 | ........ | H02J 13/00006 |
| WO | 2021/095051 A1 | | 5/2021 | | |

OTHER PUBLICATIONS

Chang et al., "Enabling Situational Awareness in Operational Technology Environments Through Software Defined Networking", Journal of Information Warfare, Winter 2019, vol. 18, No. 4,
Preparing for a Future of Critical Infrastructure Under Atomic Control: Special Edition, 12 pages.
Cicilio et al., "Resilience in an Evolving Electrical Grid", MDPI Journal, Energies, 2021, 14, 694, 25 pages.
Fink et al., "Visual Correlation of Host Processes and Network Traffic", Workshop on Visualization for Computer Security, IEEE, 2005, 9 pages.
Hasandka et al., "NREL's Cyber-Energy Emulation Platform for Research and System Visualization", Golden, CO: National Renewable Energy Laboratory, NREL/TP-5R00-74142, (available at: https://www.nrel.gov/docs/fy20osti/74142.pdf), 2020, 35 pages.
Huang et al., "Integration of Preventive and Emergency Responses for Power Grid Resilience Enhancement", IEEE Transactions on Power Systems, vol. 32, No. 6, Nov. 2017, 13 pages.
Le Blanc et al., "Characterizing Cyber Tools for Monitoring Power Grid Systems: What Information is Available and Who Needs It?", IEEE International Conference on Systems, Man, and Cybernetics (SMC), Oct. 2017, 6 pages.
Lohfink et al., "Security in Process: Visually Supported Triage Analysis in Industrial Process Data", IEEE Transactions on Visualization and Computer Graphics, vol. 26, No. 4, Apr. 2020, 12 pages.
Matuszak et al., "CyberSAVe—Situational Awareness Visualization for Cyber Security of Smart Grid Systems", VizSec '13: Proceedings of the Tenth Workshop on Visualization for Cyber Security, Oct. 2013, (https://doi.org/10.1145/2517957.2517961), pp. 25-32.
Naseem et al., "CSPoweR-Watch: A Cyber-Resilient Residential Power Management System", International Conference on Internet of Things (iThings) and IEEE Green Computing and Communications (GreenCom) and IEEE Cyber, Physical and Social Computing (CPSCom) and IEEE Smart Data (SmartData), 2019, 8 pages.
National Academies of Sciences, Engineering, and Medicine, "Enhancing the Resilience of the Nation's Electricity System", Washington, DC: The National Academies Press. https://doi.org/10.17226/24836, (2017), 171 pages.
Panel Details, IEEE ISGT NA 2020: "Enabling Intelligent and Resilient Communities", (available at: https://attend.ieee.org/isgt-na-2020/plenary-sessions/panel-details/), accessed Jun. 10, 2021, 27 pages.
Phillips et al., "A Framework for Evaluating the Resilience Contribution of Solar PV and Battery Storage on the Grid", IEEE, 2020 Resilience Week (RWS), 2020, pp. 133-139, doi: 10.1109/RWS50334.2020.9241296.
Phillips et al., "An Operational Resilience Metric for Modern Power Distribution Systems", IEEE 20th International Conference on Software Quality, Reliability and Security Companion (QRS-C), 2020, 9 pages.
Rieger et al., "Resilient Control Systems—Basics, Benchmarking and Benefit", IEEE Access, vol. 9, 2021, 13 pages.
Saxena et al., "CPSA: A Cyber-Physical Security Assessment Tool for Situational Awareness in Smart Grid", Session: Threat Analysis and Risk Assessment, CPS-SPC'17, Nov. 2017, 11 pages.
Scholtz et al., "Cybersecurity Awareness in the Power Grid", Springer International Publishing Switzerland, 2016, D. Nicholson (ed), Advances in Human Factors in Cybersecurity, Advances in Intelligent Systems and Computing 501, DOI 10.1007/978-3-319-41932-9_15, 11 pages.
Scholtz et al., "Employing a User-Centered Design Process for Cybersecurity Awareness in the Power Grid", Journal of Human Performance in Extreme Environments, vol. 14, Issue 1, Article 4, 2018, 16 pages.
Sivils et al., "Integrated Cyber Physical Assessment and Response for Improved Resiliency", Springer International Publishing AG, part of Springer Nature 2019, F. Cicirelli et al. (eds), The Internet of Things for Smart Urban Ecosystems, Internet of Things, (available at: https://doi.org/10.1007/978-3-319-96550-5_3), 2019, 24 pages.
Staheli et al., "Visualization Evaluation for Cyber Security: Trends and Future Directions", VizSec '14: Proceedings of the Eleventh Workshop on Visualization for Cyber Security, Nov. 2014, (available at: https://doi.org/10.1145/2671491.2671492), 8 pages.

(56) References Cited

OTHER PUBLICATIONS

The Electric Power Research Institute, Inc., "Electric Power System Resiliency: Challenges and Opportunities", (Feb. 2016), 56 pages.
U.S. Department of Energy, "Solar Energy Technologies Office 2020 Portfolio", Office of Energy Efficiency & Renewable Energy, (available at: https://www.energy.gov/sites/default/files/2020/07/f76/SETO%20Portfolio%20Book%202020.pdf), Apr. 2020, 160 pages.
Vaagensmith et al., "Review of Design Elements Within Power Infrastructure Cyber-Physical Test Beds as Threat Analysis Environments", MDPI Journal, Energies, 2021, 14, 1409, 24 pages.
Wadhawan et al., "A Comprehensive Analysis of Smart Grid Systems Against Cyber-Physical Attacks", MDPI Journal, Electronics 2018, 7, 249, 25 pages.

* cited by examiner

2302

2306

2308

2304

2310

2312

2500

2600

2900

3000

1

TRACKING OF HEALTH AND RESILIENCE OF PHYSICAL EQUIPMENT AND RELATED SYSTEMS

CROSS-REFERENCE TO RELATED APPLICATION

This application claims the benefit under 35 U.S.C. § 119(e) of U.S. Provisional Patent Application Ser. No. 63/203,146, filed Jul. 9, 2021, and titled "TRACKING OF HEALTH AND RESILIENCE OF PHYSICAL EQUIPMENT AND RELATED SYSTEMS," the disclosure of which is hereby incorporated herein in its entirety by this reference.

GOVERNMENT RIGHTS

This invention was made with government support under Contract Number DE-AC07-05-ID14517 awarded by the United States Department of Energy. The government has certain rights in the invention.

TECHNICAL FIELD

This disclosure relates generally to tracking of health and resilience of physical equipment, and more particularly to monitoring of cyber-physical systems (CPSs) such as power distribution systems.

BACKGROUND

CPSs have become ubiquitous in the core of mission-critical infrastructure due to their competitive advantages such as adaptability, scalability, resiliency, and usability. Such CPSs may take the form of a collection of interconnected physical and computing resources to accomplish a specific task. Such CPSs may also integrate computational needs, communication, control over environment variables and changes, and physical processes into a single system. These operations may be coordinated, controlled, integrated, and monitored by a communicating, computing core. The confidentiality, integrity, and availability of the information circulating such networks may be relevant to proper execution of tasks of CPSs. A compromise on the confidentiality, integrity, and/or availability of the information circulating in such networks may lead to a cascade of catastrophic failures.

BRIEF SUMMARY

In some embodiments a system includes physical equipment and one or more processors. The physical equipment includes one or more assets. The one or more processors are configured to determine a resilience metric for the physical equipment. The resilience metric includes a real power component and a reactive power component based, at least in part, on an aggregation of real components and reactive components of adaptive capacities of the one or more assets.

In some embodiments a cyber-physical system includes physical equipment, network equipment, a physical anomaly detection system (ADS), and a cyber ADS. The network equipment is configured to enable the physical equipment to communicate over one or more networks. The physical ADS is configured to detect anomalies in operation of the physical equipment and provide a physical component of a cyber-physical metric. The cyber ADS is configured to detect anomalies in network communications over the one or more networks.

In some embodiments an electrical power distribution system includes physical equipment, network equipment, and one or more processors. The physical equipment includes a solar generator asset and a battery power storage asset. The network equipment is configured to enable the physical equipment to communicate over one or more networks. The one or more processors are configured to determine a physical health metric indicating a physical health of the physical equipment, determine a cyber health metric indicating a cyber health of the network equipment, and determine a resilience metric for the physical equipment. The resilience metric includes a real power component and a reactive power component based, at least in part, on the physical health of the physical equipment and the cyber health of the network equipment.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Figures 1, 2:
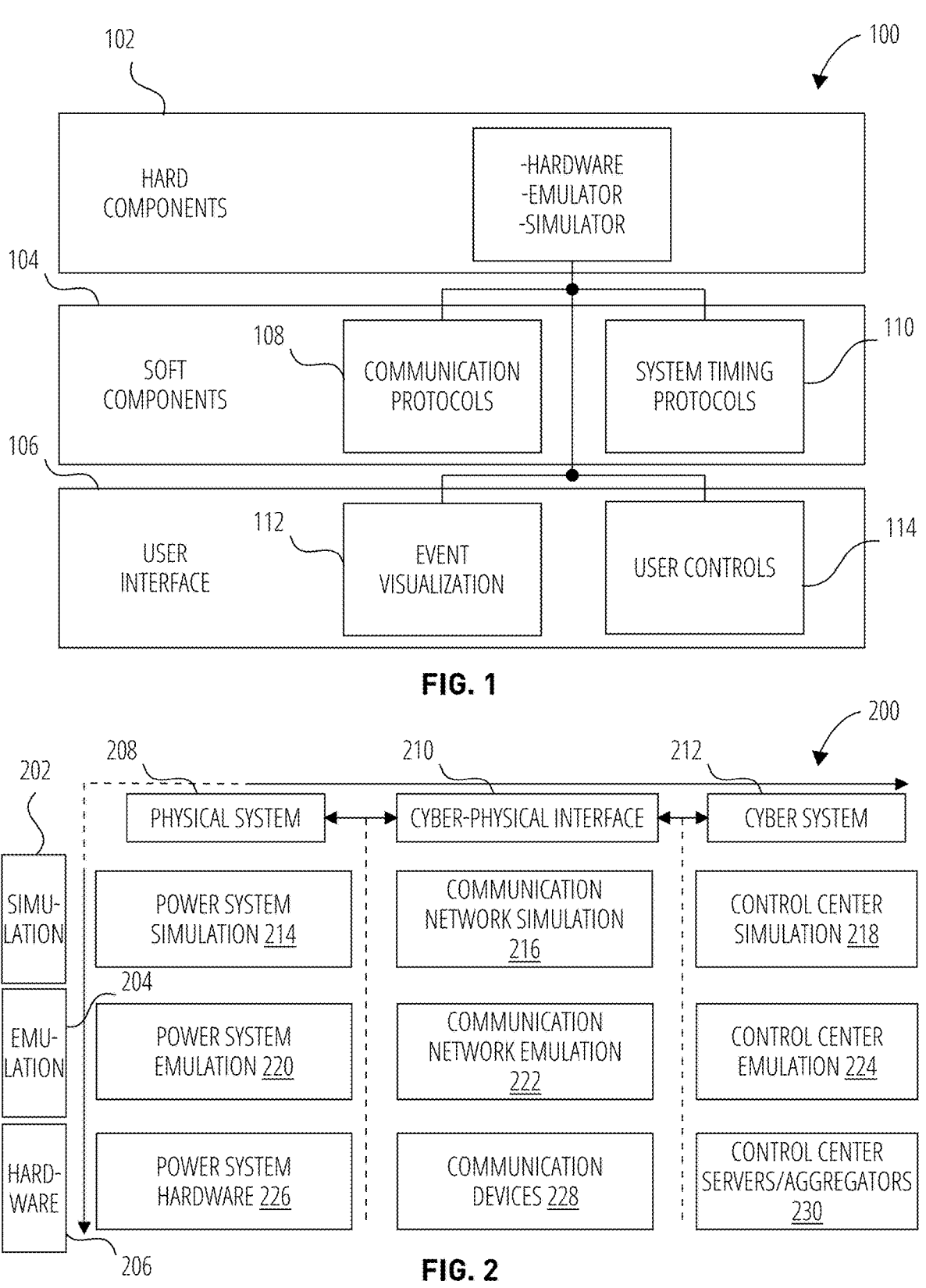
FIG. 1 illustrates levels of consideration for cyber-physical testbed construction, according to some embodiments.
FIG. 2 is a block diagram illustrating different solutions for representing physical, cybernetic, and cyber-physical components of a cyber-physical test bed, according to some embodiments.

In the following detailed description, reference is made to the accompanying drawings, which form a part hereof, and in which are shown, by way of illustration, specific examples of embodiments in which the present disclosure may be practiced. These embodiments are described in sufficient detail to enable a person of ordinary skill in the art to practice the present disclosure. However, other embodiments enabled herein may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. In some instances similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

It will be readily understood that the components of the embodiments as generally described herein and illustrated in the drawings could be arranged and designed in a wide variety of different configurations. Thus, the following description of various embodiments is not intended to limit the scope of the present disclosure, but is merely representative of various embodiments. While the various aspects of the embodiments may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art will understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the embodiments disclosed herein may be implemented or performed with a general purpose processor, a special purpose processor, a digital signal processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to embodiments of the present disclosure.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may include one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

CPSs are an integral part of modern society. Enhancing these systems' reliability and resilience may be beneficial. Cyber-physical testbeds (CPTs) are a safe way to test and explore the interplay between the cyber and physical domains and to cost-effectively enhance the reliability and resilience of CPSs. According to various embodiments disclosed herein, CPT elements are broken down into physical components (e.g., simulators, emulators, and physical hardware, without limitation), soft components (e.g., communication protocols, network timing protocols, without limitation), and user interfaces (e.g., visualization-dashboard design considerations, without limitation). Various methods used to validate CPS performance are reviewed and evaluated for potential applications in CPT performance validation. Also, initial simulated results for embodiments of CPT design (e.g., based on the IEEE 33 bus system, without limitation) are disclosed, along with a brief discussion on how model-based testing and fault-injection-based testing (e.g., using scaling and ramp-type attacks, without limitation) may be used to help validate CPT performance.

According to various embodiments disclosed herein, characterization of cyber-physical attacks may involve a holistic understanding of cyber and physical behavior in a system. Machine Learning Anomaly Detection may provide a compelling solution for continuously identifying suspicious behavior within these complex systems. Some embodiments disclosed herein include approaches for holistic health characterization of cyber-physical systems based, at least in part, on cyber and physical anomaly correlation. Some embodiments disclosed herein may include three main components: 1) an architecture for real-time data acquisition, management, and analysis of both cyber and physical data; 2) cyber and physical data-driven anomaly detection systems (ADSs), and 3) a metric that combines cyber and physical ADSs to provide a holistic characterization of the system.

Benefits of some embodiments disclosed herein may include: 1) an integrated solution that supports real-time analysis and correlation of cyber and physical events, 2) a holistic characterization of the system that allows differentiating between physical faults and cyber-attack-induced faults, and 3) a machine learning approach that enables automation of the cyber-physical system characterization while reducing the risk of human bias. Experimental analysis on a power-grid use case using the IEEE-33 bus model is also disclosed herein. Some embodiments disclosed herein may be able to distinguish between a normal state, physical faults, cyberattacks, and cyber-physical attacks.

Since CPSs are at the core of many critical infrastructures, CPSs may be vulnerable to various attack vectors. Communication and computing cores of CPSs have made them vulnerable to a diverse array of cyber-attacks, ranging from interception, Denial of Service (DoS), and even attacks targeted towards the replacement and removal of information transferred over communication channels. In addition to cyberattacks, CPSs may also be interrupted due to physical component failures. These attacks can lead to a cascade of catastrophic failures, which may even result in complete shutdown. Therefore, building resilient CPSs may involve substantially continuous monitoring of a cyber communication network and a physical environment of devices and machines by implementing anomaly detection systems.

In order to efficiently and effectively perform anomaly detection, several different techniques, hailing from a diverse array of perspectives, may be employed. Cyber-Physical Health Characterization is a complex process that should be performed accurately in real-time, reducing the time needed to detect and restore the system to a healthy state. In some embodiments, overall system health monitoring is performed in real-time, in the sense that both cyber and physical components are evaluated together in real-time schemes. In contrast, conventional anomaly detection in CPSs mainly considers cyber and physical data separately. Some embodiments disclosed herein introduce a threat characterization metric that includes root cause analysis of detected anomalies.

Some embodiments disclosed herein include a data-driven cyber-physical metric, based at least in part on detection of anomalies on both cyber and physical components of the system. Integrating data hailing from physical and cyber elements allows for a comprehensive analysis of the network system architecture and permits the efficient assessment of the different states of the CPS. A data-driven Anomaly Detection System (ADS), which combines anomaly detection on a physical level and a cyber level, may be employed. The Physical ADS performs analysis on data received using the DNP3 protocol and the Cyber ADS employs sensors to capture and analyze the incoming network packets in real-time. Two unsupervised algorithms were implemented, namely one-class support vector machines (OCSVM) and Local Outlier Factor (LOF). The unsupervised here refers to the fact that these algorithms do not include any prior knowledge (labels) on data.

Some embodiments disclosed herein include the establishment of a full data-driven pipeline that effectively exploits machine learning algorithms in the context of detecting anomalies on a cyber-physical level and characterizing these anomalies in order to conclude on the extent to which each anomaly affects the health of the system. By way of non-limiting examples, the contributions may include: 1) a full data-driven pipeline that performs data acquisition, management, and analysis of both cyber and physical data without manual configuration of traditional intrusion detection systems while providing defense against unknown threats; 2) a threat characterization metric based on the coupling of Cyber-Physical Anomaly Detection Systems (ADS); and 3) use of anomaly detection on cyber and physical data to correlate cyber and physical anomalies, providing distinction between physical faults and cyber-physical attacks.

As mentioned above, CPSs may be targets for many cyberattack vectors such as DoS, data injection, and interception schemes. Anomaly Detection Systems (ADSs) are becoming a common component of CPSs. These ADSs may be implemented to detect anomalies in CPS networks. These anomalies may be signs that an intruder is attempting unauthorized access to the system. ADSs that are implemented to detect cyber-attacks and intrusion attempts in CPSs are referred to herein as Anomaly-based Intrusion Detection Systems. Due to the complex nature of CPSs, various ADS strategies may be used.

Procedural constraints of CPS, such as the repetitious nature of activities related with industrial environments, may be exploited to detect anomalies and to identify specific cyberattacks against the system. Pattern matching methodologies may be employed over specific communication protocols' elements, or particular network traffic characteristics may be examined and their importance may be determined. Other more attack-centric approaches may be employed, in that the evaluation of a system's cybersecurity may be performed by investigating the specific alterations to the system that given attacks may provoke, whether it be malware attacks, attacks on communication protocols, DoS, Man-In-the-Middle, false sequential, data or code injection, or other integrity attacks.

Approaches for recognizing anomalies may also target towards Cyber-Physical System Health Monitoring and Management (HMM) systems. Such approaches include ADS implementations that employ different types of modern machine learning and neural network methodologies. Such approaches may identify the faulty components by implementing a Fault Signature Matrix (FSM), which associates sensors and target system components with rules that describe the normal behavior of the system. Several data science oriented implementations may transform the sensor-obtained time-series data into Gramian Angular Field (GAF) images. Then they have trained Autoencoder (AE), and Generative Adversarial Networks (GAN) using GAF images to identify and detect anomalies in system components. Time-series data from sensors may be converted into time-frequency images for detecting anomalies using Convolutional Neural Networks (CNN).

The comparative advantage of examining both cyber and physical data for anomalies enables detection of anomalies holistically by monitoring both physical devices and the network. Such implementations have proven to be robust against different attacks vectors. Further, such approaches enable identification of correlations between cyber and physical components together, resulting in more accurate detection of anomalies in CPSs than approaches that do not examine both cyber and physical data.

Some embodiments disclosed herein include unsupervised algorithms such as One Class Support Vector Machines (OCSVMs) and Local Outlier Factors (LOFs). These algorithms may be used at least partially because of the scarcity of labeled data, in the sense that real-world settings emphasize the challenge of dealing with high volumes of unlabeled data. A manual labeling process would be time-consuming, expensive, and may involve the person performing the manual labeling process having expertise on the data itself. Furthermore, supervised feature learning may not only be unable to take advantage of unlabeled data, but it may also result in biases by relying more on labeled data.

Electrical energy distribution systems are examples of CPSs. Electricity, used as a medium for either data or power transfer, plays a role in maintaining and advancing the quality of life for modern society. As its penetration in day-to-day life becomes ubiquitous, our dependency on electricity's presence and vulnerability in its absence increases. Therefore, ensuring the reliability and resilience of the electric power grid would be beneficial. Natural disasters are the most common threat to the modern-day electric grid, accounting for 62% and 90% of major power outages in 2016 and 2017, respectively, according to the Department of Energy, Office of Electricity (DOE-OE) Electric Disturbance Events OE-417 forms. Cyberattacks also have the potential to cause widespread blackouts and damage to power transformers (e.g., via remote control of breakers, without limitation) or generators. Additionally, cyberattacks may be deployed in great numbers (e.g., with frequencies as high as 10,000 attacks per minute) alongside a natural disaster. To address these challenges and ensure resilient and reliable power-grid operation, the interplay between the digital and physical realm should be understood and properly guarded.

The need for reliability negates the possibility of direct experiment on critical infrastructure, and the cost to produce a direct replica is often relatively high. To overcome this challenge, cyber-physical test beds (CPTs), with a primary aim to explore how the physical and digital world impact each other, may be desirable. Varying degrees of hardware-in-the-loop (HIL) connected with simulations or emulations may be employed as a cost-effective means to probe the cyber-physical nature of critical systems. These test beds should strike the appropriate balance among what is simulated, emulated, and physically manifested as HIL while maintaining the flexibility to cost-effectively study the resilience posture of many types of system typologies and configurations.

Many highly varied types of CPTs have been investigated to aid in the development of manufacturing unmanned aerial vehicles, cellular systems, electric vehicles, maritime systems, control systems, and more. The unifying connection between these systems is the electric power grid. Without power, cyber-physical systems will not function. Thus, CPTs for power systems may be focused on herein. It should be understood, however, that other CPTs also fit within the scope of the embodiments disclosed herein.

Historical decision support for power utilities may be limited to understanding of physical failure and reliability analysis, which may focus only on highly predictable failures using well-developed power tools. However, an understanding of cyberattack vectors and the impact of damaging storms, which require a developing resilience analysis, are not available for these utilities. Some embodiments disclosed herein may provide an integrated cyber-physical-resilience analysis and visualization approach that could be integrated into current power systems.

The concept of resilience is a relatively new one, where high level definitions exist but the research and even demonstration of the benefit is not widely accepted. Specifically, the definitions often refer to the ability of the system to plan, recognize, and adapt to damaging storms and cyberattacks. However, no metrics for measuring resilience have been accepted by the power industry or implemented in any current operational technology (OT) system. The consideration of cybersecurity, while a more recent concern to the OT community, is still an operation controlled by information technology (IT) cyber security experts separately from the OT operations. As the OT operator has no indication of the root cause of a failure, if it were to be cyber security, the decision support available from the human machine interface (HMI) (and supporting training) would only support response to physical root cause. Embodiments disclosed herein, however, integrated both cyber and physical root cause, as well as resilience, in HMI visualization prototypes for power system operators to quickly recognize root cause and impact to resilience. In addition, to advance the role-to-role interactions, role-based visualization prototypes are disclosed herein. These role-based visualization prototypes provide the right amount of context between roles. By way of non-limiting example, the cyber defender would know what aspects of the power system operation are more important, and as a result, the priority.

With regards to a resilience evaluation, a definition of power assets and existing architecture may be placed within a Power Distribution Designing for Resilience (PowDDeR) tool to evaluate the resilience of the system. Connectivity between critical assets and the availability of solar production may be used to correlate an optimized utilization of distributed resources for supporting critical infrastructure.

With regards to cyber-physical State Awareness for Resilience (StAR) Analytics, through the StAR distributed analysis, high confidence correlations of degradation and source, whether cyber or physical or both, and confidence in malicious versus benign, may be identified. The resulting information will be provided relative to the context of the critical infrastructure affected.

With regards to Cyber-Physical Outage Data Management (CP-ODM), the StAR analytics may be integrated and presented to the HMI in a way that the impacts of cyber and physical events on the grid characterize the system state variables.

With regards to a Visualization Engine (VizEng), Key junctions and pathways may be presented to the operators by integrating the StAR analysis using the VizEng for effective response that requires first responder tasking and power system dispatching, where manual response may be involved.

Conventional solutions do not provide the integration of cyber, physical and resilience information, as OT and IT systems are conventionally separate and no cyber analytics and resilience metrics are integrated into either solution. This includes role based considerations and the necessary level of detail to align the priorities between the individuals performing this roles. Conventional approaches only assess physical and cyber in different siloed contexts and only merge them after longer term post disaster analysis, if ever.

The ability to identify and respond quickly and appropriately to degradation and provide information that streamlines the decision making may provide benefits in the face of many types of major storms and cyberattacks. Some embodiments disclosed herein provide a frame work to enable teams to start speaking a common language across OT and IT sectors.

FIG. 1 illustrates levels of consideration 100 for cyber-physical testbed construction, according to some embodiments. Various design elements that should be considered when constructing a CPT are shown in FIG. 1. The levels of consideration 100 include hard components 102, soft components 104, and a user interface 106. By way of non-limiting examples, the hard components 102 may include hardware, emulators, and simulators. Also by way of non-limiting examples, the soft components 104 may include communication protocols 108 and system timing protocols 110, and wide-area monitoring (not shown) within the context of test-bed scope and application to facilitate appropriate protocol selection. As further non-limiting examples, the user interface 106 may include a custom visualization and alert system (e.g., event visualization elements 112), user controls 114, and various design considerations corresponding to construction for a power-distribution CPT.

CPTs may include different combinations of hardware, emulators, and simulators. Table 1 qualitatively lists generalized advantages and disadvantages of each approach (simulation, emulation, and hardware). Ideally, a CPT may organize all three elements to minimize the disadvantages and maximize the advantages each brings to bear.

TABLE 1

Hardware-, Emulator-, and Simulator-Based Representations of
Physical, Cybernetic, and Cyber-Physical Elements within CPTs

|  | Simulation | Emulation | Hardware |
|---|---|---|---|
| Cost | Low | Medium | High |
| Fidelity | Low | Medium | High |
| Scalability | High | Medium-high | Low |
| Interoperability | Low | Medium-high | High |
| Computational Expense | Low | High | None |

A purely physical-hardware-based CPT may provide a good representation of real systems. One example of a purely hardware-based CPT is Idaho National Laboratory's (INL's) Critical Infrastructure Test Range Complex (CITRC). CITRIC includes its own fully functioning substation, which includes both distribution- and transmission-class voltages and may be ideally located for testing new power-grid solutions under a wide range of weather conditions. The testing and maintenance costs of this system, however, may be relatively high compared to costs of a real-time simulation with an HIL setup. Hydro Quebec also has a purely hardware-based distribution CPT. This test bed operates at 25 kV and has solar, wind, and storage assets attached. The Hydro Quebec test bed is fed by its own independent transformer from a distribution substation. While these purely hardware-based CPT systems are relatively good for testing and validation of system components, they may require relatively large amounts of real estate and may not be practical for most research institutions. Although simulation and emulation have less fidelity, they may reduce cost and size constraints on a CPT.

A purely simulation- or emulation-based CPT does not appear to be known in the art. A power grid portion may be simulated while emulating or using real hardware for the cybernetic component or specific distribution energy resources (DERs). Real-time simulation platforms (e.g., RTDS, Opal-RT, dSPACE, and Typhone HIL) may have power systems models readily available to easily scale the size of the power grid modeled in the CPT. Thus, real-time simulation provides a cost-effective approach to make the CPT more flexible and scalable.

Another advantage of simulation and emulation is the ability to connect test beds separated by large geographic distances. Although data latency issues present some limitations and should be addressed when considering a real-time simulation or emulation remote connection, the strategic expansion of test-bed assets may well be worth the tradeoff. One strategy is to separate a power-system model from the control-system interface, where one CPT specializes in power-system modeling, and the other in data visualization. An intercontinental CPT connection over real-time simulation, using high-voltage direct-current (HVDC) partitioning in the real-time simulation and VILLAS framework, may be used. The HVDC links may use less information exchange compared to high-voltage alternating-current (HVAC) links to maintain simulation-timing integrity. The VILLAS framework may also reduce the communication overhead by reverting to a peer-to-peer style of communication, rather than using a centralized communication authority.

FIG. 2 is a block diagram illustrating different solutions 200 for representing physical, cybernetic, and cyber-physical components of a cyber-physical test bed, according to some embodiments. FIG. 2 illustrates examples of simulation 202, emulation 204, and hardware 206 (physical) representations for the main components within a CPS: physical system 208, cyber system 212, and cyber-physical interfaces 210. The physical system 208 represents hardware responsible for generating, conditioning (e.g., using capacitor banks), transporting, sensing (e.g., by means of current transformers), and interrupting power to the loads. The cyber system 212 comprises digital control devices that are able to manipulate physical components to facilitate efficient operation or prevent damage to the system. The cyber-physical interface 210 is generally where the conversion of digital information to physical changes on the system occurs or where physical measurements (typically analog) are converted to digital representations. Each of the three components (physical system 208, cyber system 212, and cyber-physical interface 210) within a CPS are synchronized by time. A CPT attempts to represent these three areas via simulation 202, emulation 204, physical hardware 206, or by some combination thereof.

Real-time simulations may be carried out on special platforms which produce calculations within fixed time steps. Due to their low cost in comparison to a purely hardware system, simulations 202 are typically a good way to start building a CPT. For example, in an embodiments where the physical system 208 is a power system, a simulation 202 of the physical system 208 may include a power system simulation 214 (e.g., using OPAL-RT, RTDS). An emulation of the physical system 208 may include a power system emulation 220 (e.g., using Typhoon HIL, V&D electronics, an FPGA). A hardware implementation of the physical system 208 may include power system hardware 226 (e.g., solar panels, switch gear, transmission lines).

Simulation 202 of a cyber-physical interface may include communication network simulation 216 (e.g., using GNS3, OPNET, NetSIM). Emulation 204 of the cyber-physical interface 210 may include communication network emulation 222 (e.g., Emulab, NetEM). Hardware for the cyber-physical interface 210 may include communication devices 228 (e.g., PMU, RTU, LPDC, router, switch).

Simulation 202 of the cyber system 212 may include control center simulation 218 (e.g., using Python, Webapps, Kafka). Emulation 204 of the cyber system 212 may include control center emulation 224. Hardware 206 for the cyber system 212 may include control center servers/aggregators 230 (e.g., SPDC, server racks).

Until actual hardware 206 is connected, the simulation 202 does not need to be in real-time, which may allow for faster debugging and development. While OPAL-RT and RTDS may be used for real-time power-grid simulations 202 (e.g., the power system simulation 214), Raspberry Pi may be adopted as a lower-cost alternative. GNS3, OPNET, and NetSim may be used for communication network simulation 216 to interface with physical-system simulators (e.g., the power system simulation 214). The main drawback of network simulators like GNS3 and OPNET is a lack of real-time functionality. Thus, network emulators running communication network emulation 222 on a series of Raspberry Pis, along with control algorithms written in Python, may be used.

Emulating an entire physical power grid is challenging because emulators may attempt to mimic single components or bulk-grid inertia. Collecting enough emulators to make up a sizable grid would be expensive. A fully reconfigurable emulated test bed may allow for greater time-scale flexibility, compared to real-time simulations, and a wider range of voltage-class systems may compare to actual hardware-based test beds. A LabView control-room interface may be used to monitor and operate the power grid. Current-transformer (CT) and voltage-transformer (VT) measurements may be simply fed directly from the emulation into NI-CompactRIO running the control-room interface. An OPAL-RT system may be used to simulate the power grid in a power system simulation 214 while real-time Raspberry Pis, running NetEm, a Linux network emulator, may be used to emulate network-control traffic. DeterLab and ISEAGE are other network-emulation tools that may be used to study network security for smart grids. Control-room software, such as RTDMS, GE iFIX supervisory control and data acquisition (SCADA), and Modbus, may be run in an emulated environment. There may be no disadvantage, however, to directly running control-room software on physical machines.

Cyber-physical systems may also include servers for data storage, in addition to running SCADA software. Physical hardware that interfaces with measurement devices such as CTs, VTs, and phasor-measurement units (PMUs), may be the location of the cyber-physical interface. Including these devices may be more cost effective than attempting to emulate them and save on computation expense. Likewise, microgrid components such as solar panels, batteries, and charge controllers may be more affordable, and simulation or emulation resources may then be reserved for more-challenging tasks. Physical transmission or distribution lines, for example, may not be practical for most institutions. Thus, real-time simulation 202 or emulation 204 may be used.

Communication protocols for CPT may be used to link the various components: real-time simulation 202, real-time emulation 204, or hardware 206. The selection of communication protocols to be added for a CPT design may ensure that the CPT design adequately reflects the operation of real power grids, provides a justifiable way to answer research questions, and fits within the test bed scope (e.g., distribution, transmission, microgrid, etc.). Table 2 summarizes examples of protocols that may be used for CPT.

TABLE 2

| Description of various example protocols that may be used within cyber-physical test beds | | | |
|---|---|---|---|
| Protocols | Locations | Advantages | Vulnerabilities |
| DNP3 (IEEE 1815) | Control center (master unit) and outstation devices | High reliability and flexibility | Unsolicited message attack, Data set injection, Passive network |

TABLE 2-continued

| Description of various example protocols that may be used within cyber-physical test beds | | | |
|---|---|---|---|
| Protocols | Locations | Advantages | Vulnerabilities |
| Modbus | Control center (master unit) and outstation devices, substation networks | Open access standard, easy implementation | Malware, spoofing, Man-in-the-Middle, DoS, Replay |
| OPC | Control center and outstation devices | Operating system agnostic, open access standard | Malware, Relay attacks |
| IEC 60870 | Control center, substation networks | Follows the OSI model | Spoofing, sniffing, data modification, relay, non-repudiation |
| IEC 61850 | Substation networks | Highly flexible, focus on adaptable substation automation, substation hierarchy easily viewed | Unauthorized access, DoS, spoofing, Man-in-the-Middle, data interception |
| IEEE C37.118 | WAN, substation networks | Supports real-time data transfer | DoS, reconnaissance, authentication, man-in-the-middle, |

Distributed Network Protocol 3 (DNP3) was originally designed for SCADA applications and made available to the public in 1993. DNP3 focused on sending multiple smaller-sized packets in a deterministic sequence to enhance communication reliability and error detection. DNP3 has been widely adopted by North American power utilities and has gained popularity within the water, oil, and gas industries. For use over local area networks (LANs), DNP3 should be wrapped inside an internet protocol (IP) such as TCP/IP. DNP3 has adapted to support a wide range of communication modes, such as traditional client/server, peer-to-peer, multimaster, and hierarchical. The adaptability and flexibility of DNP3 to industry demands, coupled with its high degree of reliability, has made it the dominant protocol of choice for power-distribution networks in North America today.

Modbus was first developed in 1979 as a communication protocol between programmable logic controllers (PLCs). The standard became popular due to its facile implementation and open access to the standard. Modbus is supported by a variety of different transmission protocols for asynchronous serial transmission, TCP/IP, and Modbus plus. This allows the protocol to be used across many different device types over a large area network. By way of non-limiting examples, device types may include human machine interfaces (HMIs), PLCs, relays, network gateways, and other input/output (I/O) devices. With the adoption of TCP/IP into the standard, communication to many power system devices and SCADA applications may be possible. The data packets used over Modbus may be variable in size, depending on how large the data field is. Issues with data integrity resulted because portions of very large packets may have become corrupt or disrupted during transmission. The biggest drawback of the Modbus protocol is a lack of security in data or command authentication, which makes systems using Modbus vulnerable to attacks such as man-in-the-middle or spoofing cyberattacks.

The Open Platform Communications (OPC) was first introduced as an open standard in 1996 for automation control devices to interface with HMIs. The standard was updated in 2008 to a unified architecture (UA) version, which included many of the legacy features from previous versions, including accessing process data, transmitting events or alarms, transferring historical data, and leveraging extensible Markup Language (XML) to encode data access. OPC-UA also aimed to be operating-system agnostic and offered security features such as encryption and user authentication. Although popular within industrial processes, OPC-UA has not been widely adopted within the power-system community. Microgrids, on the other hand, have made OPC-UA a popular choice for communication of their automation controls.

The International Electrical Commission (IEC) 60870 standard was first introduced in 1990 for remote control of power-system operations. The standard adheres to the open-systems interconnection (OSI) model and focuses on the physical, data link, and application layers. The standard originally suffered from a broad execution interpretability, which lead to a large variety of incompatible manifestations of the 60870 standard. To solve this issue, the standard was updated in 2001 to better define how different devices should communicate. The updated standard also required devices on a network to have present instructions regarding packet structures to avoid sending this information within the packets themselves, which improved communication efficiency. Coupled with an update from 2000, the standard also supported TCP/IP communication between substations and control centers. Despite these updates, the standard still lacked clarity for specific use cases, again resulting in diverse implementations, and the TCP/IP implementation was operationally restrictive, limiting information types and configuration parameters.

First published in 2003, IEC 61850 sought to introduce a standard focused on automation and flexibility for intelligent substations. The United States National Institute of Standards and Technology (NIST) identified this as one of five "foundational" standards for smart-grid interoperability and cybersecurity. The standard introduces its own substation configuration language based of XML, a high-level programming language compatible with a wide variety of communication protocols, to facilitate system-wide component configuration. Substation communication is binned into one of three different categories: process (e.g., I/O devices and sensors), unit (e.g., protection and substation devices), and substation (the control computer or operators control HMI) levels. Within each of these communication levels, a series of protection and control functions are defined for various objects (also referred to as logic nodes (LNs)). Each LN corresponds to various substation device functions and can be grouped to logic devices that represent intelligent electrical devices (IEDs). The protocol also includes provisions for transmitting generic object-oriented substation events (GOOSE). Although previous protocols allowed for custom applications to configure and automate substation settings and operations, IEC 61850 includes specific instructions for how to do this, with definitions for over 100 LNs and more than 2000 data objects or data attributes. Additionally, users may access information hierarchies based on all LNs and objects to gain a sense of how substations are organized logically. One drawback of IEC 61850 is its higher complexity compared to legacy protocols. IEC 61850 has a steep learning curve and typically requires significant effort to implement. Because of these difficulties and the lack of manpower to support a significant upgrade, IEC 61850 has not been widely adopted in North America.

Established in 2005, IEEE C37.118 was designed for real-time exchange of synchronized phasor-measurement data between power-system equipment. Initial versions included both measurement and real-time data-transfer requirements. This protocol provides an open-access method to facilitate the development and use of synchrophasors, allowing data transmission and accretion within a phasor-measurement system. IEEE Standard C37.118-2005 was eventually split into two standards, one with measurement requirements and the other with the data-transfer requirements. This allowed for the use of IEEE C37.118 with other communication protocols. Further, this protocol was created with sufficient flexibility to account for future developments and enable a smooth transition of synchrophasor systems to new protocols as desired.

Modern smart grids include interconnected hardware and software components in distributed substations, communicating with each other to achieve a common goal. In order to function and make decisions properly, the correct timing of data measured throughout geographically distributed sensors in the system should be considered. Therefore, time synchronization is one of the primary elements in smart grids that enables accurate monitoring and protection and optimal control. Thus, timing is also relevant for CPT operation.

The requirement for time synchronization may vary from one microsecond to hundreds of nanoseconds, depending on the device used, customer demands, and application of interest. For example, traveling-wave fault detection requires synchronization on the order of hundreds of nanoseconds to precisely locate a fault. A traveling-wave fault-detection CPT may be designed using an OPAL-RT system with a field-programmable gate array (FPGA) to generate transient signals over fiber optic cables with a 500 ns time step. This CPT may allow for testing the detection functionality for various fault-locator devices. A synchrophasor or phasor measurement unit (PMU), on the other hand, measures the magnitude and phase angle to determine the health of the electrical grid and only requires substantially thirty observations per second. A CPT may be built to explore PMU control interactions with the power grid by leveraging RTDS and various PMU HIL possibilities. Using such a CPT, several time-synchronized cyber-physical data sets of various cyberattacks may be generated in order to aid in intrusion-detection sensor development.

The time synchronization requirements for power grids are often satisfied using GPS- or protocol-based time synchronization. In GPS-based time synchronization, a standard-reference atomic time signal into substations' components is used. Protocol-based time synchronization uses network-based time-distribution protocols such as the Network Time Protocol (NTP).

Example methods that may be used for time distribution in smart grids disclosed herein are summarized in Table 3:

Global Navigation Satellite System (GNSS) is a system of satellites with global coverage, facilitating geospatial positioning and precise time. GNSS is an American company. GLONASS is a similar system owned by the Russian state corporation Roscosmos. Time references provided by these GPS systems have accuracy to less than 100 nanoseconds, sufficient for most power-system applications.

The American Inter Range Instrumentation Group (IRIG) includes several standards, including IRIG Standard 200-98, IRIG-B, and IRIG Standard 200-04. This method uses a continuous stream of binary data to distribute time information. IRIG-B is the most common standard; it facilitates geographically separated locations synchronizing to a single time source.

Network Time Protocol (NTP) is designed to synchronize clocks of multiple computers over a packet network. In order to synchronize clocks over the network, the network delay between clocks should be known. Therefore, the accuracy of NTP depends on network traffic. The accuracy of this method on LANs is around 1 millisecond and is on the order of tens of milliseconds for wide area networks (WANs).

IEEE 1588 is designed for systems which require highly accurate time synchronization. Rather than using packet network, this approach uses "hardware time-stamping" to distribute time. The accuracy of this method lies under a microsecond and is a popular standard to synchronize clocks on distributed systems.

TABLE 3

Description of various timing synchronization schemes that may be used within cyber-physical testbeds

| Protocols | Applications | Advantages | Vulnerabilities |
|---|---|---|---|
| GNSS | Synchrophasor | Time synchronization across large geographic areas | Spoofing, DoS |
| IRIG (IEEE 1344) | Synchrophasors | Contains a cock, quality indicator | DoS, eavesdropping (if not encrypted) |
| NTP | Substation microgrid, control center, power electronics outstation devices, SCADA | Universally adopted | Malicious packet delays, ARP spoofing |
| IEEE 1588 | Control center, substation networks | High degree of accuracy | Time synchronization attacks |

In CPTs the timing component may be handled by the real-time simulator, with little need for timing network protocols. By way of non-limiting example, network protocol IEEE C37.118 may be used to communicate between various PMU devices in studying wide-area measurement systems. Many PMU devices may include internal GPS clocks that are able to take time-stamp measurements. Additionally, CPT components may be within close proximity to each other, which may reduce the need to account for data transmission over long distances. As a specific, non-limiting example, however, the SCADA Security Laboratory and Power and Energy Research Laboratory at Mississippi State University include two remote sites on campus, one of which contains a PMU and GPS substation control unit. This would enable various studies involving attacks against network timing synchronization to explore potential impacts on various control schemes and physical-system typologies (simulated by RTDS and HITL).

The design goals of the CPT may also impact what communication and timing standards are pared. For example, an automated control scheme using peer-to-peer communication among various IDEs would benefit from IEC 61850, which allows for high-resolution, low-latency transmission of contextualized (e.g., providing the device of origin) data. A more precise timing protocol, such as the IEEE 1588, may be required for those use cases. DNP3 was designed for SCADA communication and may be used for power-grid automation, but may not be sufficiently flexible to handle all conceivable scenarios within the smart grid and, in particular, sub-second device controls. DNP3, on the other hand, may be a more resilient protocol to packet rendering, data corruption, jitter, and bandwidth limitations than IEC 61850. A CPT that focuses on providing situational awareness and human-in-the-loop studies might more strongly consider DNP3, which supports a wide range of timing protocols. Modbus may be most advantageous when dealing with serial communication. Although Modbus is capable of transmitting at faster rates than DNP3 and may be an important protocol for smart grids, it is less popular in North America and Europe. Like DNP3, Modbus is used for system monitoring and supports a wide range of timing protocols.

Figure 3:
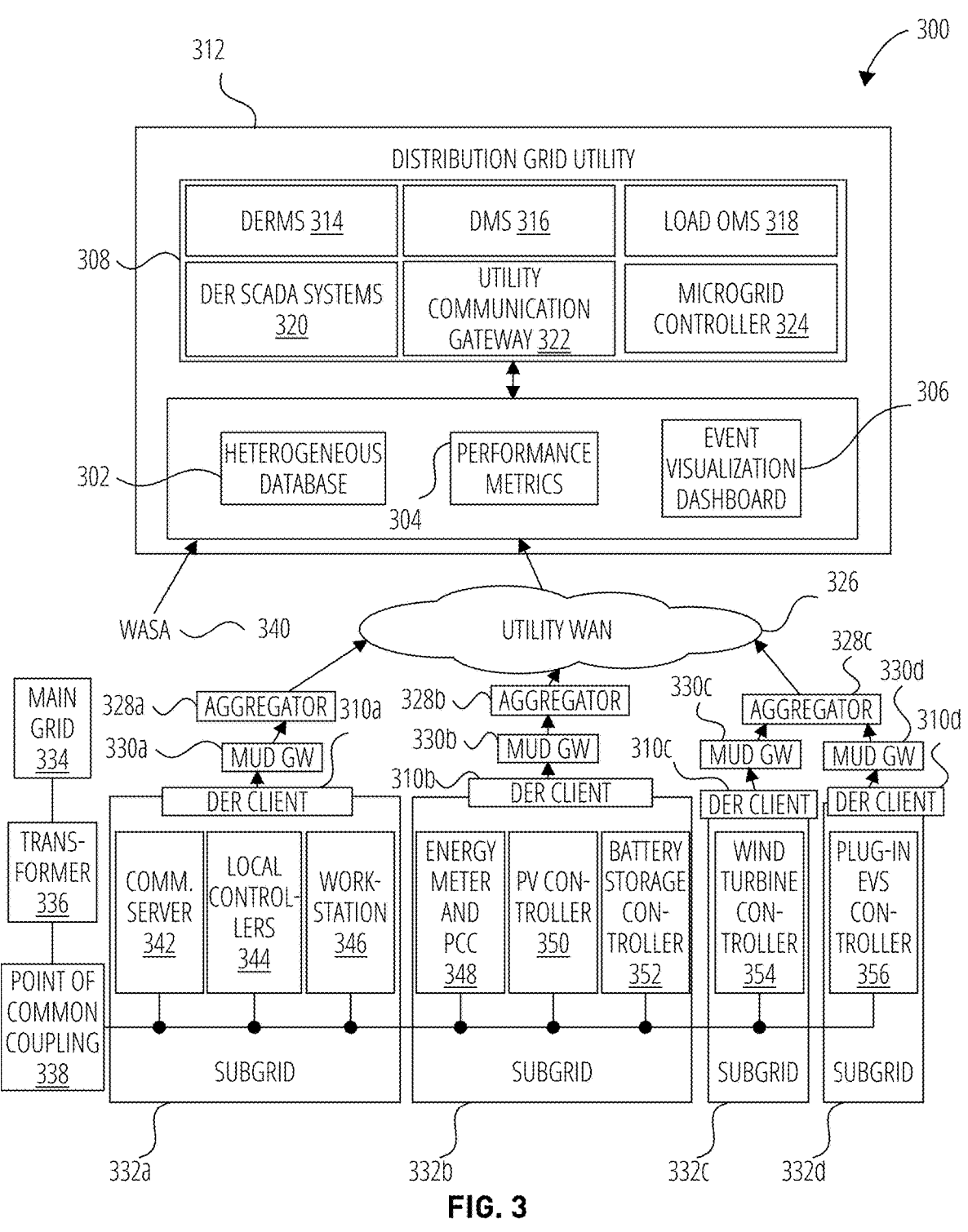
FIG. 3 is a block diagram of a conceptual architecture of wide-area situational awareness (WASA) for distribution energy resources (DER) integrated distributed systems, according to some embodiments.

FIG. 3 is a block diagram of a conceptual architecture 300 of WASA 340 for DER integrated distributed systems, according to some embodiments. FIG. 3 represents a conceptual architecture 300 for developing a real-time WASA system. The conceptual architecture 300 of WASA 340 includes a DER integrated distribution grid utility 312, which includes a heterogeneous database 302, performance metrics 304, visualization dashboards 306, and a control center 308. The control center 308 includes DER management systems (DERMS 314), distribution management systems (DMS 316), load outage management systems (load OMS 318), DER SCADA systems 320, a utility communication gateway 322, and a microgrid controller 324. The heterogeneous database 302 may include a topology log, a power log, and a cyber log.

The conceptual architecture 300 also includes a utility wide area network (utility WAN 326), a main grid 334, a transformer 336, a point of common coupling 338, and subgrids 332a, 332b, 332c, and 332d coupled to the point of common coupling 338. The conceptual architecture 300 also includes aggregators 328a, 328b, and 328c, multi-user detection (MUD) gateways (GWs) 330a, 330b, 330c, and 330d, and DER client nodes 310a, 310b, 310c, and 310d. The subgrid 332a may correspond to DER client node 310a, the subgrid 332b may correspond to DER client node 310b, the subgrid 332c may correspond to DER client node 310c, and the subgrid 332d may correspond to DER client node 310d. The DER client node 310a (e.g., a third party aggregator), and the MUD GW 330a may service the DER client node 310a, which includes a communication server 342, local controllers 344, and a workstation 346. The aggregator 328b and the MUD GW 330b (e.g., an aggregator of the utility) may service the DER client node 310b, which includes an energy meter and PCC 348, a photo voltaic controller 350, and a battery storage controller 352. The aggregator 328c (e.g., an aggregator of the utility) and the MUD GW 330c may service the DER client node 310c, which includes a wind turbine controller 354. The aggregator 328c and the MUD GW 330d may service the DER client node 310d, which includes plug-in electric vehicles controller 356.

The control center 308 of the DER integrated distribution grid utility 312 receives multidimensional grid measurements from DER client nodes 310a, 310b, 310c, and 310d system logs from network sensors, firewall alerts from network sensors, and topology logs from other management systems. Therefore, a heterogeneous database system (HDS) (e.g., the heterogeneous database 302) is used to store these data sets for later use in other applications, such as resilience metrics, forensic analysis, and wide-area control (WAC). In addition, the heterogeneous database 302 may be used to facilitate event visualization through real-time processing of incoming data.

Figure 4A:
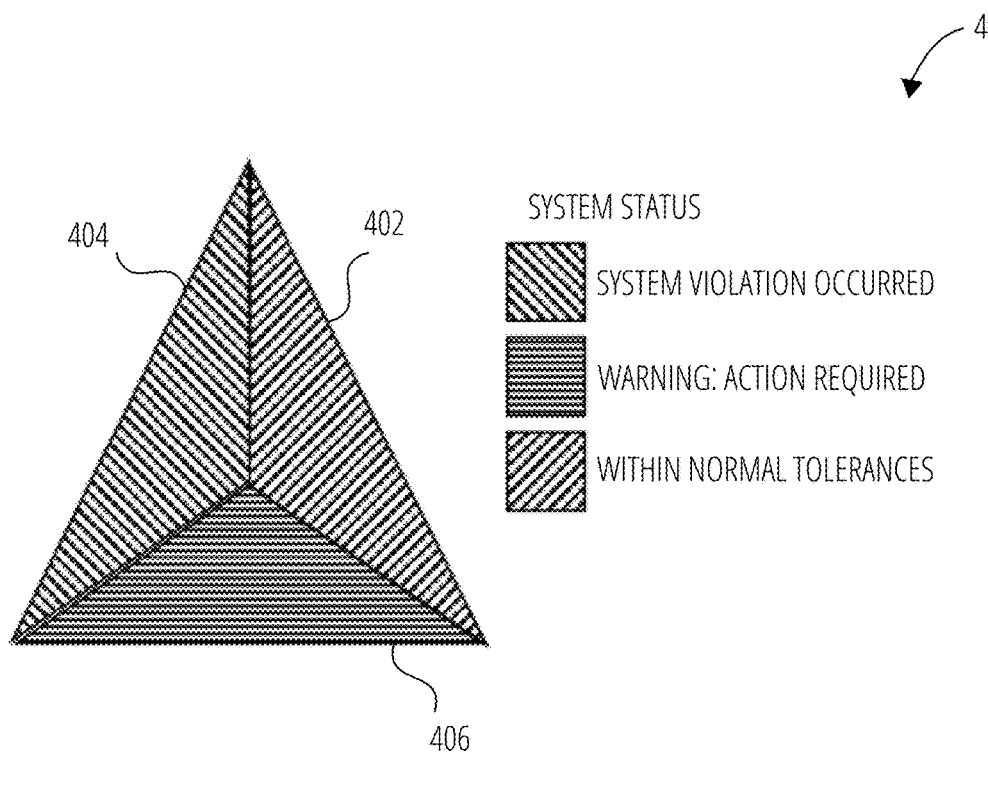
FIG. 4A is an illustration of a resilience-icon diagram, according to some embodiments.

FIG. 4A is an illustration of a resilience-icon diagram 400, according to some embodiments. The current power grid includes several distributed sensors that rely on various communication protocols, hardware, and software resources to provide multidimensional data sets with varying sampling rate to the control center. The significant increase in volume, velocity, and veracity of incoming grid measurements has led to big data challenges that make it difficult for system operators to efficiently monitor grid networks and take necessary corrective actions. Therefore, an event-visualization dashboard that processes physical measurements, communications network traffic, system topology, system logs, firewall rules, and geographical information facilitates real-time cyber-physical situational awareness.

Figure 4B:
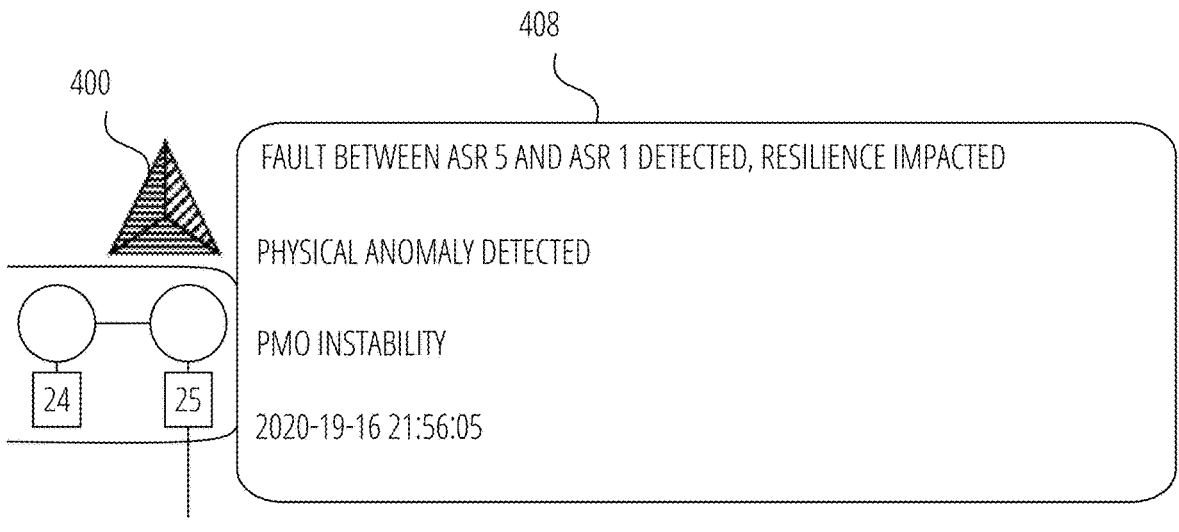
FIG. 4B is an illustration of a mouse-over menu displayed next to the resilience-icon diagram of FIG. 4A, according to some embodiments.

The resilience-icon diagram 400 of FIG. 4A and FIG. 4B creates a simple real-time actionable interface for dispatchers and cyber defenders to use for their various roles. The resilience-icon diagram 400 aggregates meaningful information, which may facilitate rapid operational decisions and complementary context for the roles, as the root cause of events may include both cybernetic elements and physical elements.

To minimize the amount of visual clutter, a simple object that is able to densely pack all required information was needed. Inspiration for the design of the icon comes from the National Fire Protection Association's hazard identification system, NFPA 704. This system uses a simple diamond that has been split into four sections. Each of these sections corresponds to a different response. When viewed together the NFPA 704 system provides immediate information about response. A similar logical design was used for the resilience-icon diagram 400.

The resilience-icon diagram 400 is divided into three sections to represent a system's physical condition 404 (e.g., using traditional reliability metrics), cybernetic condition 402 (e.g., also using traditional reliability, along with malware detection), and resilience condition 406. Each of these sections will have colors change based on the state of the system represented by the section. These colors take three forms: green for normal status (e.g., within normal tolerances), yellow to indicate a warning (i.e., that action may be required to prevent a system violation), and red, indicating that a system violation has occurred.

The resilience-icon diagram 400 also shares similar function to the developed operational trust indicator (OTI) developed for the CyberSAVe application. The OTI system focuses on different metrics, but the idea is the same: a simple and straightforward icon that allows for immediate decisions indicated by the structure and colors of the icon.

FIG. 4B is an illustration of a mouse-over menu 408 displayed next to the resilience-icon diagram 400 of FIG. 4A, according to some embodiments. The left-most section of the resilience-icon diagram 400 (i.e., the physical condition 404 of FIG. 4A) is concerned with the physical health of the system. This may include anything that is related to the physical behavior of any components within the power grid (e.g., faults, under voltages, generators nearing capacity limits). The right section (i.e., the cybernetic condition 402 of FIG. 4A) of the resilience-icon diagram 400 is associated with the cybernetic health of the system, including erroneous connections, failed connections, failed login attempts, suspicious activity, or virus detection. The final (bottom) section (the resilience condition 406 of FIG. 4A) displays the resilience indications and uses an adaptive-capacity metric. In brief, the adaptive capacity of a device shows how much additional real and reactive power could be used to respond to and recover from a disturbance based at least in part on a component's thermal limits. This metric aggregates the adaptive capacity of collections of grid assets. Colors may be assigned in accordance with NERC or IEEE standards with regards to thermal capacity. Furthermore, the resilience-icon diagram 400 has a mouse-over feature (e.g., the mouse-over menu 408) shown in FIG. 4B, which allows for immediate messages to be presented without the delay associated with an actual drill down (e.g., actual drill down involving accessing menus via one or more user selections). By way of non-limiting example, the mouse-over menu 408 may display responsive to a mouse cursor hovering over the resilience-icon diagram 400.

Figure 5:
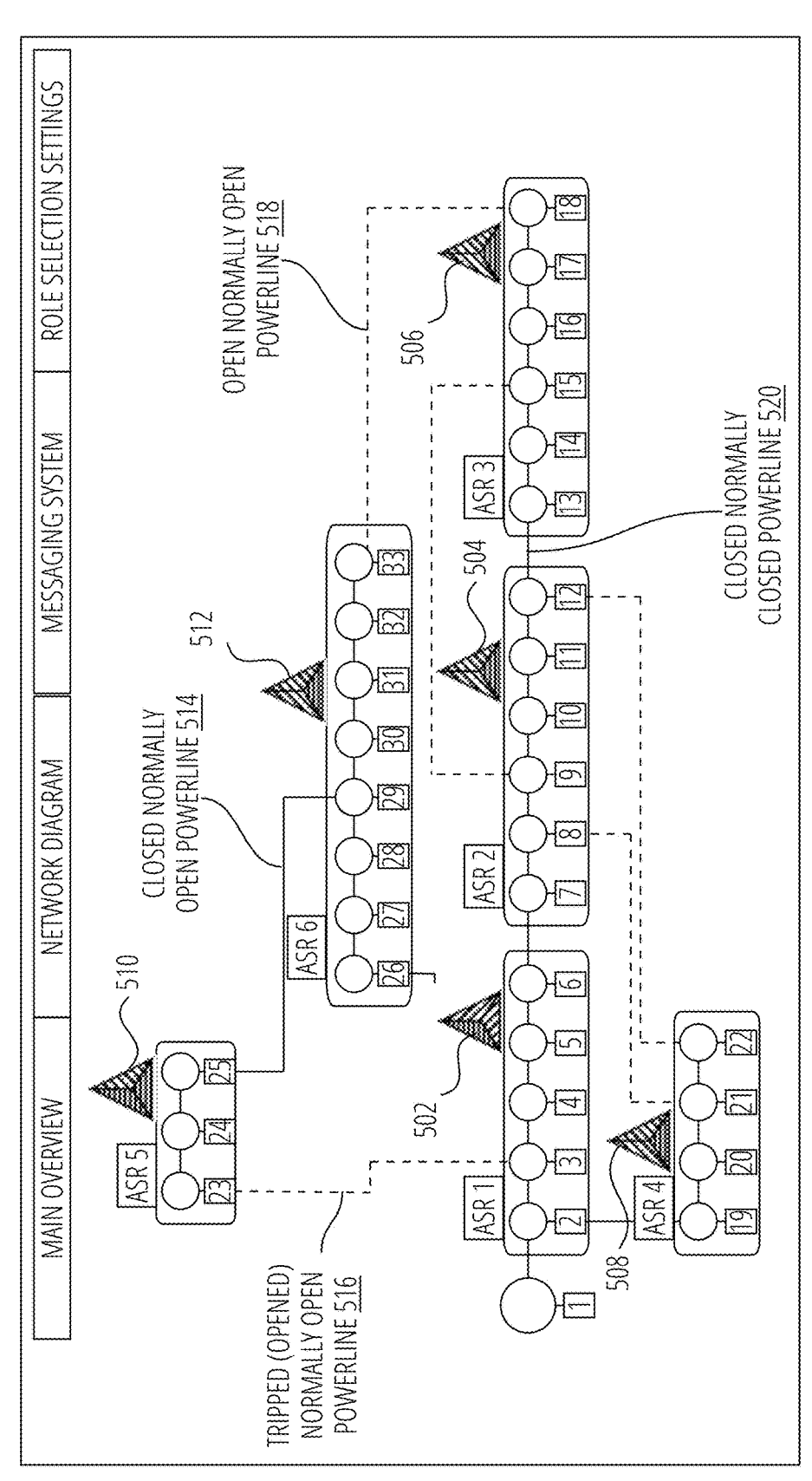
FIG. 5 is an illustration of a full display of a main overview graphical user interface for a power grid system, according to some embodiments.

FIG. 5 is an illustration of a full display of a main overview graphical user interface 500 for a power grid system, according to some embodiments. In graphical user interfaces such as the main overview graphical user interface 500, resilience icon diagrams can be associated with single components or aggregations. FIG. 5 shows an example of the visualization for the IEEE 33 bus system with several of the busses grouped into ASRs. In the main overview graphical user interface 500, callouts on powerlines have been added for clarity.

The main overview graphical user interface 500 displays aggregated system resources (ASRs) including ASR 1, ASR 2, ASR 3, ASR 4, ASR 5, and ASR 6. The main overview graphical user interface 500 also displays resilience-icon diagram such as the resilience-icon diagram 400 of FIG. 4A and FIG. 4B for each of the ASRs. Specifically, the main overview graphical user interface 500 displays resilience icon diagram 502 corresponding to ASR 1, resilience icon diagram 504 corresponding to ASR 2, resilience icon diagram 506 corresponding to ASR 3, resilience icon diagram 508 corresponding to ASR 4, resilience icon diagram 510 corresponding to ASR 5, and resilience icon diagram 512 corresponding to ASR 6.

The main overview graphical user interface 500 illustrates a closed, normally open, powerline 514 between ASR 5 and ASR 6, a tripped (opened), normally open, powerline 516 between ASR 1 and ASR 5, an open, normally open, powerline 518 between ASR 6 and ASR 3, and a closed, normally closed, powerline 520 between ASR 2 and ASR 3.

Figure 6:
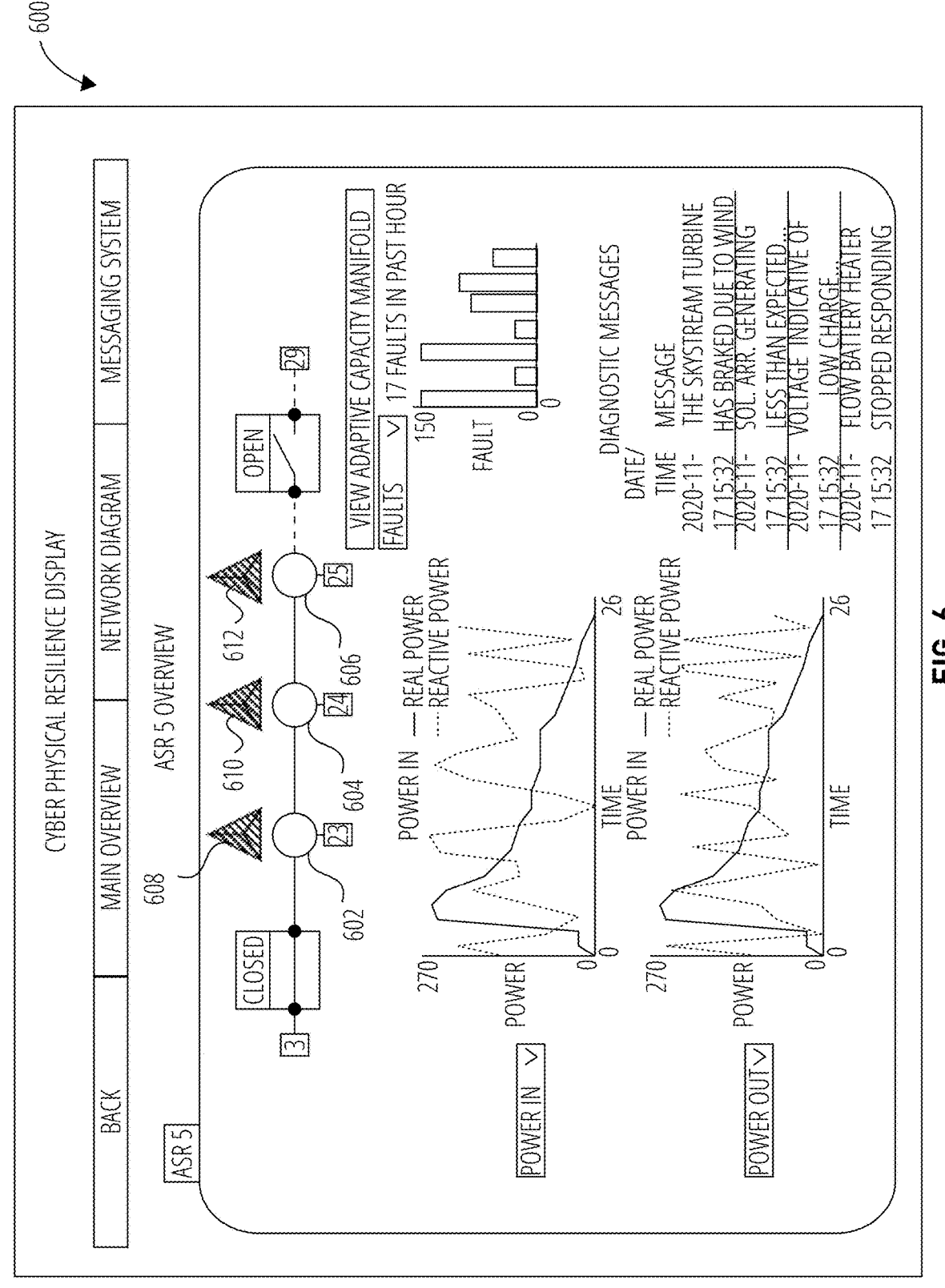
FIG. 6 is an illustration of an ASR overview graphical user interface, according to some embodiments.

FIG. 6 is an illustration of an ASR overview graphical user interface 600, according to some embodiments. The ASR overview graphical user interface 600 may be a cyber physical resilience display. Each of the different ASRs (ASR 1, ASR 2, ASR 3, ASR 4, ASR 5, and ASR 6) from the main overview graphical user interface 500 of FIG. 5 may be selected to redirect a screen display to an ASR overview graphical user interface such as the ASR overview graphical user interface 600 of FIG. 6, which is for ASR 5. The ASR overview graphical user interface 600 displays the ASR's internal components, as shown in FIG. 6, where each bus (e.g., bus 602, bus 604, and bus 606) now has its own resilience icon diagram (e.g., resilience icon diagram 608, resilience icon diagram 610, and resilience icon diagram 612 corresponding to the bus 602, the bus 604, and the bus 606, respectively). By displaying information relevant to pre-defined levels of specific aggregated-component resolutions, a user may be enabled to easily locate relevant information without becoming overwhelmed. The interconnections between all of the different elements also represent different states, such as normally closed, closed, normally open, or opened, as illustrate in FIG. 5. Thus, the whole state of the system can be visualized accurately to maintain a high degree of state awareness.

Because CPTs are diverse in nature, developing general standards that enable easy cross comparison is difficult. However, as CPTs are CPSs, widely adopted CPS-testing methods may be examined in order to determine appropriate testing methods for a particular CPT. With this in six testing methods for CPSs may include model based, search based, monitor based, fault-injection based, big data driven, and cloud based testing methods. Table 4 summarizes each of these testing methods.

TABLE 4

Testing methods for cyber-physical testbeds adopted
from techniques used to test cyber-physical systems.

| Testing Method | Description | Drawback |
|---|---|---|
| Model based | simulates testbed behavior to validate performance | Depends on model accuracy, may lack practicality on CPTs largely comprised of simulations |
| Search based | Discovers anomalous operating points and scope test bed limitations | Large effort to creating SBT algorithm, time consuming testing |
| Monitor based | Analyzes test bed properties (e.g., voltage) for conformity to expected results | Logical outputs may not always be intuitively known |
| Fault injection | Injects artificial failure to test for expected response | Test bed fault response may not always be intuitively known |
| Big data driven | Leverages big data techniques (e.g., statistics) to test for expected response | Big data collection not always available or practical |
| Cloud based | Leverages cloud computing to test for expected response | Big data collection and cloud connection not always available or practical |

Model-based testing (MBT) uses simulations of the same physical, cybernetic, or cyber-physical configurations to validate the CPT by comparing deviations of performance. This method may be used to validate the custom-designed emulators of transmission power lines by comparing the emulation results to Simulink/MatLab models. This form of testing also has the advantage of not being limited to real-time. Thus, it may be used to quickly generate results for physical or cyber components.

Search-based testing (SBT) is a process that leverages genetic algorithms, simulated annealing, or like algorithms to create operating points or scenarios to be tested. By way of non-limiting example, a CPT may be tested for proper functionality under expected circumstances. SBT may be applied to discover testing scenarios that would cause abnormal behavior in the CPSs, which may reveal flaws in the design. These same techniques could be applied to CPTs in order to quantify their level of uncertainty or scope of reasonable operation. In combination with MBT, SBT may be an effective approach for understanding the limitations of CPTs.

Monitor-based testing of CPSs is the process of conducting an analysis of the time series data produced by a system. This analysis may include transformations, statistical methods, or simple reporting of the time-based data to verify the result is reasonable. For CPTs this may simply mean troubleshooting outputs from various components to ensure results are reasonable. This analysis may be performed by analyzing raw data as statistical or transform (e.g., Fast Fourier transform) methods may make intuitive analysis difficult. Similar to the monitor-based testing, FBT of CPSs deliberately induces an artificial failure and evaluates the system's response, making system enhancements as necessary. This method may be more challenging for CPTs because system response to faults is not always known and is often the point of a specific study. However, the number of reasonable responses to a given fault is limited, a condition which may be leveraged to assess the validity of a CPT's simulation or emulation result.

Big data-driven CPS testing uses big data analytical techniques to aid in testing by leveraging or enhancing the CPS's ability to process and store data. Examples of big data-driven CPS testing include creating a big data system architecture, creating a framework for real-time, dynamic data processing, and creating prediction and diagnosis methods. While big data techniques may not be useful for initial CPT development validation, they may find application in a well-established CPT that seeks to expand and must process large amounts of data. Likewise, cloud-based testing is not likely to be a useful technique for early developmental validation of a CPT, but may be used for well-established CPTs. Cloud-based testing involves feeding data from a CPS (or CPT) to the cloud, where it is then analyzed. This may include network-traffic testing, testing a sensor's interaction with actuators, and security monitoring.

The six testing methods in Table 4 may be used to improve four areas of CPSs including conformance to standards, robustness of the process, security of the system, and fragility of the system. Conformance to the standards quantifies a degree of compliance between an implementation and a standards. More simply stated, the degree of likeness between the intended result and the actual result is determined. For the power grid, this may mean measuring the deviation of voltage or frequency of power delivered to the loads from adopted standards like IEEE or the American National Standards Institute. The robustness of the process refers to assessing the fault tolerance of a system. The security of the system assesses any physical or cybersecurity issues within the CPSs. The fragility of the system refers to a CPS's ability to continue operation within acceptable tolerances despite abnormal perturbations to operating conditions (this is also known as system resilience). CPTs are an effective way to assess each of these four areas. In order to develop and validate CPTs, however, MBT, SBT, and monitor-based testing may be effective tools to ensure accurate behavior. Fault-injection, big data, and cloud-based testing, on the other hand, may be limited to more-intuitive use cases for functionality validation in already-established test beds.

Figure 7:
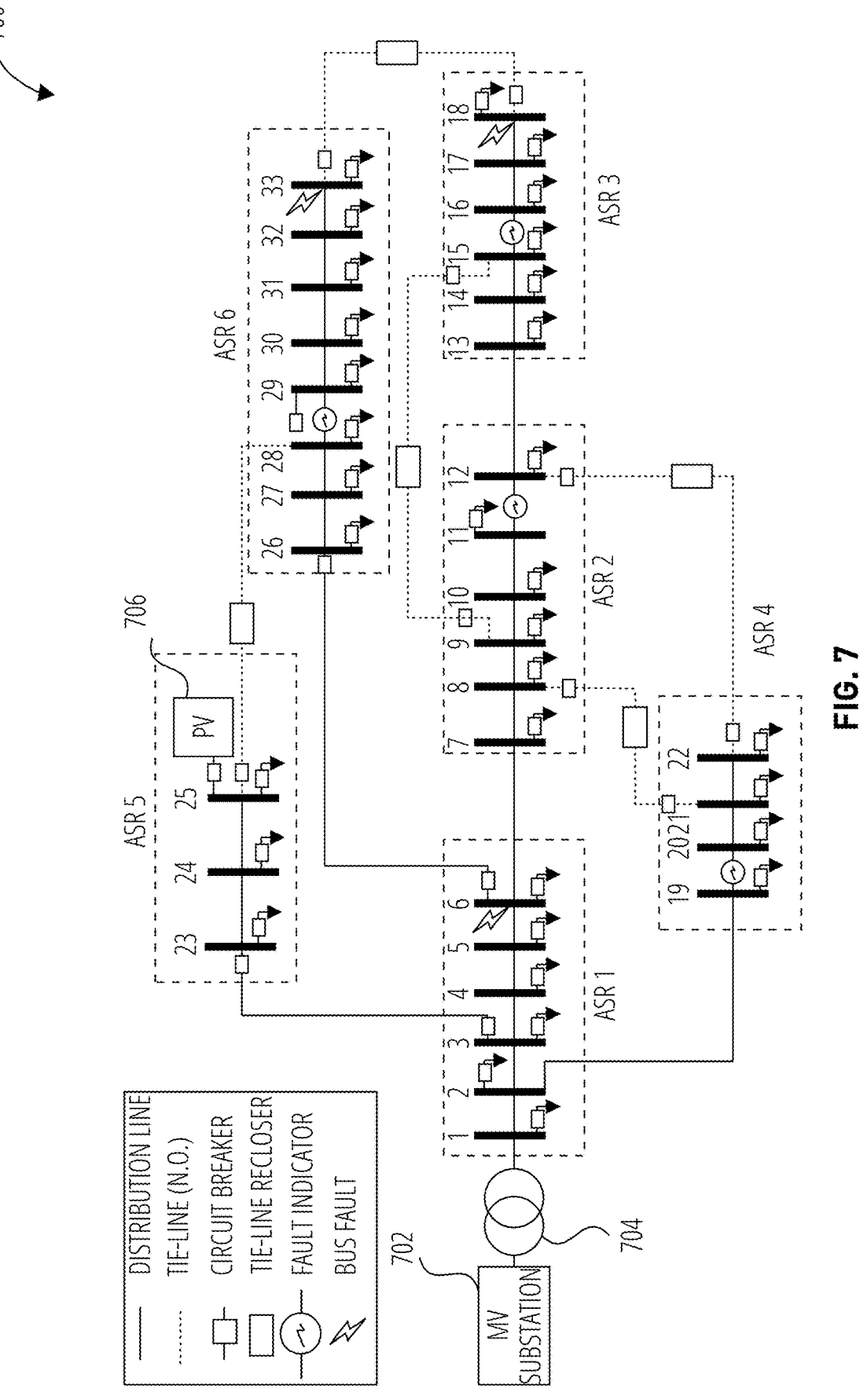
FIG. 7 is a block diagram of a modified IEEE-33 bus distributed system separated into six ASRs, according to some embodiments.

FIG. 7 is a block diagram of a modified IEEE-33 bus distributed system 700 separated into six ASRs, according to some embodiments. Distribution systems are large and complex systems that grow over time. When contingencies occur dispatchers, engineers, and executives need to know the answer to the question, "How bad is it?" in order to make timely and meaningful decisions for effective remediation. Therefore, a scalable method to add context to system conditions is needed. Some embodiments disclosed herein are directed to deviation-based techniques that enable scaled bus voltage potential and line power measurement deviations to quickly assess local and global health, and lend context to the severity of contingencies. The proposed techniques are demonstrated using simulations of line-to-line, line-to-ground, and three-phases-to-ground fault conditions on an IEEE 33-bus distribution model.

The ability to assess the health of a power system facilitates an enhanced security focused environment and promotes a more robust, health-centric system. Complex power distribution systems rely heavily on system security and the system's ability to maintain integrity during contingent events. Such contingencies could cause unforeseen consequences to the economic and safe operation of the power system. The security of a power system can be defined as its capability to withstand disturbances in the face of these events as well as its ability to remain operable to its customers without interruption. Due to the complex and expansive nature of distribution systems, scalable system health assessment assists dispatchers, engineers, and executives, in making decisions relative to the overall health of the system. Consequently, the IEEE-33 bus distributed system 700 of FIG. 7 is discussed herein to illustrate an example approach to health assessment of a power distribution system using the IEEE 33-bus distribution model according to some embodiments disclosed herein.

Health assessment metrics, which may be based on voltage security and frequency stability, provide a deeper insight into the operational health of a system and provide indications of anomalous activity. Voltage security is defined as the system's capability to maintain system's voltage within acceptable limits during system stress, physical disturbances, and cyber-attacks. Similarly, frequency stability is defined as a system's ability to maintain a stable and synchronous frequency environment between generators amid environmental and external disturbances. While these metrics provide insightful information to system health, the system voltage profile, load, loss, and source power may depend heavily on the load model that is used when considering the distribution system and consequently, show that the usefulness of incorporating a voltage dependent load model. In addition, the IEEE-33 bus distributed system 700 of FIG. 7 features a single generator, invalidating the use of frequency stability analysis.

A scaled deviation-based approach may be used to assess the health of the bus voltage potentials and line powers of the IEEE-33 bus distributed system 700. Local health assessment indicates the health of an individual ASR. An ASR is a logically grouped set of assets that have one or more common objectives. An ASR may be used for many scales. For example, the components of a microgrid, a set of customers in a neighborhood on the same distribution feeders, the whole distribution system, a transmission operator area, a balancing authority, etc., could all be ASRs. Global system health is analyzed over a group of ASRs. This approach provides system operators with an enhanced health analysis awareness to facilitate a stronger security cognizance. By utilizing line power and bus voltages as health assessment metrics, complications with traditional heath assessment techniques such as voltage security and frequency stability may be avoided. Testing of this methodology was conducted on a model of the IEEE-33 bus distributed system 700.

In order to provide meaningful local and global health assessment, system operating points are sampled at set time intervals to indicate system status. These operating points represent measurements of the bus voltages and line powers of the system. Operating points are then implemented in two assessment functions to create deviation-based assessments to local and global system health. System operators are then able to interpret these deviations as an indication of the overall health of the system. In addition, to assist in the awareness of critical anomalies, importance factors are utilized to emphasize significant busses, lines, or ASRs to highlight to a human or machine, critical faults in the system should they arise.

Use of techniques as referenced above may be the first time that the metric 'health' was quantified in a distribution system. By contrast, metrics such as security assessment and frequency stability assessment do not describe health which, as used herein, is a metric that quantifies the systems deviation from normal or optimal power flow and voltage potential values. Health is an alternative assessment method that may not use differential equations. Health is different from security assessment because security assessment involves contingency analysis. Health is different from fre-quency stability because frequency stability involves the relationship between multiple generators. Further, neither security assessment nor frequency stability alone include importance factors that enable scaling the importance of variables.

FIG. 7 presents the IEEE-33 bus distributed system 700 that is utilized for the experimental case study. This IEEE-33 bus distributed system 700 is modeled as a radial distribution system that includes thirty-three buses (1-33) and thirty-two connecting lines. The buses have a voltage potential level of 12.66 kilovolts (kV). The network is fed by a medium voltage substation (MV substation 702) and a synchronous generator. The total connected active power load and the reactive power load demands are 3.715 MW and 2.300 Mvar. The modeled distribution system is divided into six ASRs: ASR 1, ASR 2, ASR 3, ASR 4, ASR 5, and ASR 6. In distribution systems this often results in ASRs that are grouped based on proximity such as a microgrid. Further, the IEEE-33 bus distributed system 700 includes five tie-lines, initially open, to support interconnection between multiple ASRs, which allows system reconfiguration under different scenarios (e.g., line faults).

The IEEE-33 bus distributed system 700 may be modeled in ARTEMIS/SSN (eMEGASIM) in the MATLAB-Simulink environment and simulated in the electromagnetic transient (EMT) domain at a smaller time step of 50 microseconds. The IEEE-33 bus distributed system 700 also includes circuit breakers, tie-line reclosers, fault indicators, and 400-kW grid-connected photovoltaic (PV) array (PV array 706) on bus 25. In some embodiments the PV array 706 is operating as a constant power factor mode or a P-Q control mode where the power factor is set to unity and it is only supplying the active power of 400 kW. Simulations of three types of faults, including single-line-to-ground fault (L-G), line-to-line fault (L-L), and 3-phases-to-ground fault (LLL-G) in three ASRs, are also shown in FIG. 7. These faults are simulated at 1 second for 5 cycles and corresponding datasets are generated for computing health assessment metrics, as discussed below.

The local and global health assessment techniques disclosed herein provide a fast indication of where deviations in the system are located, and thus increase situational awareness by taking raw data and converting it into meaningful information to be used by a human and/or a machine. To achieve this, operating points including bus voltage potentials and line powers are compared with optimum values and then transformed by assessment functions, $\alpha()$ and $\beta()$ into deviations that are then scaled and summed into local and global health assessments.

System operating points are measurements of system parameters taken at particular moments in time that represent the status of the system. The operating points are measures of the bus voltage potentials and line powers of the system and are sampled at regular intervals. Each operating point in the collection is unfiltered data, which when passed through assessment functions, create deviation-based information about the state of the system. A number n of sequential samples are used to assess local and global health.

Function $\alpha()$ is an assessment function that takes a root-mean-square (RMS) voltage signal as an input and returns a unit-less value between −100 and 100. The input value, $\Delta V$, is the difference between an actual voltage potential, from one of the phases of a bus, and the optimal voltage potential of that bus. The purpose of the $\alpha()$ function is to quantify the extent of the deviation of a bus voltage potential. It produces both negative and positive values so that the output may be used to distinguish between underand over-voltage conditions in other state assessment computations. Each bus in the IEEE-33 bus distributed system 700 has its own α( ) function characterized by upper and lower bus voltage limits and slopes. A stereotype for representing the α( ) functions disclosed herein may be given by:

$$\alpha(\Delta V) = \begin{cases} -100 & : \Delta V \le \dfrac{-100}{m_1} + \theta_1 \\ m_1(\Delta V - \theta_1) & : \dfrac{-100}{m_1} + \theta_1 < \Delta V \le \theta_1 \\ 0 & : \theta_1 < \Delta V \le \theta_2 \\ m_2(\Delta V - \theta_2) & : \theta_2 < \Delta V \le \dfrac{100}{m_2} + \theta_2 \\ 100 & : \Delta V > \dfrac{100}{m_2} + \theta_2 \end{cases} ,$$

where $\theta_1$ and $\theta_2$ are threshold values relating to lower and upper voltage potential limits, respectively, of the applicable bus, and $m_1$ and $m_2$ are the lower and upper slopes, respectively, which control the rate of conversion from deviation to output beyond the threshold values. Domain values between the threshold values represent a deadband where normal operation is expected to take place. Other functions (e.g., non-linear functions, without limitation) may be used depending on the desired performance of the assessment, provided that they adhere to the requirement of producing maximum and minimum values of 100 and −100, respectively.

β( ) is an assessment function that takes a power as an input and returns a unit-less value between 0 and 100. The input value, $\Delta P$, is the difference between an actual line power and the usual power of that line. The purpose of the β function is to quantify the extent of the deviation of a line power. Each phase of each line in the IEEE 33-bus model has its own β function characterized by an upper power limit. The stereotype for the β functions implemented in this work is given by $$\beta(\Delta P) = \begin{cases} 0 & : \Delta P \le \theta \\ m(\Delta P - \theta) & : \theta < \Delta P \le \dfrac{100}{m} + \theta \\ 100 & : \Delta P > \dfrac{100}{m} + \theta \end{cases} ,$$

where θ is a threshold value for the applicable line power upper limit, and m is the slope that controls the rate of conversion from deviation to output beyond the threshold. Domain values less than the threshold represents the region where normal operation is expected to take place. As the power limits placed on lines are not directional, meaning one excess watt flowing out of a line has the same effect on the line as one excess watt flowing into a line, correction for direction of power may be performed prior to using the β function. Other functions, nonlinear functions for example, may be used depending on the desired performance of the assessment, provided that they adhere to the requirement of producing a maximum value of 100.

Local health assessment provides a quick indication of voltage potential or power deviation for a particular ASR. This is accomplished by scaling and summing the deviations in the bus voltage potentials and line power flows indicated by the assessment functions for a given ASR. For example, $\lambda_1$, which represents the local health of ASR1, is given by:

$$\lambda_1 = 1 - \frac{\sum_{i=1}^{n}\left(\sum_{j=Bus}^{ASR1} p_{\alpha j}|\alpha_j(\Delta V_{ji})| + \sum_{j=Line}^{ASR1} p_{\beta j}\beta_j(\Delta P_{ji})\right)}{100n\left(\sum_{j=Bus}^{ASR1} p_{\alpha j} + \sum_{j=Line}^{ASR1} p_{\beta j}\right)},$$

where n is the number of sampled operating points taken into consideration, $p_{\alpha j}$ and $p_{\beta j}$ are importance factors for the jth bus line, respectively, in ASR1, $\Delta V_{ji}$ is the difference between the bus voltage potential and the optimal bus voltage potential for the ith sample of the jth bus, and $\Delta P_{ji}$ is the difference between the line power and the optimal line power for the ith sample of the jth bus. The notation $$\sum_{j=Bus}^{ASR1}$$

means to sum over all of the buses in ASR1; similarly, the notation $$\sum_{j=Line}^{ASR1}$$

means to sum over all of the lines connected to ASR1. λ may vary between 0.0 and 1.0, where 1.0 indicates that all voltage potentials and line power flows are in their deadbands. A λ not equal to 1.0 indicates that a deviation exists in an ASR and should be investigated. Local health assessments for each of the other ASRs are conducted in a similar manner.

The global health assessment provides a single point of reference with which to determine if all bus voltage potentials and line power flows are in their deadbands. This is indicated by a global health assessment value γ( ) of 1.0. The global health assessment is given by $$\gamma = \frac{\sum_{i=1}^{\lambda} p_{\lambda i}\lambda_i}{\sum_{i=1}^{\lambda} p_{\lambda i}},$$

where $p_{\lambda i}$ is the importance factor for the ith local health assessment and $\lambda_i$ is the ith local health assessment. The notation $$\sum_{i=1}^{\lambda}$$

means to sum over all of the local health assessments. The scaling performed by the importance factors helps to convey the severity or impact of deviations in different ASRs. A γ not equal to 1.0 indicates that a deviation exists in one of the ASRs that should be investigated.

Figures 8, 9:
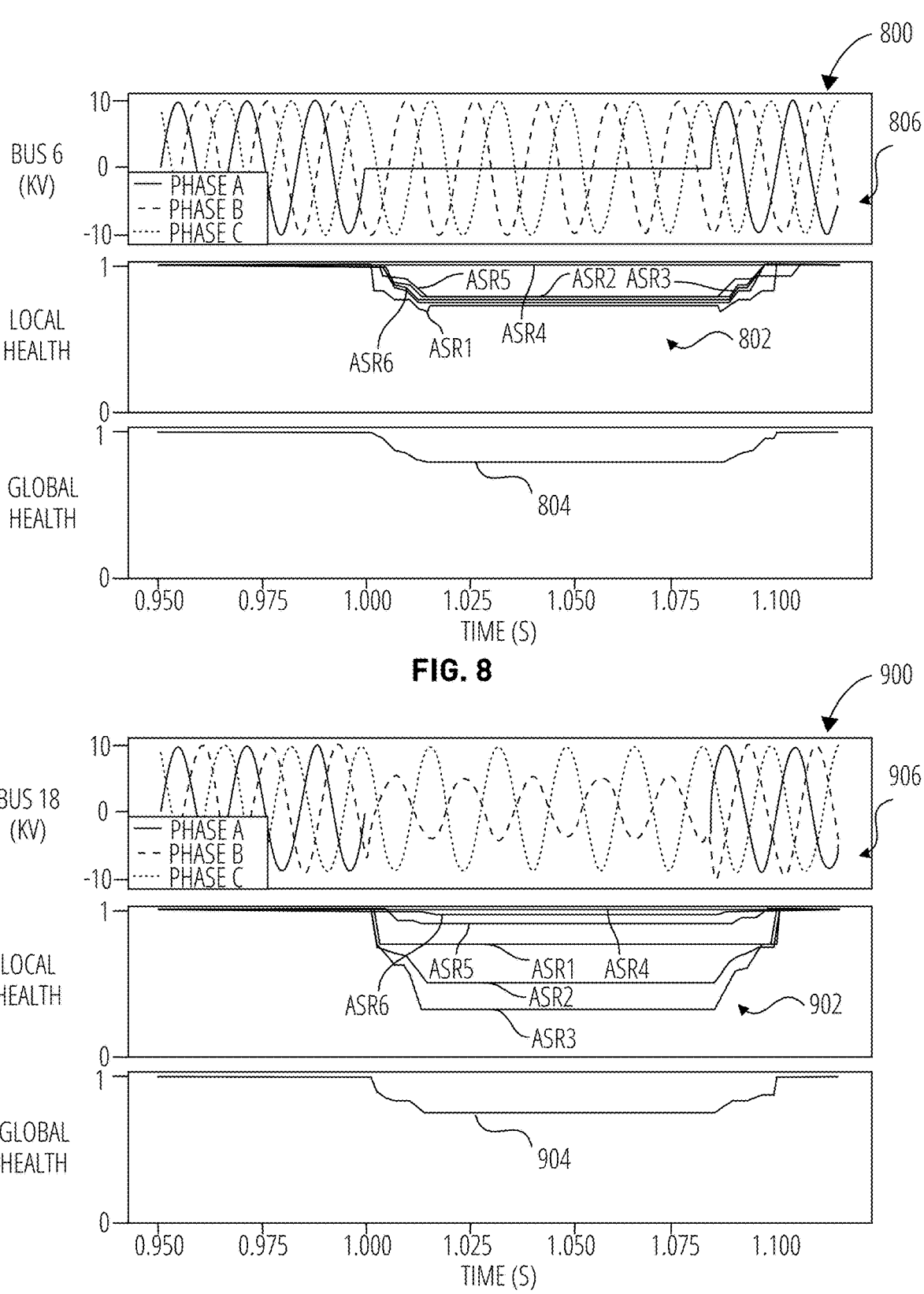
FIG. 8 is a plot illustrating local and global health assessments for a L-G fault, according to some embodiments.
FIG. 9 is a plot illustrating local and global health assessments for a L-L fault, according to some embodiments.

FIG. 8 is a plot 800 illustrating local and global health assessments for a L-G fault, according to some embodiments. FIG. 8 illustrates Bus 6 voltage potentials 806 (phase A, phase B, and phase C), local health assessments 802 for ASRs 1 through 6, and a global health assessment 804 for a short between phase A and ground in Bus 6. Simulations demonstrating health assessment techniques were conducted using fault data from the model discussed with reference to FIG. 7. To achieve this, local and global importance factors were set to 1.0, and then operating points produced by the IEEE 33-bus distribution model discussed with reference to FIG. 7 were evaluated under various fault conditions including phase-to-phase, phase-to-ground, and three-phase-to-ground faults.

Figure 10:
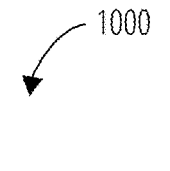
FIG. 10 is a plot illustrating local and global health assessments for a LL-G fault, according to some embodiments.
Figure 10:
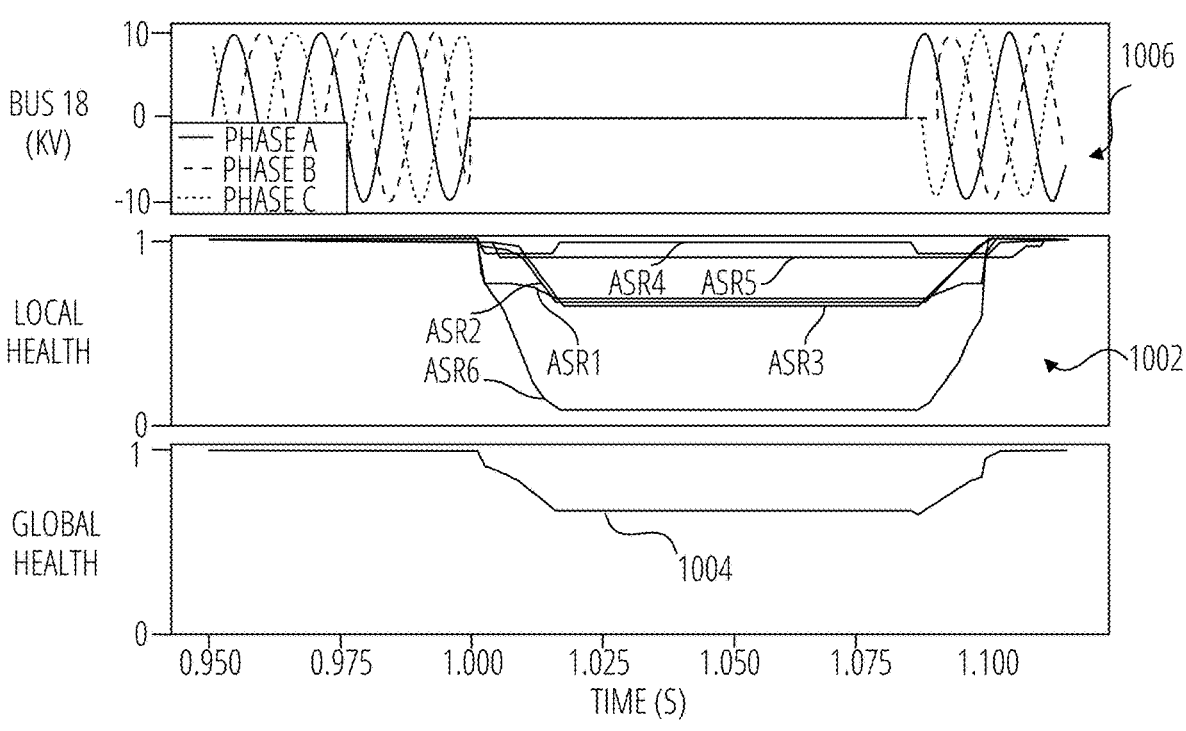

For the simulations corresponding to FIG. 8, FIG. 9, and FIG. 10, importance factors have been set equal to 1.0. FIG. 8, FIG. 9, and FIG. 10 depict the local and global health assessments for L-G, L-L, and LL-G faults, respectively. FIG. 8 depicts the Bus 6 voltage potentials 806, the local health assessments 802, and the global health assessment 804 for a phase-A-to-ground fault in Bus 6.

FIG. 9 is a plot 900 illustrating local and global health assessments for an L-L fault, according to some embodiments. FIG. 9 depicts a phase-A-to-B short in Bus 18 (FIG. 7). FIG. 9 illustrates Bus 18 voltage potentials 906 (phase A, phase B, and phase C), local health assessments 902 for ASRs 1 through 6, and a global health assessment 904 for a short between phases A and B in Bus 18.

FIG. 10 is a plot 1000 illustrating local and global health assessments for a LL-G fault, according to some embodiments. FIG. 10 depicts a 3-phase-short-to-ground in Bus 33. FIG. 10 illustrates Bus 18 voltage potentials 1006, local health assessments 1002, and a global health assessment 1004. In FIG. 8, FIG. 9, and FIG. 10, the fault occurs at one second (1 s), and causes deviations throughout the system that are reflected in the local health assessments 802, 902, and 1002 and global health assessments 804, 904, and 1004.

At first, when the fault occurs, the local health is reduced due to the induced deviations in the system. In each of FIG. 8, FIG. 9, and FIG. 10 the ASR where the faulty bus is located is affected most severely. For example, in FIG. 8 Bus 6 is affected most severely, in FIG. 9 Bus 18 is affected most severely, and in FIG. 10 Bus 33 is affected most severely. These are indications that those ASRs should be investigated first. As scaling is not performed in these simulations (the importance factors are 1.0.), the impact of the deviations on local and global health is considered to be uniform. If the bus voltage deviations were scaled by importance factors, then the impact of the deviations would also be scaled and reflect the relative detriment of each deviation.

Next, the global health lowers due to the collective changes in the local health. After a short time, the transient effects of the faults finish propagating through the system, which cause the local and global health to stabilize at non-optimal values. Finally, after five cycles automatic corrective action is taken and the system normalizes, which is reflected in rising local and global health. Table 5 summarizes the minimum values of each of the local health and the minimum value of the global health for the faults.

TABLE 5

| Minimum Health Assessments for Three Faults | | | |
|---|---|---|---|
| | Fault 1 | Fault 2 | Fault 3 |
| ASR1 | 0.681 | 0.775 | 0.681 |
| ASR2 | 0.786 | 0.509 | 0.639 |
| ASR3 | 0.769 | 0.311 | 0.640 |
| ASR4 | 1.00 | 1.00 | 0.944 |
| ASR5 | 0.777 | 0.923 | 0.923 |
| ASR6 | 0.742 | 0.983 | 0.059 |
| Global | 0.794 | 0.750 | 0.652 |

In Table 5 Fault 1 is the short between Phase A and ground in Bus 6 depicted in FIG. 8. Fault 2 is the short between Phase A and Phase B in Bus 18 depicted in FIG. 9. Fault 3 is the three-phase short to ground in Bus 33 depicted in FIG. 10.

Importance factors scale the deviations of the local health assessments, and the impact of each local health assessment on the global health assessment. The scaling performed by the local health importance factors, $p_\alpha$ and $p_\beta$, emphasizes the deviations that occur in critical busses or lines, while the scaling performed by the global health importance factors, $p_\lambda$, emphasizes deviations in more important ASRs over less important ASRs. Thus, the role of importance factors is to add emphasis to deviations-enabling the local and global health assessments to be more informative to a human or machine. Any deviation expressed by the $\alpha$ and $\beta$ functions will be reflected in the local and global health assessments, but not all deviations have an equal effect on the system; the scaling helps to convey the importance of a fault in one location versus another.

As the purpose of importance factors is to add emphasis to changes in bus voltages, line powers, or local health assessments, any logically consistent method for emphasizing the system's operational priorities can be used to select importance factors. Some potential selection methods include assigning importance factors to 1.0, assigning ranked values based on the loads on each line and bus, and performing a contingency analysis to assign values. For simulations presented with reference to FIG. 8, FIG. 9, and FIG. 10, the busses, lines, and ASRs in the simulation have importance factors of 1.0, meaning that they are equally important.

To demonstrate the effects of bus, line, and ASR importance factors on the minimum values of $\lambda_3$ and $\gamma$, four assessments of the phase-A-to-B short depicted in FIG. 9 were conducted. Table 6 summarizes the results of these assessments. The first row represents the case where importance factors are equal to 1.0. This row can be used to compare the results of the assessments where the importance factors were varied. The second row represents the case where all importance factors except for $p_{\alpha18}$, the importance factor for Bus 18, are equal to 1.0. As the fault occurred in Bus 18, the phase A and phase B voltages experience the largest deviations, and the effects of these deviations are emphasized by the $p_{\alpha18}$ of 2.0. This results in a lower local health assessment for ASR 3 and, in turn, a lower global health than the case where $p_{\alpha18}$ is 1.0 in the first row. The third row represents the case where all importance factors except for $p_{\beta17\text{-}18}$, which is the importance factor for the line connecting Bus 17 to Bus 18, are equal to 1.0. As the fault occurred in Bus 18, the line connecting Bus 17 and Bus 18 experiences a large power flow deviation, and the effects of this deviation are emphasized by the $p_{\beta17\text{-}18}$ of 2.0. This results in a lower local health assessment for ASR 3 and, in turn, a lower global health than the case where $P_{\beta17\text{-}18}$ is 1.0 in the first row. The fourth row represents the case where importance factors except for $p_{\lambda3}$ are equal to 1.0. As no importance factors for the power flows or voltages were changed, the local health of ASR 3, $\lambda3$, was unchanged. However, the deviation due to the fault occurring in ASR 3, are emphasized by the $p_{\lambda3}$ of 2.0. This results in an unchanged local health assessment, and a lower global health assessment, when compared to the case where $p_{\beta17\text{-}18}$ is 1.0 in the first row.

TABLE 6

| The Effects of Importance Factors on $\lambda_3$ and $\gamma$ for a Phase-A-to-B Short in Bus 18 | | | | |
|---|---|---|---|---|
| $P_{\alpha 18}$ | $P_{\beta 17\text{-}18}$ | $P_{\lambda 3}$ | Minimum $p_{\lambda 3}$ | Minimum $\gamma$ |
| 1.0 | 1.0 | 1.0 | 0.311 | 0.750 |
| 2.0 | 1.0 | 1.0 | 0.235 | 00.738 |
| 1.0 | 2.0 | 1.0 | 0.273 | 0.744 |
| 1.0 | 1.0 | 2.0 | 0.311 | 0.688 |

An IEEE-33 bus distributed system 700 model, which was representative of a modern distribution system, was presented in FIG. 7. This was used to produce operating points that were evaluated using techniques for assessing local and global health, which were discussed above. These techniques, which produced a tiered indication of local and global health, were then demonstrated in with reference to FIG. 8, FIG. 9, and FIG. 10. These rapid and centralized health assessments may be used by humans or machines to quickly ascertain adverse conditions that merit investigation or immediate action.

Figure 11:
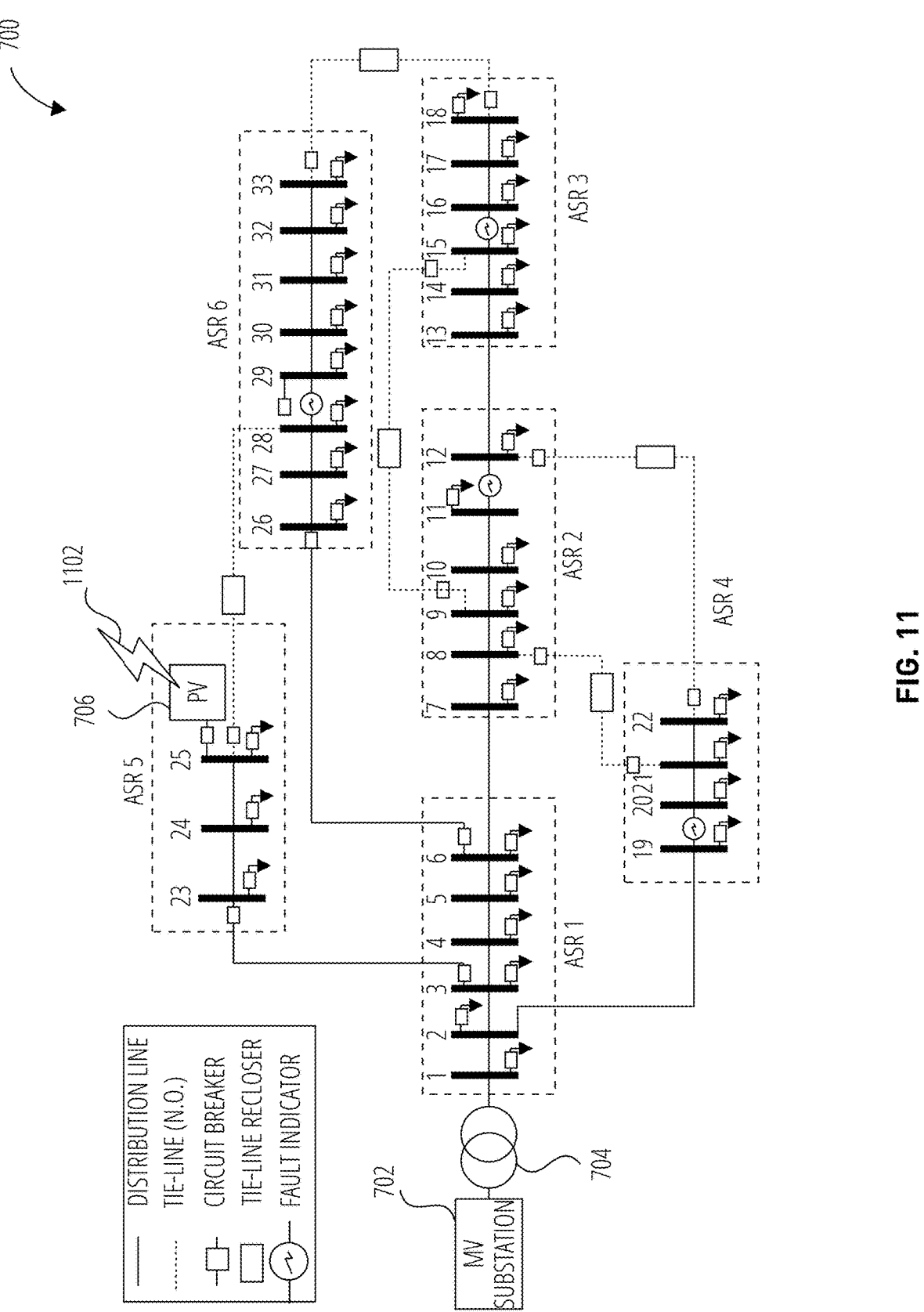
FIG. 11 is a block diagram of the IEEE-33 bus distributed system of FIG. 7 with a cyberattack occurring at a PV array, according to some embodiments.

FIG. 11 is a block diagram of the IEEE-33 bus distributed system 700 of FIG. 7 with a cyberattack 1102 occurring at a PV array 706, according to some embodiments. FIG. 11 presents a modified IEEE 33-bus distributed system that was modeled as a radial network with the system rating voltage of 12.66 kV. This system includes 33 buses and 32 connecting lines. Further, the IEEE-33 bus distributed system 700 was classified into six ASRs, (ASR 1, ASR 2, ASR 3, ASR 4, ASR 5, and ASR 6), which are grouped based on proximity, similar to a microgrid, and were fed by a synchronous generator. In this system, the total connected active power load and the reactive power load demands are 3.715 MW and 2.300 MVAr, respectively.

The IEEE-33 bus distributed system 700 was modeled in ARTEMiS/SSN (eMEGASIM) in the MATLAB-Simulink environment and simulated at a time step of 50 microseconds in the electromagnetic transient (EMT) domain. In addition, circuit breakers, tie-line reclosers, fault indicators, and a 10-kW grid-connected PV array 706 on Bus 25 were modeled. The modeled tie-lines, initially set to open, provided interconnections between multiple ASRs and also facilitated network reconfiguration during line contingencies, including line faults. The modeled PV array 706 was operating as a constant power-factor mode or active-reactive power (P-Q) control mode while supplying active power of 10 kW.

The increased dependency on information and communication technologies (ICTs) has made power systems increasingly vulnerable to various cyber-physical attacks. These attacks range from reconnaissance attacks, the objective of which is to gain information on the system, to attacks that attempt to disrupt the system such as denial of service (DoS), replay, or data-insertion attacks. DoS attacks are some of the most-common approaches to disrupt communication networks. DoS can be used by an adversary to affect the dynamic performance of power systems, leading to unstable behavior. Replay attacks capture real messages to be replayed later so as to obfuscate the current state of the system. False-data-injection attacks manipulate communication data to create confusion and trigger incorrect responses that disrupt the system while preventing detection. Ramp and scaling attacks are examples of false-data-injection attacks. These attacks involve making small or gradual modifications to true measurements to confuse the system and trigger control actions that are not appropriate for the actual state of the system. Ramp attacks are gradual modifications of true measurements while scaling attacks add or subtract a small percentage value to measurements. These types of attacks can be specifically tuned to cause disruption while evading detection by carefully choosing the scale of the modifications. Using a representative pool of cyberattacks to validate detection and mitigation mechanisms is useful for cyber-physical system testing.

As an illustration of FBT, ramp and scaling attacks against the PV-integrated IEEE-33 bus distributed system 700 (FIG. 11) were considered. Further, it was assumed that the inverter of the PV array 706 was compromised, and the attacker was able to modify the internal setting of the inverter by applying the following attack templates:

1. Scaling attack: This attack involves modifying the measurement signal to a higher or lower value, depending on the scaling attack parameter, $\lambda_{scale}$.
2. Ramp attack: This attack vector involves adding a time-varying ramp signal to the input control signal based on a ramp signal parameter, $\lambda_{ramp}$.

$$P_{scale}=P_i(1+\lambda_{scale})$$

$$P_{ramp}=P_i+\lambda_{ramp}*t$$

Figures 12, 13:
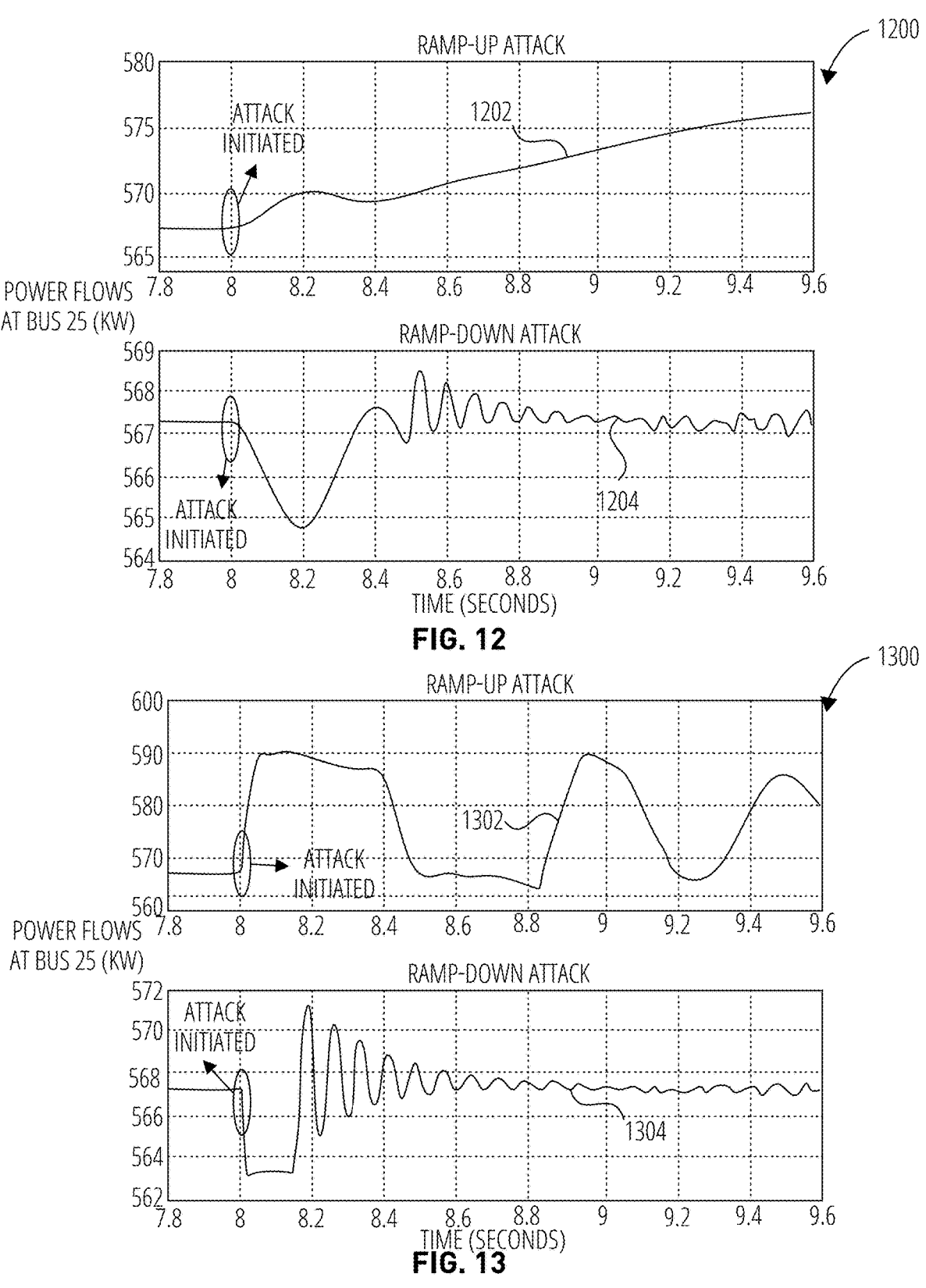
FIG. 12 is a plot illustrating power flows at Bus 25 of the IEEE-33 bus distributed system of FIG. 11 during ramp-up and ramp-down attacks, according to some embodiments.
FIG. 13 is a plot illustrating power flows at Bus 25 of the IEEE-33 bus distributed system of FIG. 11 during scale-up and scale-down attacks, according to some embodiments.

FIG. 12 is a plot 1200 illustrating power flows at Bus 25 of the IEEE-33 bus distributed system 700 of FIG. 11 during ramp-up and ramp-down attacks, according to some embodiments. The plot 1200 includes a ramp-up attack plot 1202 and a ramp-down attack plot 1204.

FIG. 13 is a plot 1300 illustrating power flows at Bus 25 of the IEEE-33 bus distributed system 700 of FIG. 11 during scale-up and scale-down attacks, according to some embodiments. The plot 1300 includes a scale-up attack plot 1302 and a scale-down attack plot 1304.

FIG. 12 and FIG. 13 show the injected disturbances in power flows at Bus 25 during pulse and ramping attacks on the 10-kW PV array 706 (FIG. 11). During the ramp attack, a time-varying ramp signal with the specified parameter ($\lambda_{ramp}=\pm200$) is added to the DC link reference point ($V_{dcref}$) inside the three-phase three-level voltage source converter (VSC) of the PV array 706 after 8 seconds. During the ramp-up attack ($\lambda_{ramp}=+200$), it may be observed that the ramp-up attack plot 1202 increases to around 575.6 kW at 9.6 s. However, during the ramp-down attack ($\lambda_{ramp}=-200$), the IEEE-33 bus distributed system 700 has a minor impact where the ramp-down attack plot 1204 is gradually reduced to 564.7 kW at 8.2 s, and power flow at this bus (Bus 25) is finally recovered at 8.8 s.

During the scaling attack, $V_{dcref}$ was modified by half its original value ($\lambda_{scale}=\pm0.5$), and this attack was performed after 8 s. During the scale-up (($\lambda_{scale}=+0.5$) on Vdcref, the initial scale-up attack plot 1302 was increased to 590 KW at 8.05 s and exhibited a major oscillation with low frequency. During the scale-down (($\lambda_{scale}=-0.5$), the scale-down attack plot 1304 was reduced to 563.4 kW, and a minor oscillation was observed, with high-frequency components as compared to the previous scale-up attack. From these two experiments (ramping and scaling experiments), it may be inferred that the ramp-up and scale-up attacks have more severe impact than do ramp-down and scale-down attacks. Further, it may be concluded that the impact of cyberattacks depends, at least in part, on the nature of the attack, and the scaling attack injects more transient instability than a ramp attack because of its instantaneous change of the signal to extreme values. This result was expected and is an example of FBT validation, as large instantaneous changes (scale attack) should produce more power-flow instability than gradual changes (ramp attack). Additionally, emulated or hardware-based test beds of the IEEE 33 bus system may use models like this to validate their performance.

Several approaches may be used to develop intrusion-detection systems (IDSs) to detect different classes of data-integrity attacks, which include pulse and scaling attacks. In general, these approaches may be classified into two broad categories: signature-based IDS and anomaly-based IDSs.

Signature-based IDS relies on network traffic to detect different classes of data-integrity attacks based on the defined attack-signature database. Several IDS tools, including BRO (Zeek), Snort, Firestorm, and Spade may be applied in developing signature-based IDS in real-time in a cyber-physical test bed environment.

Anomaly-based IDS detects intrusions based, at least in part, on deviations from the normal behavior of the distribution system. It includes different types, such as model-based IDS, machine-learning-based IDS, and multi-agent-based IDS, without limitation. These are discussed below. Model-based IDS utilizes the current grid information, historical measurements, and other relevant information to develop a baseline model and detects attacks based on the statistical and temporal correlation analysis of incoming grid measurements. Learning-based IDS applies machine learning, deep-learning, and data mining algorithms to identify different types of stealthy and sophisticated attacks using grid measurements. Further, learning-based IDS also distinguishes these attacks from other events, including line faults, extreme weather events, etc. For example, decision tree algorithms may be utilized in detecting different data integrity attacks using synchrophasor measurements in real-time. Multi-agent-based IDS includes several distributed agents that utilize both cyber and physical measurements to develop anomaly detection algorithms through agent coordination and information sharing. Further, multi-agent-based IDS may be utilized for developing attack-resilient protection and control schemes that may detect attacks at an early stage and initiate necessary mitigation strategies to restore normal operation of the power grid.

Design tradeoffs between various elements in a CPT test bed may be broken down into three different categories: physical components, soft components, and user interfaces. Representations of CPTs' physical, cybernetic, and cyber-physical parts may be reviewed within the context of balancing cost, computational expense, and fidelity. The scalability of simulated systems within CPTs enables them to be highly cost effective, but with a lower resolution than more computationally expensive system emulators. Physical hardware may have substantially no computational expense, but have the highest financial cost associated with operation and maintenance. Relevant communication protocols are described, as are timing considerations to be used based on the goals of the CPT. Wide-area test bed representations with data visualization aspects of CPTs may also be explored. Methods for testing CPSs may be leveraged as potential avenues for developing generalized testing methods to validate the performance of CPTs.

An initial demonstration on an IEEE 33 bus system, together with examples for how MBT and FBT may be applied to validate the CPT performance. Detection strategies for these types of attacks may be considered. CPTs enable easy exploration for improving CPSs that impact everyday life. Thus, developing effective methods to ensure proper functionality and better defining the limitations of these CPTs according to embodiments disclosed herein would be desirable.

Figure 14:
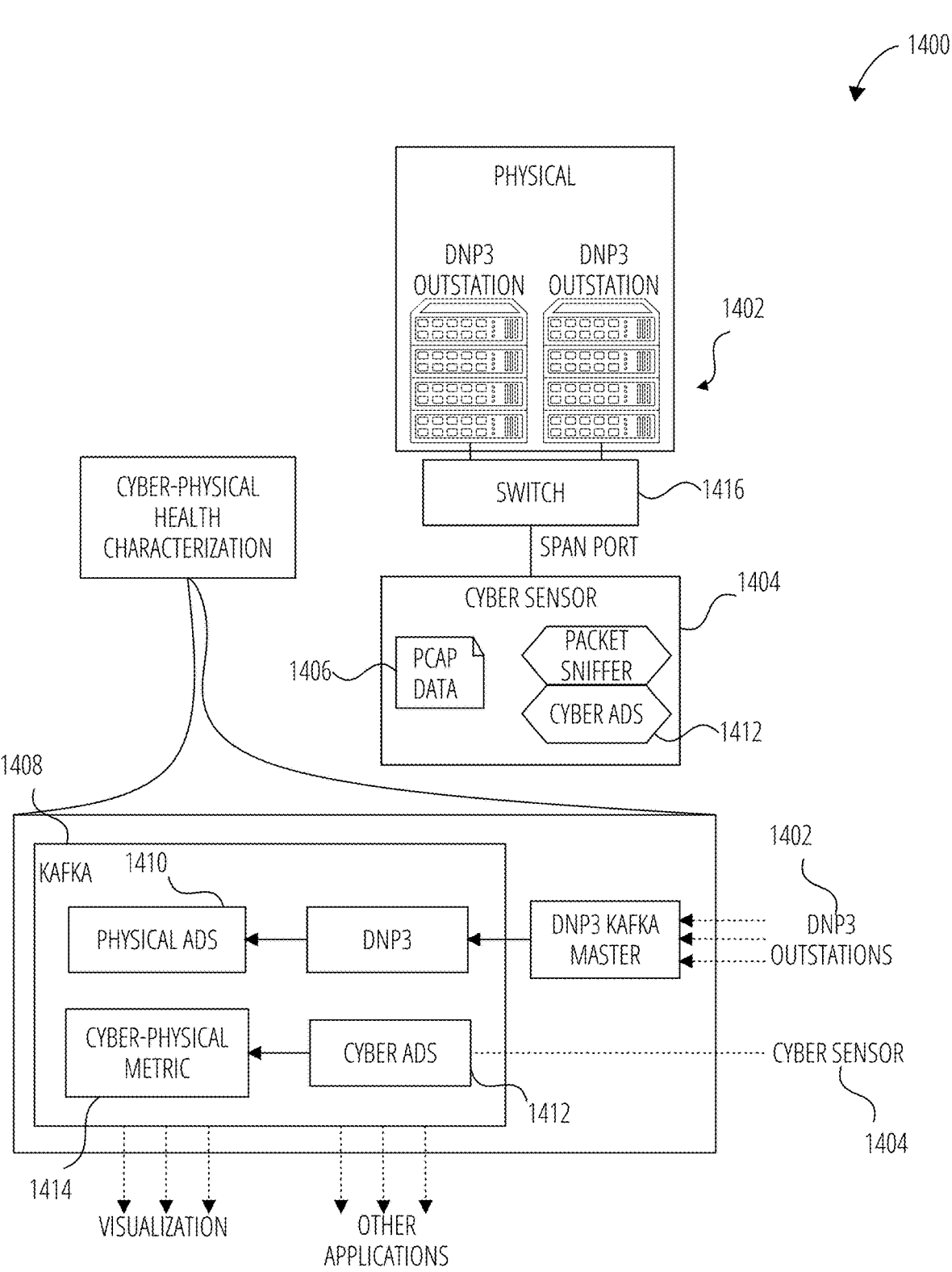
FIG. 14 is a block diagram illustrating an architecture of a cyber-physical attack assessment, according to some embodiments.

FIG. 14 is a block diagram illustrating an architecture 1400 of a cyber-physical attack assessment, according to some embodiments. The architecture 1400 may be used for data-driven correlation of cyber and physical anomalies. This data-driven approach is based, at least in part, on a publisher/subscriber model to enable the communication, analysis, and sharing of information between distributed applications. The overall architecture 1400 is presented in FIG. 14.

The architecture 1400 provides support for managing data streams of cyber and physical data. The architecture 1400 consolidates data coming from different sensors, communication media, and protocols. Physical data is collected using the DNP3 protocol from outstations 1402 gathering data from physical sensors. Cyber data is collected by cyber sensors 1404 that collect and analyze packet data (e.g., PCAP data).

By way of non-limiting example, cyber and physical data streams may be managed by Kafka 1408, which collects, stores, and serves the data to any process that requires it. Kafka 1408 may be at least one of the bases for the architecture 1400. Kafka 1408 is an open-source distributed streaming platform based on the publish/subscribe architecture. The benefits of using Kafka 1408 include that Kafka 1408 is highly scalable as it can elastically expand to handle trillions of messages per day and petabytes of data, Kafka 1408 includes persistent storage of data streams, Kafka 1408 includes large ecosystem with libraries and ports to most common languages, and Kafka 1408 is fault tolerant.

In order to assess the likelihood of pre-sense of cyber-physical attacks, the cyber and physical data is analyzed using data-driven Anomaly Detection Systems (ADSs). Physical ADS 1410 analyses the data provided by the DNP3 outstations 1402. Cyber ADS 1412 analyses the packet data collected by the cyber sensors 1404. The result from the Physical ADS 1410 and the Cyber ADS 1412 is fed into a cyber-physical metric 1414 that provides a quantitative value of the assessment of cyber-physical attacks.

Figure 15:
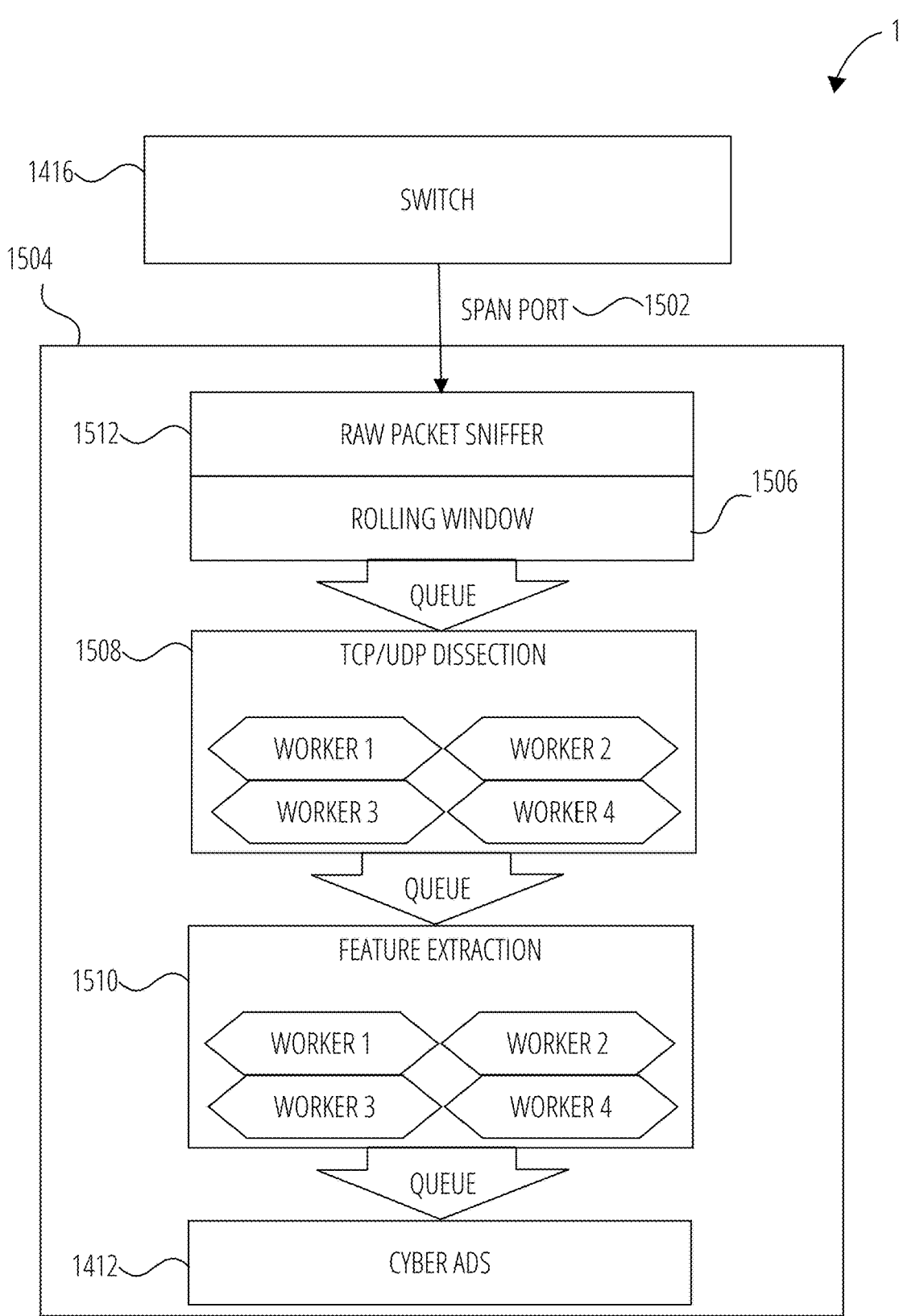
FIG. 15 is a functional flow diagram of a cyber-sensor architecture, according to some embodiments.

FIG. 15 is a functional flow diagram of a cyber-sensor architecture 1500, according to some embodiments. A cyber sensor (e.g., the cyber sensors 1404 of FIG. 14) was designed and implemented to capture and analyze packet data (e.g., PCAP data 1406 of FIG. 14) in real-time and detect anomalous behavior. As presented in FIG. 14, the cyber sensors 1404 are connected to a network switch 1416 to monitor the communication between devices in the network. The cyber sensors 1404 may use Scapy to capture and analyze the network traffic, without limitation. The cyber sensors 1404 are connected to a switch port analyzer (Span port 1502) in the network switch 1416 with its network interface configured in promiscuous mode. In other words, all incoming and outgoing communication passing through the switch is mirrored to the Span port 1502, allowing the cyber sensors 1404 to have access to all packets communicated through the network switch 1416. The data acquired through the cyber sensors 1404 is processed in a multi-processing pipeline 1504, which is illustrated in FIG. 15. A rolling window 1506 of 1 second may be used to analyze sections of data in the communication. To increase throughput, TCP/UDP packet dissection 1508 (e.g., including worker 1, worker 2, worker 3, and worker 4) may be performed in parallel. Packet level and window level features are extracted from dissected TCP/UDP packets (feature extraction 1510) to train data-driven anomaly detection algorithms. PCAP data 1406 (FIG. 14) is stored for further analysis. Alarm notifications are delivered to the Kafka database, which is used to generate notification alerts.

The anomaly detection system of the cyber sensors 1404 (FIG. 14) was developed to identify any anomalous behaviors in the communication network. To achieve anomaly detection, the normal behavior of the system may be learned by a machine learning algorithm so that any behaviors that are different from the previously seen normal behavior will be detected as anomalies. These identified anomaly details are sent to the Kafka database for generating alert notifications. To train the machine learning models, a set of features was extracted (e.g., using the feature extraction 1510 of FIG. 15) from the row packet stream sniffed through a packet sniffer 1512 during the system's normal operations. The feature extraction 1510 (e.g., including worker 1, worker 2, worker 3, and worker 4) was performed and TCP/UDP is dissected (e.g., TCP/UDP packet dissection 1508) in parallel using a windowing technique (e.g., using the rolling window 1506 of FIG. 15). The row TCP/UDP packet stream is considered as a time series, and a set of network flow statistical features are extracted from a set of neighboring packets by using a window of length 1 second. Therefore, the set of neighboring packets generate one window-based feature vector. From each packet, a set of packet header details (packet features) were extracted (e.g., using the feature extraction 1510). These extracted packet features within the 1 second window were used to generate a set of window features, which are presented in Table 7.

TABLE 7

| Window Based TCP Packet Stream Features | |
|---|---|
| Feature Name | Feature Description |
| Packet_rate | Number of packets within a window |
| Num_src_IP | Number of different source IP addresses |
| Num_dst_IP | Number of different destination IP addresses |
| Num_src_port | Number of different source ports |
| Num_dst_port | Number of different destination ports |
| Min_data_length | The minimum data length of packets |
| Max_data_length | The maximum data length of packets |
| Avg_data_length | The average data length of packets |
| Min_win | The minimum window size of packets |
| Max_win | The maximum window size of packets |
| Avg_win | The average window size of packets |
| Min_time_intv | The minimum time gap between packets |
| Max_time_intv | The maximum time gap between packets |
| Avg_time_intv | The average time gap between packets |
| Min_pkt_src | The minimum number of packets per single source IP |
| Max_pkt_src | The maximum number of packets per single source IP |
| Avg_pkt_src | The average number of packets per single source IP |
| Min_pkt_dst | The minimum number of packets per single destination IP |
| Max_pkt_dst | The maximum number of packets per single destination IP |
| Min_ttl | The minimum time to live value of packets |
| Max_ttl | The maximum time to live value of packets |
| Avg_ttl | The average time to live value of packets |
| Num_byt | Number of bytes transmitted by packets |
| Same_src_dst | Number of packets with src IP = dst IP |
| Same_ports | Number of packets with src port = dst port |
| Same_src_src_port | Number of unique of src IP and src port combinations |
| Same_src_dst_port | Number of unique of src IP and dst port combinations |
| Same_dst_src_port | Number of unique of dst IP and src port combinations |
| Same_dst_dst_port | Number of unique of dst IP and dst port combinations |
| Same_IP_port | Number of packets with src IP = dst IP and src port == dst port |

TABLE 7-continued

| Window Based TCP Packet Stream Features | |
|---|---|
| Feature Name | Feature Description |
| Num_urg | Number of urgent packets |
| Num_syn | Number of sync packets |
| Num_arp | Number of arp packets |

The window features characterize the different behavior of the normal cyber communications. The window features are also used to define the baseline behavior of the system. The extracted features are fed into the machine learning algorithm for detecting anomalies. Two unsupervised algorithms were implemented, namely one-class support vector machines (OCSVM) and Local Outlier Factor (LOF). The term "unsupervised" here refers to the fact that these algorithms do not require any prior knowledge (e.g., labels) on data. Rather, these machine learning algorithms may be trained with window feature vectors extracted during normal communication of the system.

OCSVMs are widely used for anomaly detection where the models are trained using the normal behavior of the system, and any unseen behavior is identified as an anomaly or an attack. OCSVMs are extensions of Support Vector Machines (SVMs). OCSVMs may learn a decision boundary of a single class. Any behavior that is different from the learned behavior may be detected as an outlier.

The LOF algorithm is a classic unsupervised anomaly detection method that computes the local density deviation of a given data point with respect to its neighbors. LOF identifies outliers or anomalies as data record that have a significantly lower density compared to its neighbor data points.

A Physical Anomaly Detection subsystem employs the two aforementioned data-driven machine learning algorithms (OCSVMs and LOF) in order to detect anomalies in the data that have been obtained from the DNP3 outstations 1402 (FIG. 14). The physical ADS 1410 (FIG. 14) is trained using normal system behavior data and are tested with datasets containing both normal and abnormal data received through the DNP3 master-outstation communication. The physical ADS 1410 is a detector of anomalies for data values that represent an abnormal system behavior (e.g., malfunction, destruction, etc.).

Figure 16:
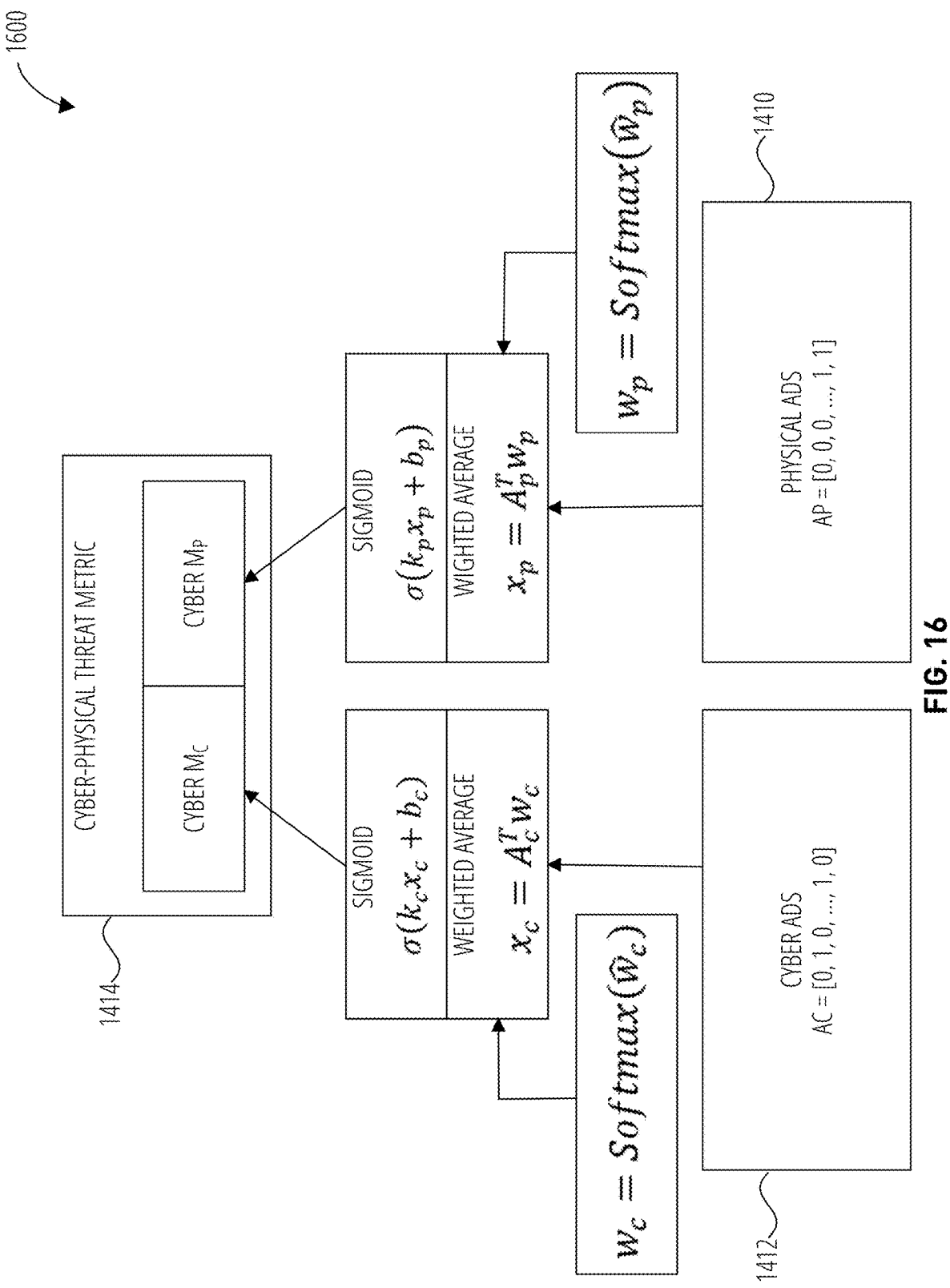
FIG. 16 is a functional flow diagram for determining a cyber-physical threat metric, according to some embodiments.

FIG. 16 is a functional flow diagram 1600 for determining a cyber-physical threat metric (e.g., the cyber-physical metric 1414 of FIG. 14), according to some embodiments. The outputs of the cyber ADS 1412 (FIG. 14) and the physical ADS 1410 (FIG. 14) are used to construct a cyber-physical metric 1414 that informs the operator of the cyber-physical health of the system. The cyber-physical metric 1414 may provide an intuitive set of numbers in the range of 0-1 that informs an operator of the cyber and physical state of the system. The cyber-physical metric 1414 includes of a tuple of two elements. The first element indicates the cyber health and the second element indicates the physical health of the system. A tuple (0,0) indicates normal operation while (1, 1) indicates a cyber threat and a physical fault. Together, the cyber element and the physical element provide a holistic view of the state of the system. As previously mentioned, the CPS metric ($M_{cps}$) includes of a cyber ($M_c$) and a physical ($M_p$) component:

$$M_{cps} = (M_c, M_p).$$

In some embodiments the cyber and physical components $M_p$ and $M_c$ may be used for the cybernetic condition 402 and the physical condition 404, respectively, of the resilience-icon diagram 400 of FIG. 4A. The cyber and physical components are extracted by filtering the output of the cyber ADS 1412 and the physical ADS 1410. The cyber component is computed as:

$$M_c = \sigma(k_c(A_c^T w_c) + b_c),$$

where:

Ac is a vector that includes the output of the cyber ADS 1412 for a window of a last T seconds $w_c$ are a set of weights that perform a weighted average of the elements of $A_c$. Hence, elements of $w_c$ may be between 0-1 and sum up to 1

σ is the sigmoid function:

$$\sigma(x) = \frac{1}{1 + e^{-x}}.$$

The sigmoid function may ensure the output of the cyber component ($M_c$) is constrained to the range of 0-1

$w_c$ and $b_c$ are parameters used to control the sensitivity and the activation position of the sigmoid function.

The physical component is computed using a similar approach to the cyber component, but using the output of the physical ADS 1410 and a different set of weights:

$$M_p = \sigma(k_p(A_p^T \omega_p) + b_p)$$

The parameters of the cyber-physical metric 1414 are obtained by minimizing the cross entropy between the output of the cyber-physical metric 1414 and a set of labeled data used for tuning. These parameters include the weights of the weighted average ($w_c$; $w_p$), the sensitivity of the sigmoids ($k_c$; $k_p$), and the shift of the sigmoids ($b_c$; $b_p$). The minimization is performed using stochastic gradient descent (SGD). A softmax is used in order to ensure that weights ($w_c$;$w_p$) meet the constraints of a weighted average. This results in a parameterization of the weights as $w_c$=Softmax (w^c) and $w_p$=Softmax(w^p), where (w^c;w^p) are a set of free parameters that may be directly optimized with SGD. This parameterization ensures that the elements of the weights ($w_c$;$w_p$) are in the range of 0-1 and the sum is equal to 1. FIG. 16 illustrates an overview of the cyber-physical metric 1414 calculation.

Figure 17:
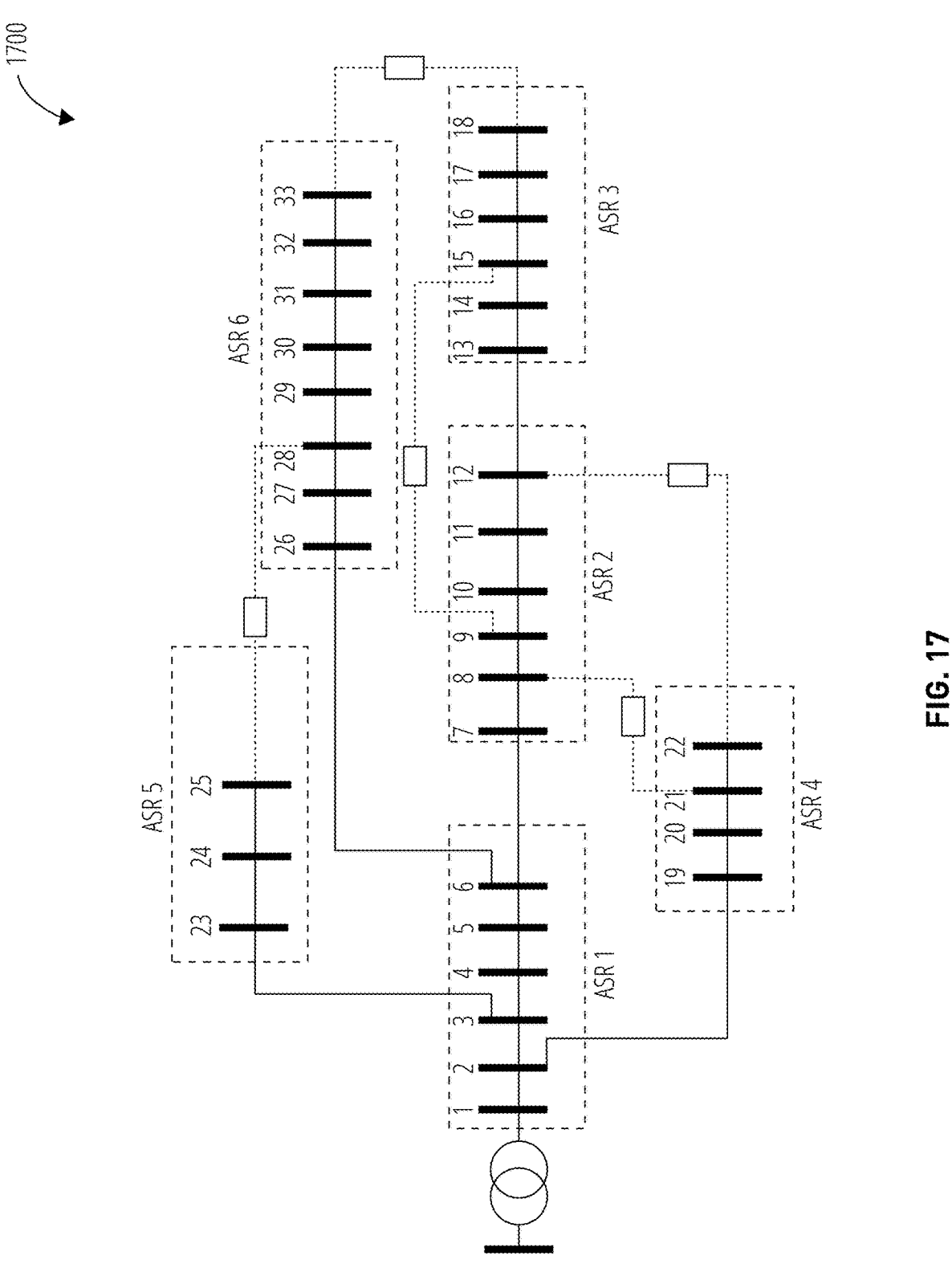
FIG. 17 is a block diagram of an IEEE 33 bus model, according to some embodiments.

FIG. 17 is a block diagram of an IEEE 33 bus model 1700, according to some embodiments. For experimental evaluation, the IEEE 33 bus model 1700, shown in FIG. 17, was chosen. The IEEE 33 bus model 1700 is a generic model that facilitates customization for more specific studies. The IEEE 33 bus model 1700 includes 33 buses and 32 lines and has a voltage of 12.66 kV, load size of 3.715 MW and 2.3 MVar. Further, The IEEE 33 bus model 1700 includes five tie-lines. Initially in an open state, tie-lines support the interconnection between multiple ASRs (ASR 1, ASR 2, ASR 3, ASR 4, ASR 5, and ASR 6). The tie-lines may enable system reconfiguration under different scenarios, such as line faults. The IEEE 33 bus model 1700 may be divided into six ASRs that are a logically grouped set of assets shown in FIG. 17. The ASRs are connected by lines with breakers that provide protection in case of voltage unbalance or over-current.

Figure 18:
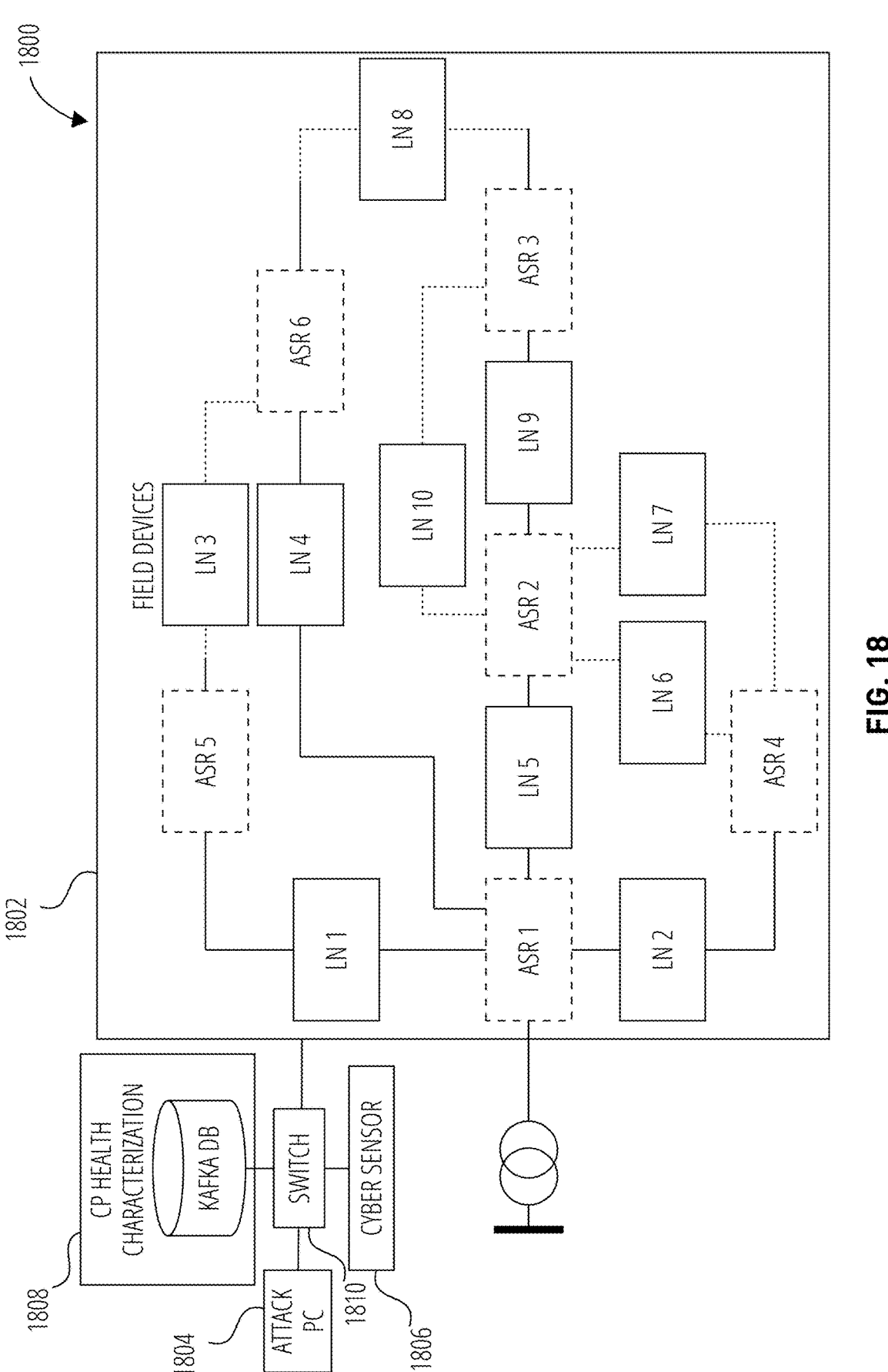
FIG. 18 is a block diagram illustrating a cyber architecture for the IEEE 33 bus model of FIG. 17, according to some embodiments.

FIG. 18 is a block diagram illustrating a cyber architecture 1800 for the IEEE 33 bus model 1700 of FIG. 17, according to some embodiments. FIG. 18 shows an example configuration of cyber components in the IEEE 33 bus model. The cyber architecture 1800 includes field devices 1802, an attack PC 1804, a cyber sensor 1806, and a cyber-physical health characterization 1808, which may be connected by a switch 1810 (e.g., a single switch, without limitation). The cyber sensor 1806 may be connected as shown in FIG. 14.

The field devices 1802 include two types of devices: 1) ASR outstations (ASR 1, ASR 2, ASR 3, ASR 4, ASR 5, and ASR 6) and 2) Line (LN) outstations (LN 1, LN 2, LN 3, LN 4, LN 5, LN 6, LN 7, LN 8, LN 9, and LN 10). The field devices 1802 may interact directly with a physical system, collecting sensor data and executing control actions. The ASR outstations ASR 1, ASR 2, ASR 3, ASR 4, ASR 5, and ASR 6 collect voltage potential, current, power, and reactive power (VIPQ) data from lines (e.g., all lines) in their respective ASRs. The line outstations LN 1, LN 2, LN 3, LN 4, LN 5, LN 6, LN 7, LN 8, LN 9, and LN 10 collect data and implement a protection algorithm that checks for over currents, voltage potential unbalance, and low voltage potential. Line outstations may also open and/or close a breaker when commanded to do so by a remote master controller. The field devices 1802 may communicate sensor and control data using DNP3.

Some embodiments disclosed herein may include the following scenarios for experimentation and analysis:

Normal: Under a normal scenario, the system performs under normal operating conditions (e.g., at least substantially within threshold values for operating parameters such as voltage potentials, electrical currents, power on lines, other parameters, and/or combinations thereof, without limitation). The physical devices exhibit normal operating behavior, and the collection of data leads to the establishment of an expected behavior baseline for anomaly detection. Cyber communication may follow a normal behavior pattern.

Physical fault: In a physical fault, the normal operating behavior of physical devices is interrupted due to a specific equipment malfunction, such as a line fault, without limitation.

Cyberattack: In a cyberattack, the normal cyber communication of the system is disrupted due to various cyber-attacks. Cyberattacks may include cyberattack vectors such as IP scan, ping sweep, port scan, dnp3 data injection, and DoS flood. Physical behavior may not be affected during these attacks.

Cyber-physical attack: In cyber-physical attack, a cyber-attack vector disrupts the normal operating behavior of a physical component of the system. A DNP3 command injection may be used to close the breakers, causing loss of power in corresponding ASRs.

Figure 19:
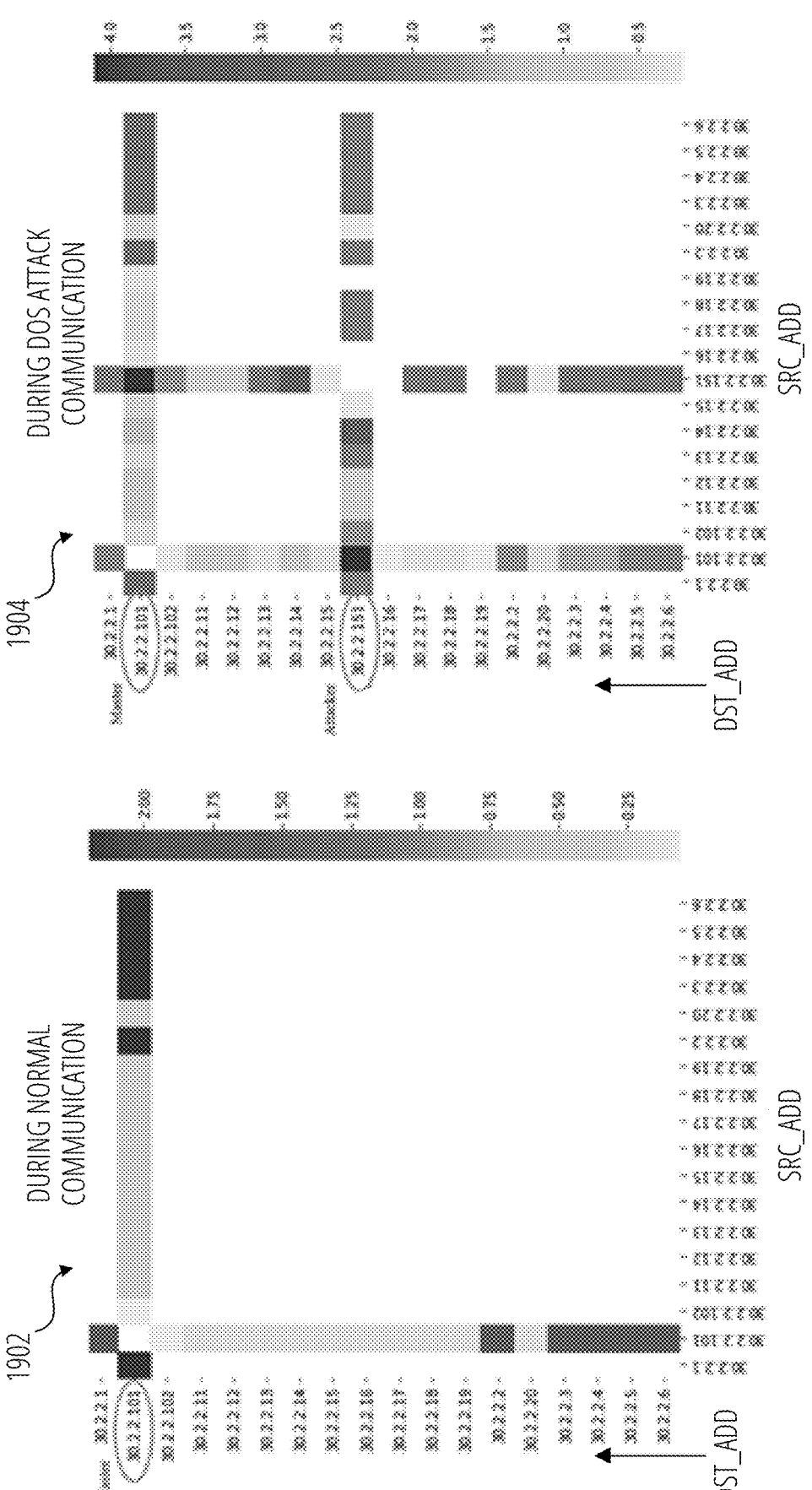
FIG. 19 illustrates examples of an average number of packets communicated between two devices during normal communication and an average number of packets communicated between the two devices during attack communication.

FIG. 19 illustrates examples of an average number 1902 of packets communicated between two devices during normal communication and an average number 1904 of packets communicated between the two devices during attack communication. Analysis may be performed on cyber data collected by a cyber sensor (e.g., cyber sensors 1404) and the result from trained anomaly detection algorithms (e.g., detected using feature extraction 1510 of FIG. 15).

As discussed above, in some embodiments the system may be trained only on normal network communication data collected using a windowing technique. In order to test the performance of trained algorithms, collection of cyberattacks were executed and checked whether a cyber ADS (e.g., the cyber ADS 1412 of FIG. 14) is able to detect the cyberattacks as abnormalities. The executed attacks were ip scan, ping sweep, port scan, DNP3 data injection, and DOS flood.

FIG. 19 shows measurements obtained from the cyber sensor. This analysis represents each device using its IP address. It can be seen that during DoS attack communication the average number 1904 of packets communicated between IP addresses is higher than the average number 1902 of packets during normal communication. Further, new communication appears during cyberattacks due to an attacker's (30.2.2.151) communication with system components. These figures are useful to identify active communications and possible unexpected devices that should not be in the network. The right side shading bar represents the intensity of packets communicated between two devices. Changes of shading also act as an indication for possible abnormal behaviors in the communication.

Figures 20A, 20B:
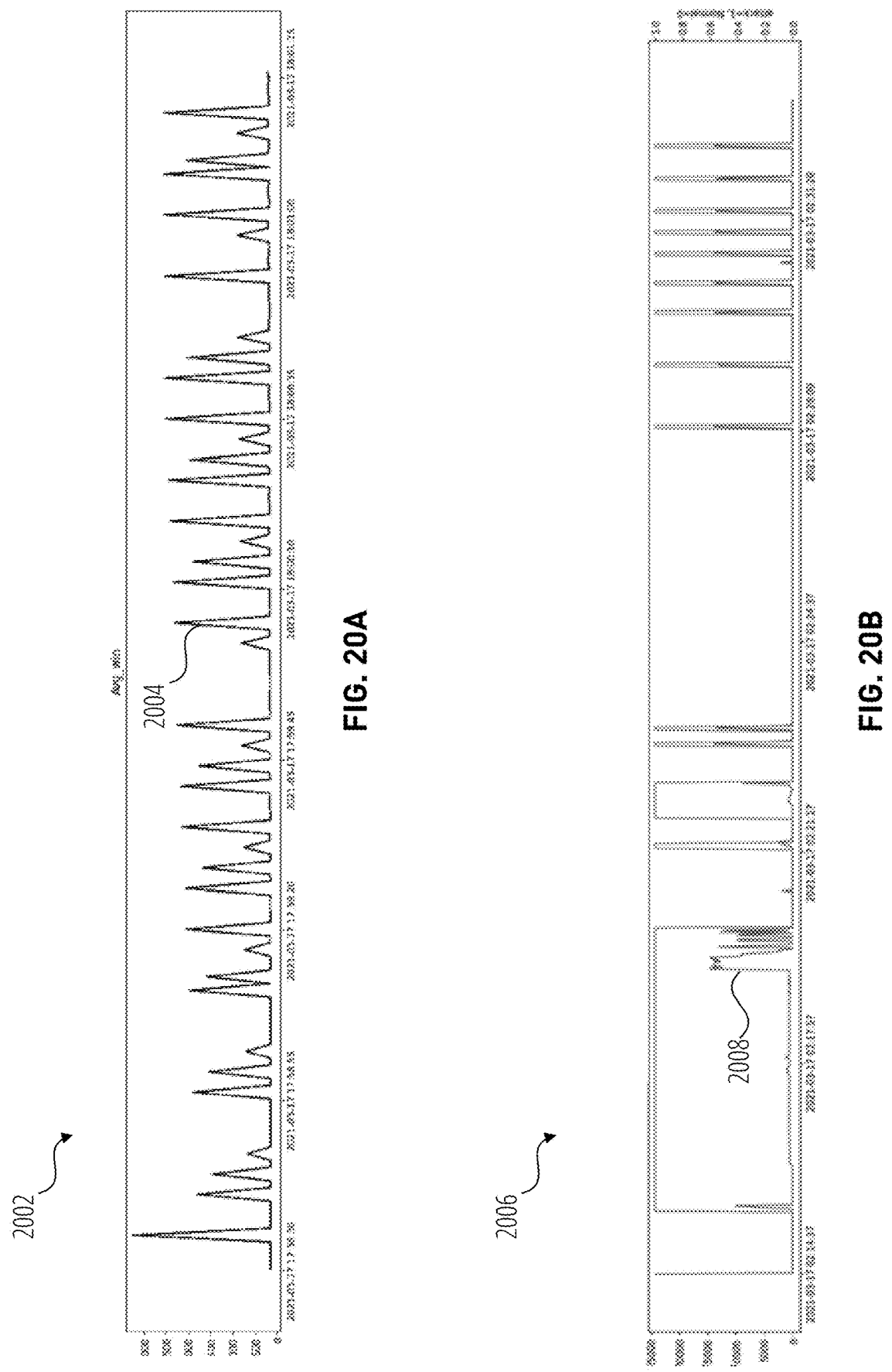
FIG. 20A is a plot illustrating an example of how an extracted window feature value changes over time during normal communication, according to some embodiments.
FIG. 20B is a plot illustrating an example of how an extracted window feature value changes over time during attack communication, according to some embodiments.

FIG. 20A is a plot 2002 illustrating an example of how an extracted window feature value 2004 changes over time during normal communication, according to some embodiments.

FIG. 20B is a plot 2006 illustrating an example of how an extracted window feature value 2008 changes over time during attack communication, according to some embodiments.

FIG. 20B clearly illustrates surges (peaks in the window feature value 2008) in features, which may be substantially an order of magnitude larger than peaks of the window feature value 2004, as a consequence of the attacks. These peaks are clear indication of attack and/or abnormal behaviors of the system. These features may be used to train data-driven anomaly detection algorithms, which will be used to identify anomalous events and provide alerts to the user in VizEng.

Figures 21A, 21B:
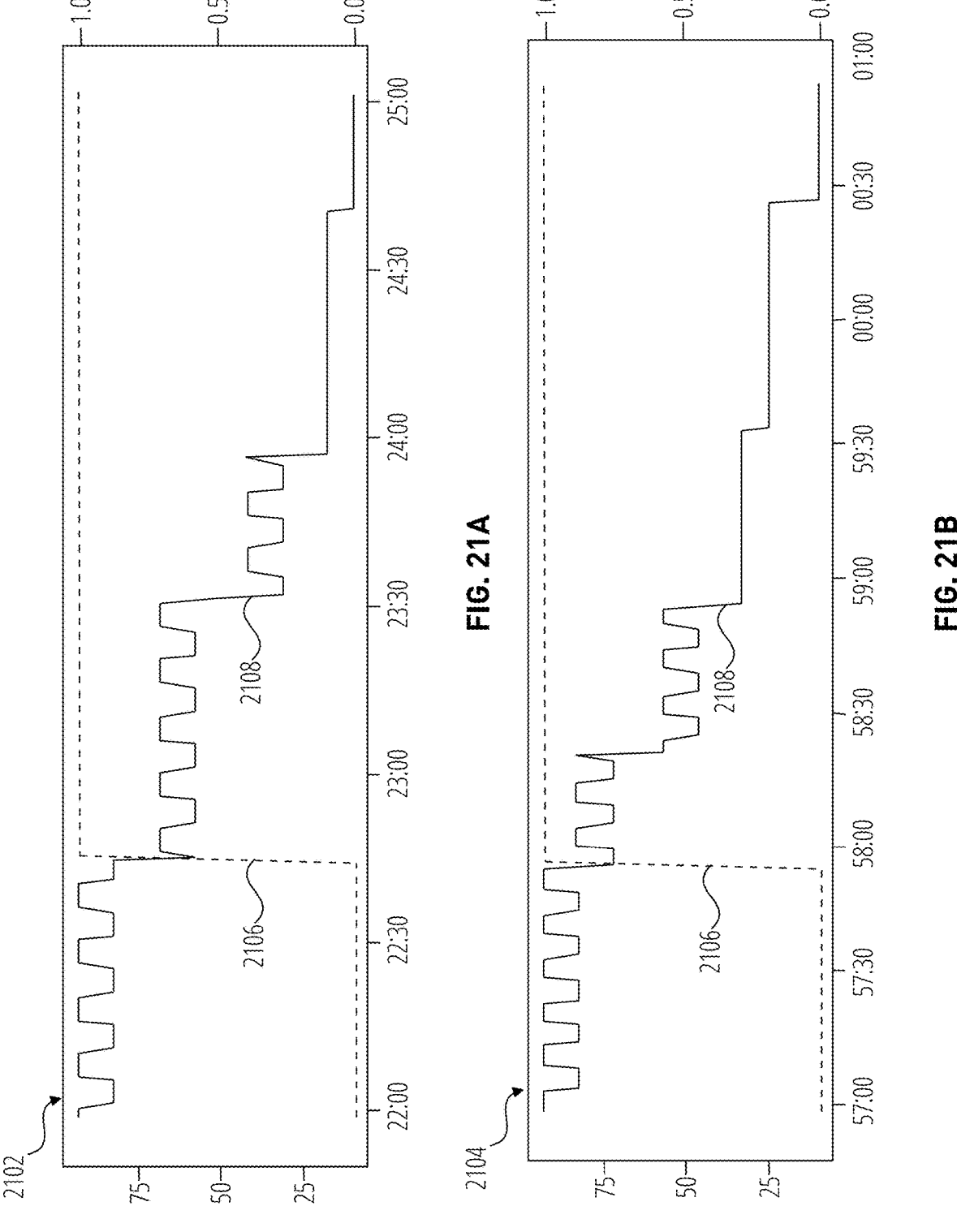
FIG. 21A is a plot 2102 illustrating an example of a physical ADS fault condition signal during a physical fault scenario.
FIG. 21B is a plot 2104 illustrating the physical ADS fault condition signal during a similar cyber-physical attack scenario.

FIG. 21A is a plot 2102 illustrating an example of a physical ADS fault condition signal 2106 during a physical fault scenario caused by phase-to-ground fault that disables ASR 3, ASR 6, ASR 5, and ASR 4.

FIG. 21B is a plot 2104 illustrating the physical ADS fault condition signal 2106 during a similar cyber-physical attack scenario where an attacker inserts DNP3 commands to take ASR 3, ASR 6, ASR 5, ASR 4, and ASR 2. Referring to FIG. 21A and FIG. 21B together, in addition to the physical ADS fault condition signal 2106, FIG. 21A and FIG. 21B illustrate a line 1 current 2108, which represents an electrical current in a specific line (line 1) of the architecture 1400 of FIG. 14. The line 1 current 2108 may correlate with physical data. It should be noted, however, that voltage potentials, power, reactive power, or other parameters may be used to correlate with physical data instead of, or in addition to, the line 1 current 2108.

Figure 22:
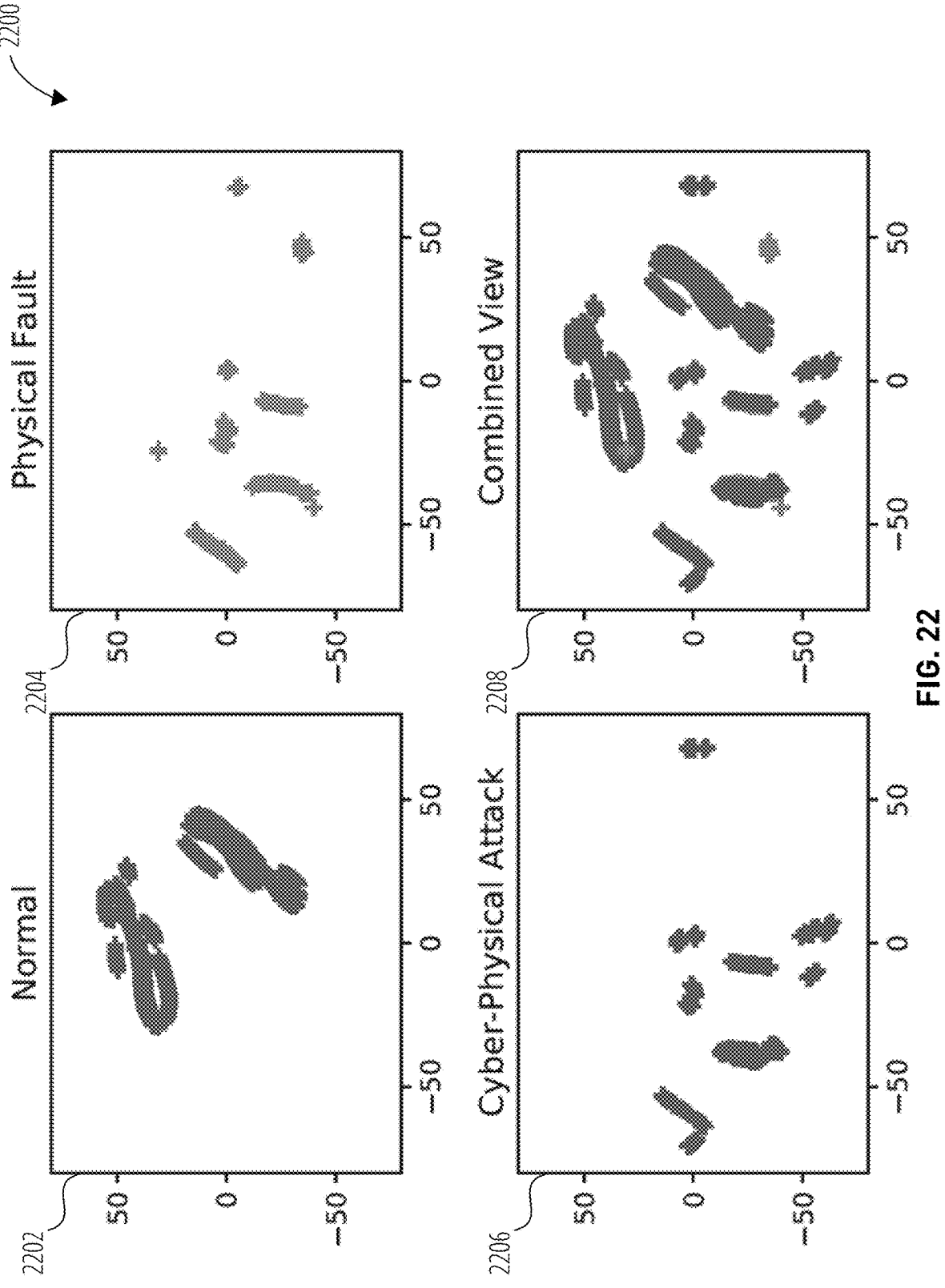
FIG. 22 is a group of plots illustrating T-SNE embeddings of physical data for a normal scenario, a physical fault scenario, and a cyber-physical attack scenario, according to some embodiments.

FIG. 22 is a group of plots 2200 illustrating T-SNE embeddings of physical data for a normal scenario 2202, a physical fault scenario 2204, and a cyber-physical attack scenario 2206, according to some embodiments. Physical data includes voltages, currents, and power. The group of plots 2200 also include a combined view illustration 2208 including the information displayed in the normal scenario 2202, the physical fault scenario 2204, and the cyber-physical attack scenario 2206. The combined view illustration 2208 illustrates an overlap between physical fault and cyber-physical attacks, blurring the distinction between faults and attacks.

The group of plots 2200 use T-SNE embeddings to visualize the data in two dimensions. The visualization helps us see that physical data from the normal scenario 2202 is clearly separated from data that belongs to physical fault scenario 2204 or cyber-physical attack scenario 2206. However, as previously mentioned, the physical data from physical fault scenario 2204 and the cyber-physical attack scenario 2206 has a considerable overlap. As a result, cyber data, not just physical data, may be needed in order to distinguish physical faults from cyber-physical attacks.

FIG. 23A, FIG. 23B, FIG. 23C, and FIG. 23D show cyber and physical anomaly detection in different scenarios. After having located the anomalies on both a physical and a cyber level, and coupling in time of detected anomalies in physical data and cyber communications, the cyber-physical characterization metric (e.g., the cyber-physical metric 1414 discussed with reference to FIG. 14) may be calculated. The cyber-physical metric 1414 may serve as an assessment of a given threat, since the cyber-physical metric 1414 may allow the evaluation of the physical risk posed against the system. For example, an alteration that a cyberattack has caused to a physical system normal behavior may be evaluated.

Figure 23A:
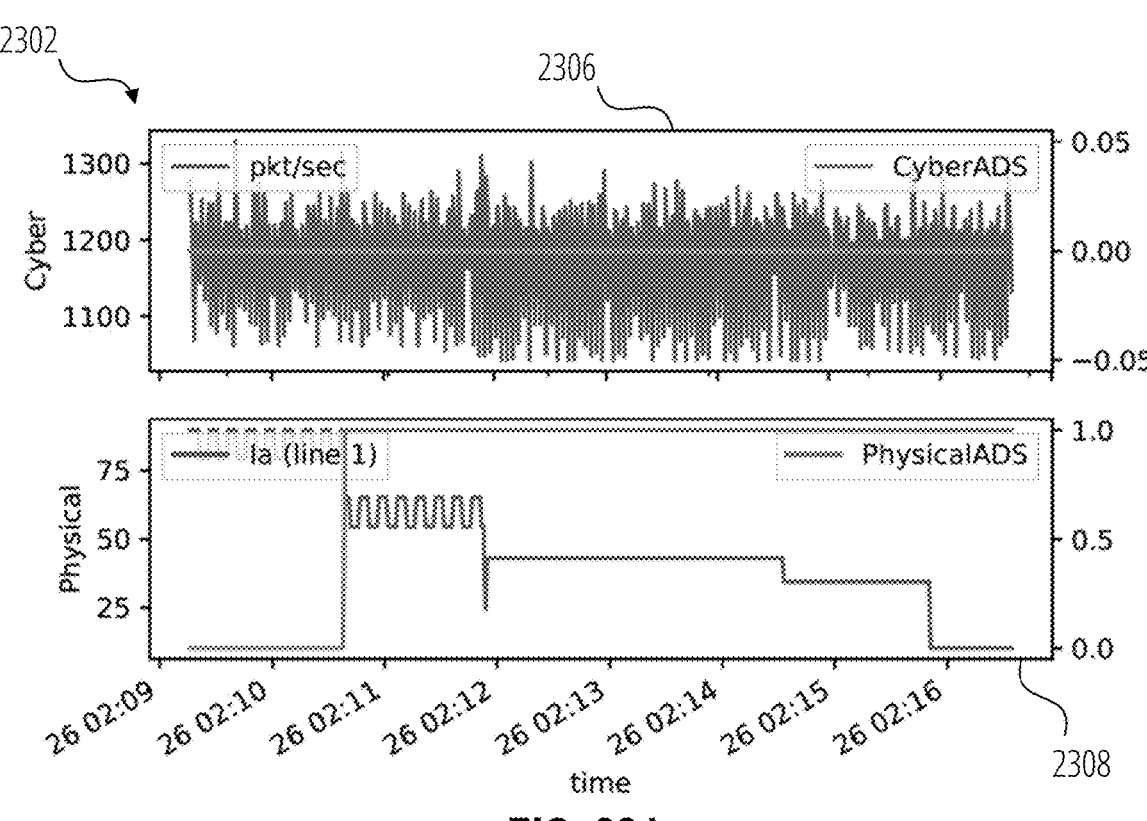
FIG. 23A illustrates examples of a cyber plot and a physical plot for a physical fault scenario.

FIG. 23A illustrates examples of a cyber plot 2306 and a physical plot 2308 for a physical fault scenario 2302, according to some embodiments.

Figure 23B:
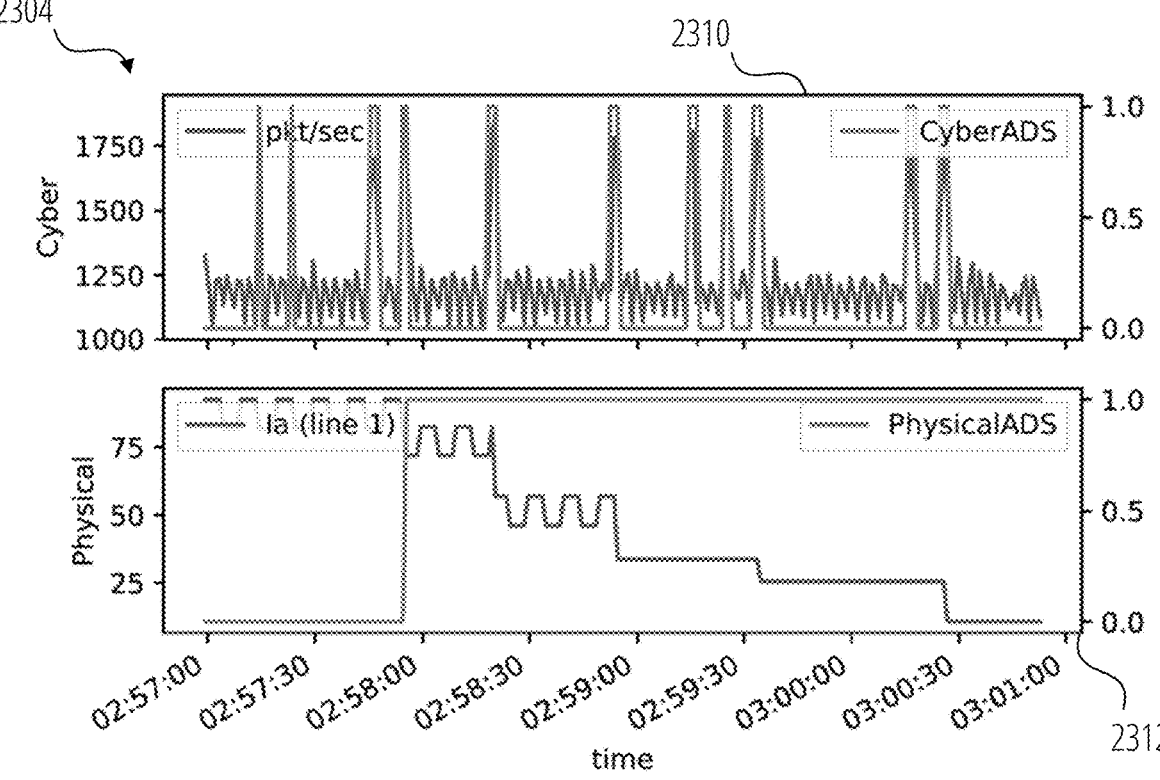
FIG. 23B illustrates examples of a cyber plot and a physical plot for a cyber-physical attack scenario.

FIG. 23B illustrates examples of a cyber plot 2310 and a physical plot 2312 for a cyber-physical attack scenario 2304.

Figure 23C:
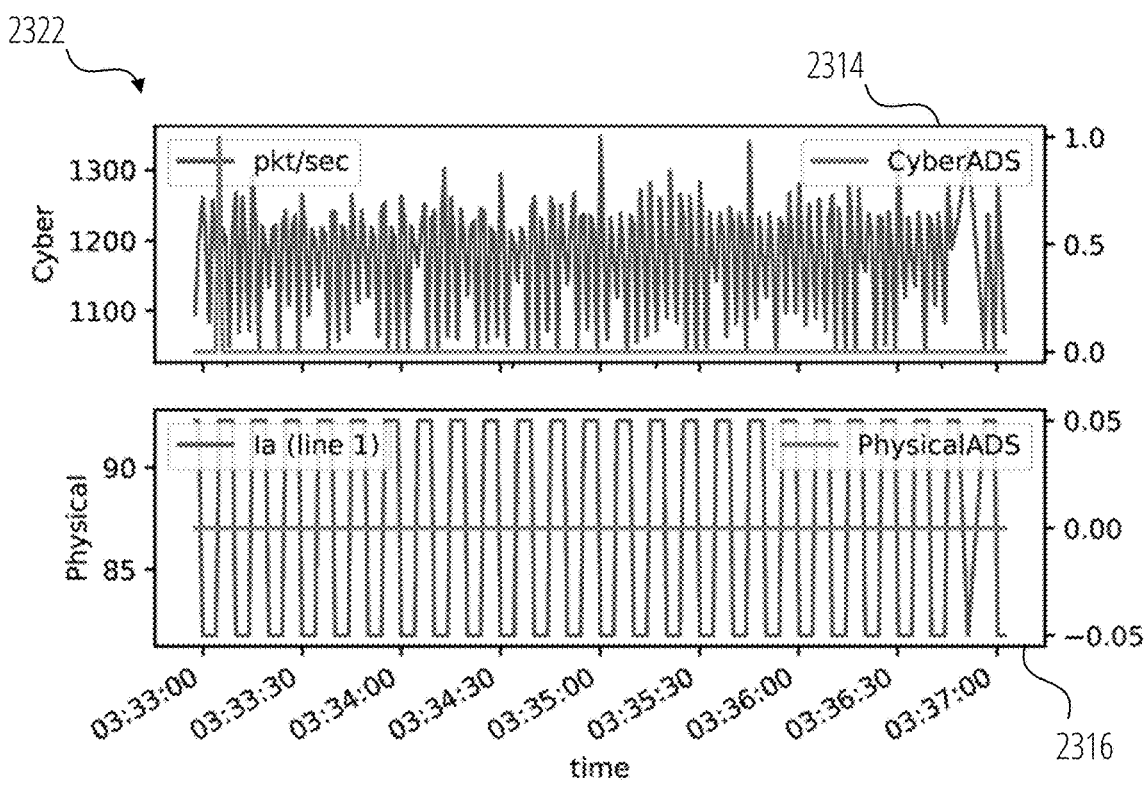
FIG. 23C illustrates examples of a cyber plot and a physical plot for a normal operation scenario.

FIG. 23C illustrates examples of a cyber plot 2314 and a physical plot 2316 for a normal operation scenario 2322.

Figure 23D:
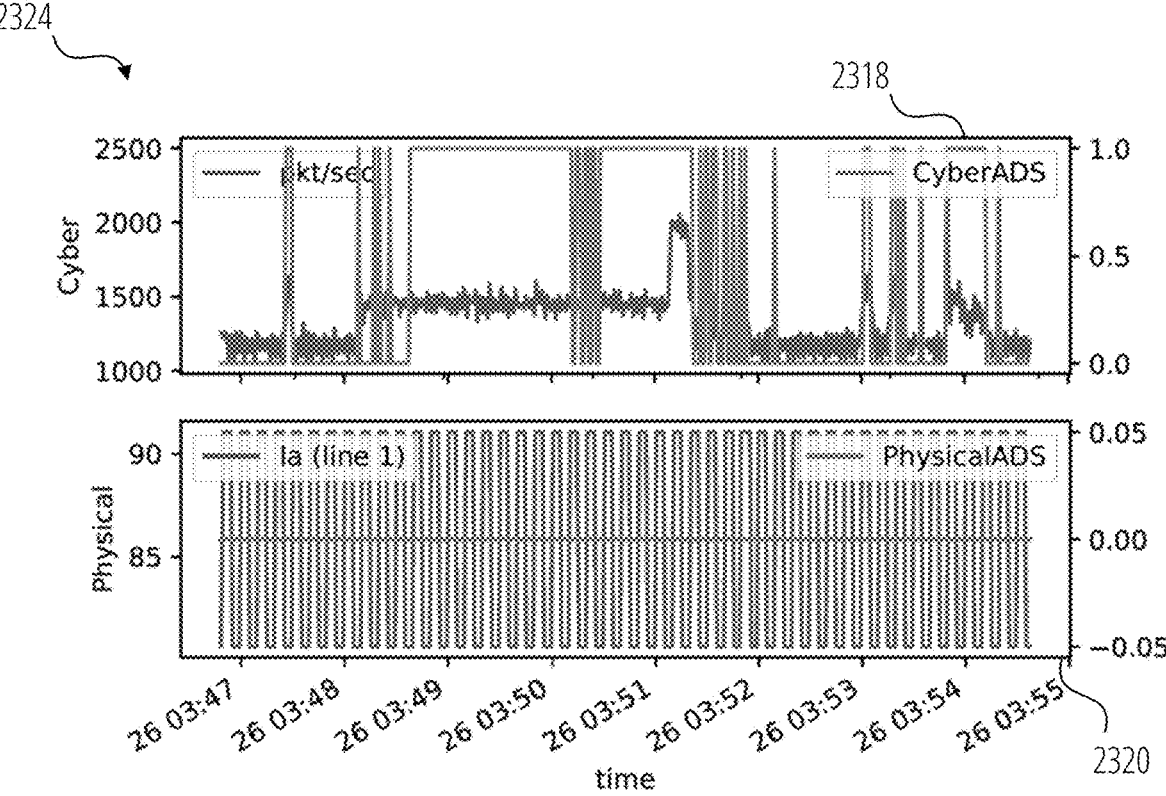
FIG. 23D illustrates examples of a cyber plot and a physical plot for a cyberattack scenario.

FIG. 23D illustrates examples of a cyber plot 2318 and a physical plot 2320 for a cyberattack scenario 2324.

Figure 24:
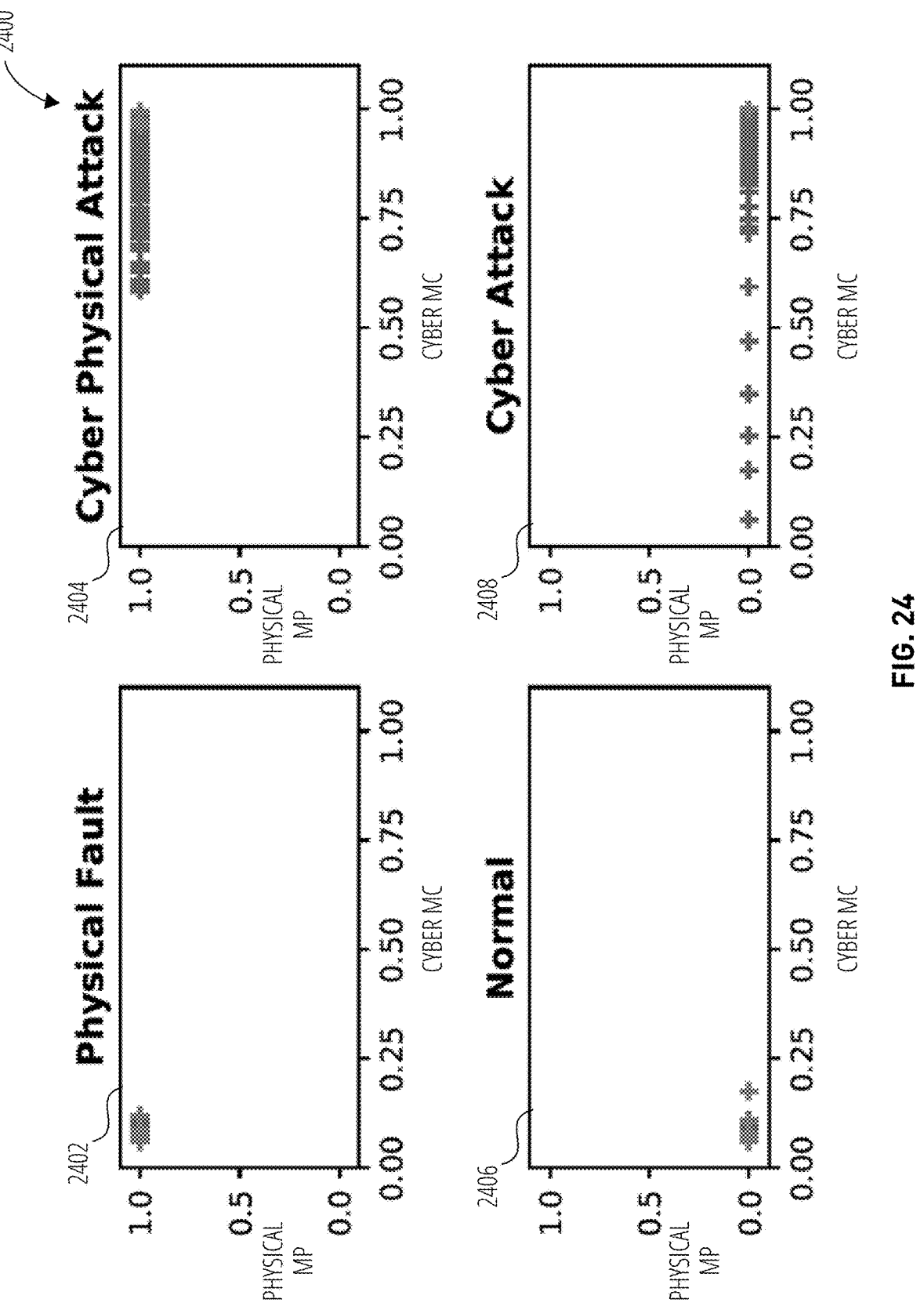
FIG. 24 illustrates plots of example cyber-physical health characterizations for a normal operation scenario, a physical fault scenario, a cyberattack scenario, and a cyber-physical attack scenario.

FIG. 24 illustrates plots 2400 of example cyber-physical health characterizations for a normal operation scenario 2406, a physical fault scenario 2402, a cyberattack scenario 2408, and a cyber-physical attack scenario 2404. The plots 2400 of the four distinct scenarios provide information on the nature of any given anomaly. The plots 2400 display the values of the metric computed for each rolling window in the experimental scenarios. The metric values are displayed in a 2D plot, where a vertical axis corresponds to a physical component ($M_p$) of a cyber-physical metric (e.g., the cyber-physical metric 1414 of FIG. 14) and a horizontal axis corresponds to a cyber component ($M_c$) of the cyber-physical metric. A value of 1 for $M_p$ or $M_c$ represents an anomaly, whereas a value of 0 represents normal behavior.

For normal operation scenarios 2406, the cyber-physical metric reports values close to (0, 0). For substantially pure physical fault scenarios 2402 the metric outputs are also clearly distinguished, with the metric output close to (0, 1). For cyberattack scenarios 2408 the metric outputs are relatively close to (1, 0). Although some few segments of the cyberattack have metric values between (0, 0) and (0.75, 0), the majority of the cyberattack scenarios 2408 have a high value of $M_c$, with the maximum value of the metric being (0, 1), demonstrating that the metric may identify a cyberattack. For cyber-physical attack scenarios 2404, several cyber communication anomalies may be detected along with a disruption in the physical system, leading to metric values approaching (1, 1). The plots 2400 show that the metric may differentiate between physical fault scenarios 2402, cyber-physical attack scenarios 2404, normal operation scenarios 2406, and cyberattack scenarios 2408.

Anomaly detection may be performed on data received both from physical sensor devices and the cyber communication network of an industrial control environment. Cyber and physical data may be integrated in an anomaly detection system, and detected anomalies may be synchronized temporally. This temporal synchronization enables detection of whether a physical anomaly was caused due to a cyberattack or not, but also permits an overall system characterization in the sense that the disclosed pipeline provides a holistic overview of the cyber and physical system in an automated fashion and without the need of human involvement. The disclosed framework may operate on the level of data acquisition and management on both cyber and physical levels and introduces a metric for attack characterization containing cyber communication and physical data based on a wholesome investigation of a wide array of threat vectors and potential vulnerabilities of cyber-physical Systems.

A power grid may include several distributed sensors that rely on various communication protocols, hardware, and software resources to provide multidimensional data sets with varying sampling rate to a control center. The significant increase in volume, velocity, and veracity of incoming grid measurements has led to big data challenges that make it difficult for system operators to efficiently monitor grid networks and take necessary corrective actions. Therefore, an event-visualization dashboard that processes physical measurements, communications network traffic, system topology, system logs, firewall rules, and geographical information is may facilitate real-time cyber-physical situational awareness. Some embodiments disclosed herein may include visualization systems that create a simple real-time actionable interface for dispatchers and cyber system 212 defenders to use for their various roles. This display may aggregate meaningful information, facilitating rapid operational decisions and complementary context for the roles. Root causes of events may include both cybernetic and physical elements.

Figure 25:
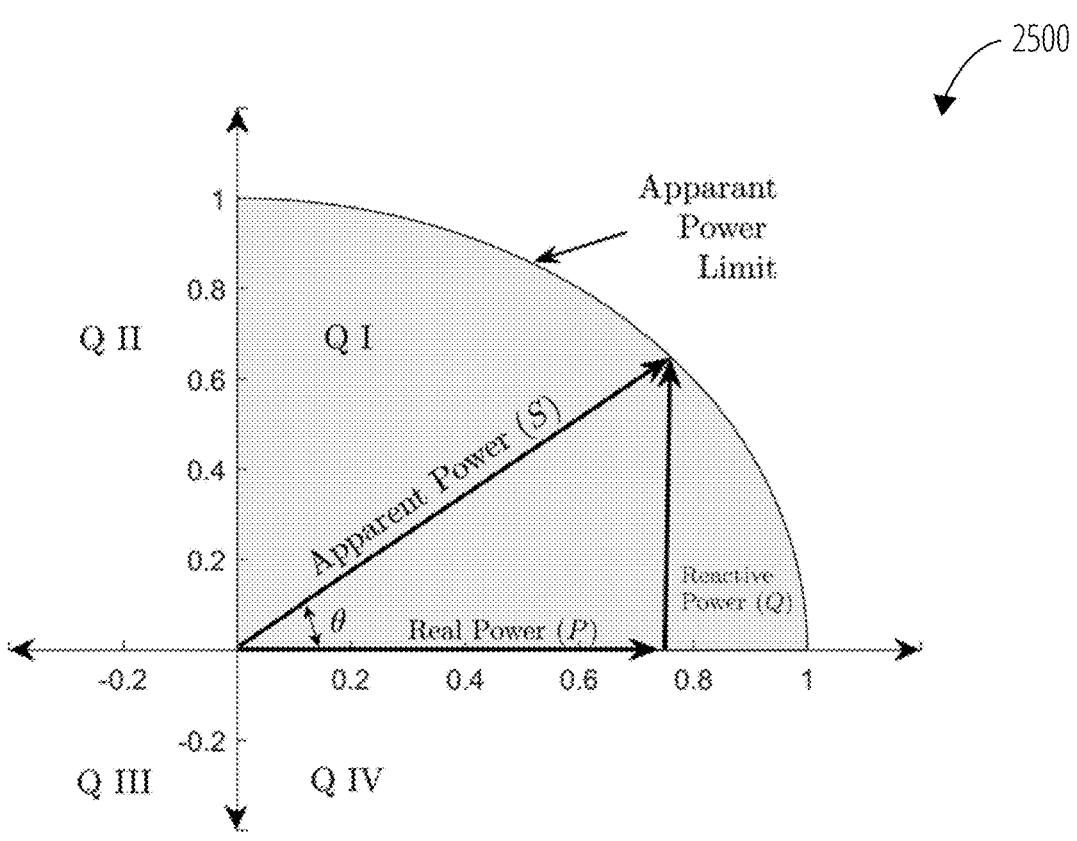
FIG. 25 is a plot illustrating an apparent power S in quadrant I of the complex S-plane, according to some embodiments.

FIG. 25 is a plot 2500 illustrating an apparent power S in quadrant I of the complex S-plane, according to some embodiments. The electrical power system is the backbone of infrastructure. The electrical power system has been designed to withstand single component failures based on a set of reliability metrics that have proven acceptable during normal operating conditions. However, in recent years there has been an increasing frequency of extreme weather events. Many of these extreme weather events have resulted in widespread long-term power outages, proving reliability metrics do not provide adequate energy security.

A resilient system has the ability to resist, adapt, and recover from disruptions. Therefore, resilience has demonstrated itself as a promising concept for currently faced challenges in power distribution systems.

According to some embodiments, an operational resilience metric for modern power distribution systems is disclosed. This resilience metric may be used for the resilience condition 406 of the resilience-icon diagram 400 of FIG. 4A. The resilience metric is based, at least in part, on an aggregation of system assets' adaptive capacity in real and reactive power. This resilience metric may provide information relating to a magnitude and a duration of a disturbance that the system can withstand. This resilience metric may be demonstrated under normal operation and during a power contingency on a microgrid. Some embodiments disclosed herein may be used by operators to make more informed decisions based on system resilience in an effort to prevent power outages.

To ensure a constant supply of electrical power, power systems have been designed and operated under consideration of a set of reliability metrics. These metrics account for normal weather conditions and component failure, but do not consider extreme events, as doing so may not be cost effective.

In the early stages of power system construction, relatively little attention was given to the distribution networks when compared with generation and transmission. Generation and transmission outages are large impact events, whereas distribution outages have smaller localized effects. However, distribution networks may contribute the most to customer interruptions and failure events. 90% of power outages may occur in the distribution system alone.

Complete disaster-resistant protection of an electrical power distribution system may be impractical, and may involve a great financial and time investment. As a result, resilience, in contrast to reliability, metrics may be used in more practical ways. The concept of reliability and resilience are similar but have distinct differences in both scale and duration. Reliability research concentrates on small-scale random faults of power system components caused by internal factors. For example, reliability encompass N–1 contingency planning or a single component failure. At the basic level, reliability ensures that no single point of failure would cause the entire system to stop working. In contrast, resilience considers extreme conditions, or N-k failures, where k may extend well beyond a single failure point. Resilience anticipates that during extreme events a certain amount of degradation to the system is unavoidable. Thus, resilience may be characterized by a system's ability to resist, respond, and recover from a disturbance or attack in order to maintain core operations.

Electrical component failures during extreme weather events such as hurricanes, winter storms, flooding, wildfires, etc., push well beyond the limitations of the current distribution system, which has been design to meet reliability metrics. In the United States, between 2003 and 2012, extreme weather events caused an estimated 679 widespread power outages, affecting at least 50,000 customers. Notable events include Hurricane Katrina, Hurricane Sandy, and the wildfires across California that forced the utility company to de-energize power lines in an effort to mitigate the risk of starting new fires, resulting in widespread blackouts. Making matters worse, our energy infrastructure is aging and climate change is expected to continually increase the frequency and intensity of extreme weather. Costs of weather-related outages are substantially $25 to $70 billion annually. Moreover, these prolonged power outages may put the public at a significant risk, having the potential for loss of life. Data indicates that the 2003 blackout in New York resulted in approximately 90 deaths. In light of these factors, it is of upmost importance for researchers to address the growing concern of electrical power supply during extreme weather events. New methodologies that enable utilities to effectively manage power systems should be developed.

In some embodiments a novel real-time operational resilience metric that utilizes the controllable assets in modern distribution systems is disclosed. The resilience metric is an operational aggregation of assets' adaptive capacities in real and reactive power. The resilience metric indicates the magnitude and duration of a disturbance a system is capable of withstanding, and maintain load demand and stability in voltage and frequency.

One approach to prevent power system failure is to anticipate a possible disaster, adopt effective measures to decrease loss of load and system component failure before and during the disaster, and restore power quickly through controlled reconfiguration. Quantification of resilience in power systems is an emerging field. It is an important open area of research, of great interest to utilities and stakeholders.

To date, power systems are regulated based upon reliability metrics. This dates back to the Energy Policy Act of 2005, where Congress gave the Federal Energy Regulatory Commission authority to oversee the reliability of the bulk-power systems. The purpose was to ensure the reliable operation where an instability, uncontrolled separation, or cascading failures would not occur as a result of a sudden disturbance. There are two main metrics used to measure the reliability; the system average interruption duration index and the system average interruption frequency index. However, some jurisdictions consider storm related outages as extreme events, and thus, do not include them as inputs into the reliability metrics.

There have been several proposed resilience metrics, such as the resilience triangle and trapezoid. The resilience trapezoid is an extension of the resilience triangle. Unlike the triangle, which only considers the disturbance of a system, the trapezoid assesses the resilience through three phases: the disturbance, degradation, and the restorative state.

Another resilience approach is to take a control systems perspective. These approaches typically do not apply the metric directly to power systems. System resilience is shown by the notional disturbance and impact resilience evaluation (DIRE) curve in FIG. 1. A resilience threshold may be a maximum acceptable level of degradation to the system. This degradation level may be defined by a percentage of loss load in the system, ability to retain critical loads, etc. The performance level from optimal operation to the resilience threshold is defined by the system's adaptive capacity. The adaptive capacity can be defined as the ability of the system to adapt or transform from an impact event. An adaptive insufficiency may be considered the inability of the system to adapt or transform from an impact, indicating an unacceptable performance loss due to the given disturbance.

Assessing a system's resilience may include determining whether the system is known to be near an operation boundary condition. This provides information about how well the system can stretch in response to a future disturbance. A resilience metric may be used to evaluate the design of modern distribution systems (MDSs). One such approach may be based on the adaptive capacity of a system, defined by an asset or aggregation of assets. The temporal adaptive capacity, or amount of flexibility or stretch, in the real and reactive power of the controllable assets may be demonstrated while also considering energy limitations. The resulting metric may be represented by a three-dimensional surface, referred to as a manifold that represents the maximum adaptive capacity in real and reactive power over time. The metric may be thought of as a mapping to the DIRE curve, indicating the maximum disturbance in amplitude and duration due to cyber or physical disturbances that can be withstood.

Resilience metrics may be developed as a design tool for MDS. The metric uses a neutral bias assumption to describe the adaptive capacity of the assets, which limits the ability to accurately model many assets. In addition, the metric does not lend itself well for use as a real-time operational metric. Therefore, embodiments disclosed herein may relate to a resilience metric to have a more accurate representation of the asset adaptive capacity. In addition, the disclosed resilience metric may be suitable to be used as a real-time operational tool. Therefore, the resilience metric disclosed herein may be utilized by control operators to make resilience-based decisions before, during, and after disturbances. By way of non-limiting example, the resilience metric disclosed herein may be used as the resilience condition 406 in the resilience-icon diagram 400 of FIG. 4A.

The current modernization of the electrical power system has presented a dramatic shift in the way power is generated and transmitted. It is moving from the traditional centralized generation to a more distributed power generation architecture. The MDS integrates information and operational technologies that monitor, communicate, and control assets in real-time. It is predicted that these systems will include a high penetration of controllable distributed assets in generation and storage, as well as controllable loads. Control of these assets have many purposes, including support of the voltage and frequency across the distribution network, economic benefits, and reliable utilization of interconnections such as power lines, transformers, and switches.

This evolving landscape has added a new layer of complexity to distribution systems, and presents many new technical challenges and opportunities for researchers. The modernization of the grid has a tremendous potential for increasing resilience but much work is still needed in how to accomplish it. In this context, researchers have suggested numerous resilience based improvements in areas including microgrids, circuit reconfiguration, improved dispatch and scheduling of resources, and flexible local resources, such as generation, load, and energy storage.

Stability of the distribution system may be defined in terms of voltage potential and frequency. Frequency stability involves balancing of the generation of real power, P, and the load demand. On the other hand, voltage stability involves the balancing of reactive power, Q, across the network due to different types of loading on the system. Therefore, a resilience metric should address both the real and reactive power to be extensible in distribution systems. The real and reactive power components define a systems apparent power, S in the complex S-plane where:

$$S(\theta) = \sqrt{P^2 + Q^2},$$

where the real power in relation to the apparent power is $$P(\theta) = S\cos(\theta)$$

and the reactive power is $$Q(\theta) = S\sin(\theta)$$

Here, $\theta$ is the angle measured from horizontal. In power systems this angle is often referred to as the power factor angle, given as $$\theta = \arctan\left(\frac{Q}{P}\right).$$

The angle $\theta$ is the measurement from 0 to $2\pi$. The left hand plane, $\pi/2 < \theta < 3\pi/4$, is where an asset acts as a sink absorbing power from the system.

The normalized maximum apparent power at power factor angle $\theta$ is depicted in the S-plane in FIG. 25. In FIG. 25 only quadrant I is shown, where real and reactive power are positive. The highlighted region is the domain or reachable output in real and reactive power. These principals may be used to define the domain of assets' power output used in an operational adaptive capacity metric.

Figure 26:
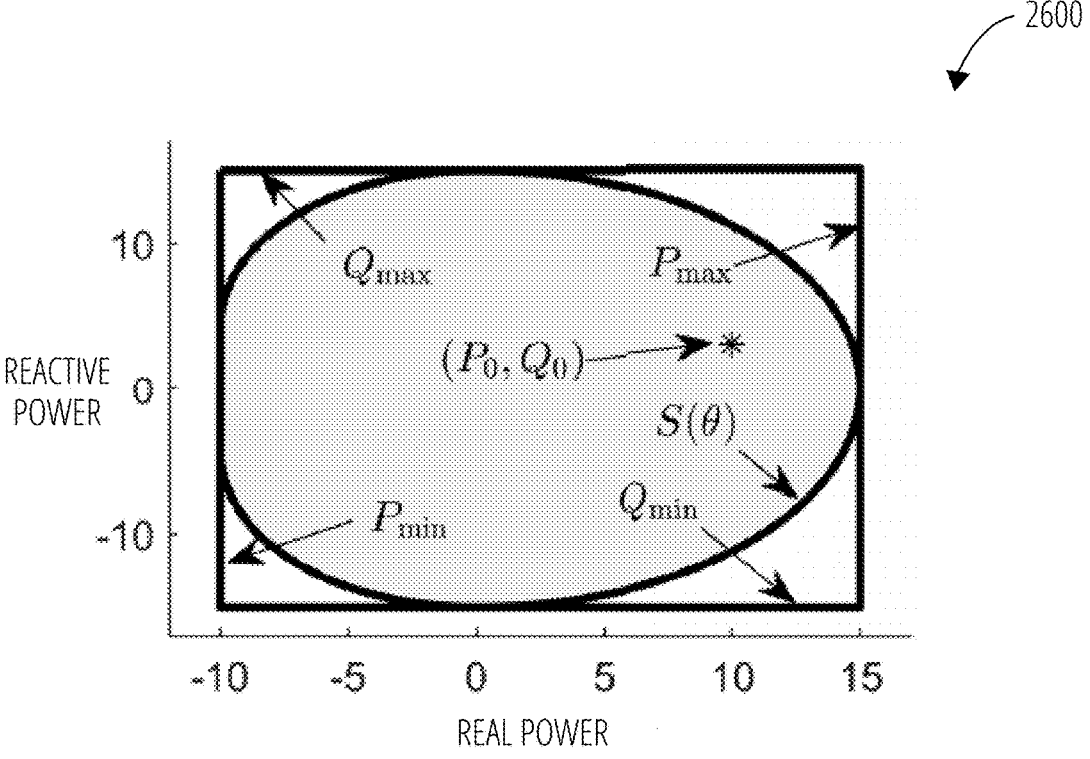
FIG. 26 is a plot illustrating a domain of an asset real and reactive power capability, according to some embodiments.

FIG. 26 is a plot 2600 illustrating a domain of an asset real and reactive power capability, according to some embodiments. A mathematical background to calculate the operational adaptive capacity resilience metric follows. The operational adaptive capacity resilience metric is based, at least in part, on the adaptive capacity of the assets, which is a measure of their control ability to move from the current operating point in both real and reactive power over time. Assets may be described by a set of operational characteristics that include the nameplate rated capacity, energy capacity, latency, and rate of change limitations. Using these characteristics, the general process to calculate the adaptive capacity is as follows: determine the control domain of the real and reactive power, determine the flexibility from the current operating point, account for latency and ramp rates, and impose energy constraints.

The real and reactive power domain, or capability of the asset, are denoted $P\in$ and $Q\in$, respectively. The assets' nameplate capacity defines the real power maximum, $P_{max}$, and minimum, $P_{min}$, as well as the reactive power maximum, $Q_{max}$, and minimum, $Q_{min}$. Thus, the first limit placed on the domain of the real power is $$P_{min} \leq P \leq P_{max},$$

and the reactive power is $$Q_{min} \leq Q \leq Q_{max}.$$

The maximum is assumed to be in the positive plane and the minimum in the negative plane, given mathematically for the real power $$P_{min} \leq 0 \leq P_{max},$$

and for the reactive power $$Q_{min} \leq 0 \leq Q_{max}.$$

These values are then used to determine the bounding constraints of the asset in the complex S-plane, given as $$S(\theta) \leq \left(P^2 + Q^2\right)^{\frac{1}{2}}.$$

The real and reactive power are functions of the power factor angle and may depend on the maximum power in each quadrant of the S-plane. The calculation for the apparent power constraint for quadrant I to quadrant IV is then given respectively as $$S(\theta)_{0 \leq \theta \leq \frac{\pi}{2}} \leq \left(P_{max}^2 \cos(\theta) + Q_{max}^2 \sin(\theta)\right)^{\frac{1}{2}}$$

$$S(\theta)_{\frac{\pi}{2} \leq \theta \leq \pi} \leq \left(P_{min}^2 \cos(\theta) + Q_{max}^2 \sin(\theta)\right)^{\frac{1}{2}}$$

$$S(\theta)_{\pi \leq \theta \leq \frac{3\pi}{2}} \leq \left(P_{min}^2 \cos(\theta) + Q_{min}^2 \sin(\theta)\right)^{\frac{1}{2}}$$

$$S(\theta)_{\frac{3\pi}{2} \leq \theta \leq 2\pi} \leq \left(P_{max}^2 \cos(\theta) + Q_{min}^2 \sin(\theta)\right)^{\frac{1}{2}}.$$

Using the rated power and limits in the S-plane, the asset capability in the real and reactive power may be calculated. In the positive plane the minimum of the two constraints may define the boundary of the domain. In the negative plane, the absolute minimum of the two constraints may define the domain boundary. Therefore, the real power domain for quadrants I and IV, where the real power is positive, is given by $$P(\theta)_{\frac{3\pi}{2} \leq \theta \leq \frac{\pi}{2}} \leq \min\left[S\cos(\theta), \; P_{max}\right],$$

and the domain for quadrants II and III, where the real power is negative is $$P(\theta)_{\frac{\pi}{2} \leq \theta \leq \frac{3\pi}{2}} \geq -\min\left[|S\cos(\theta)|, \; |P_{min}|\right].$$

Similarly, the domain of reactive power in quadrants I and II is given by $$Q(\theta)_{0 \leq \theta \leq \pi} \leq \min\left[S\sin(\theta), \; Q_{max}\right],$$

and in quadrants III and IV are $$Q(\theta)_{\pi \leq \theta \leq 2\pi} \geq -\min\left[|S\sin(\theta)|, \; |Q_{min}|\right].$$

Using the real and reactive power domain in the positive and negative quadrants, the union of the two gives the overall domain. For real power this is given as $$P_{\in}(\theta) = \left\{P \mid \frac{3\pi}{2} \leq \theta \leq \frac{\pi}{2}\right\} \cup \left\{P \mid \frac{\pi}{2} \leq \theta \leq \frac{3\pi}{2}\right\},$$

and similarly for the reactive power $$Q_{\in}(\theta) = \{Q \mid 0 < \theta \geq \pi\} \cup \{Q \mid \pi \leq \theta \leq 2\pi\}.$$

The domain of the asset real and reactive power capability is depicted by the shaded region in FIG. 26. It should be noted that some assets, such as solar, wind, and hydro, should not be considered to have constant rated limits and the domain may need to be updated. For example, solar generation may depend on real-time solar irradiation and therefore should be updated as solar conditions change. The power flexibility may be calculated using the operational power output.

Figures 27, 28:
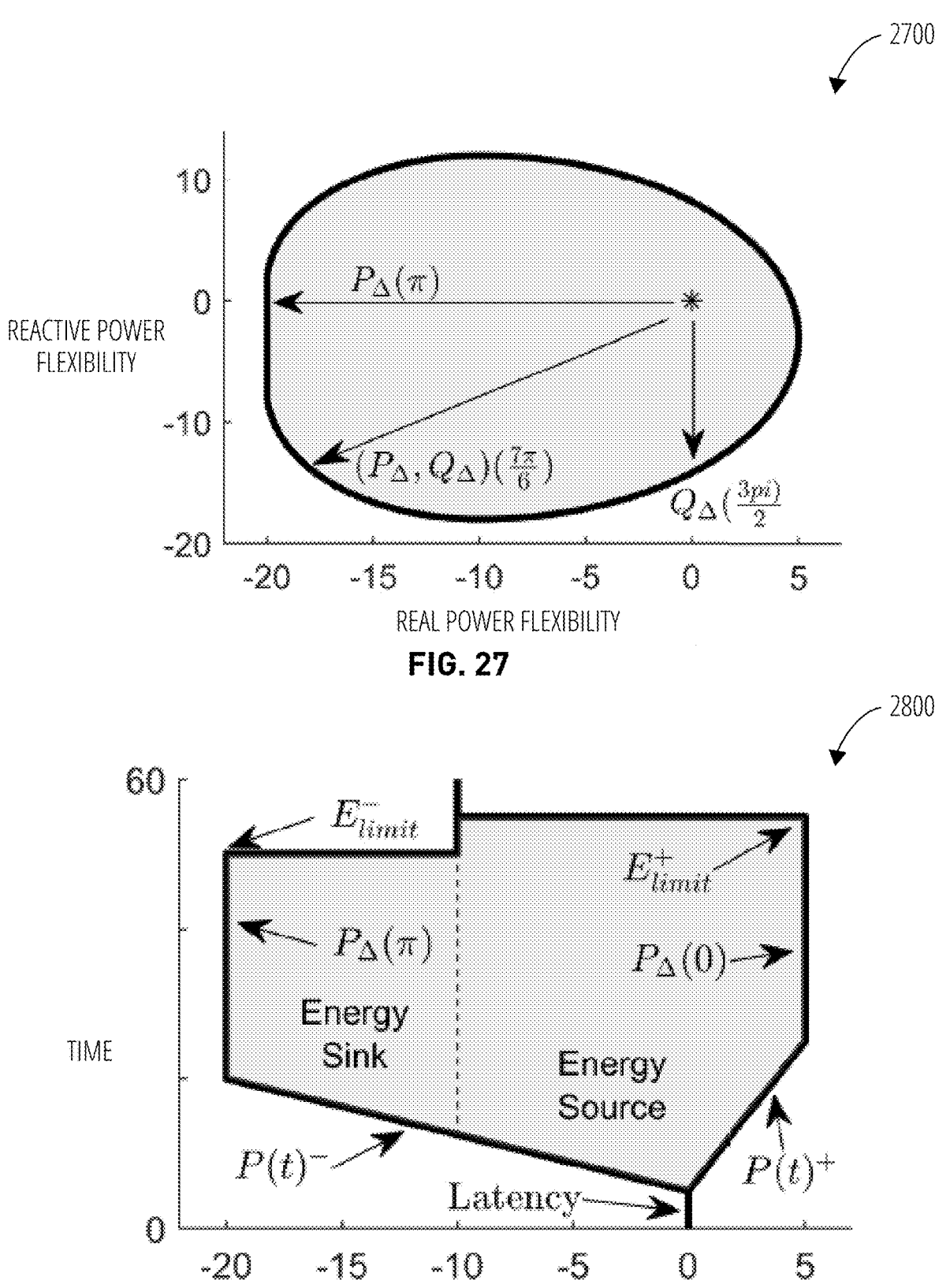
FIG. 27 is a plot illustrating an example of an asset's real and reactive power flexibility from its current operating point.
FIG. 28 is a plot illustrating an example of temporal flexibility from the operating point that considers latency, ramp rates, and energy limits.

FIG. 27 is a plot 2700 illustrating an example of an asset's real and reactive power flexibility from its current operating point.

FIG. 28 is a plot 2800 illustrating an example of temporal flexibility from the operating point that considers latency, ramp rates, and energy limits. The amount of flexibility an asset has in the real and reactive power from the operating point is denoted as $P_\Delta$ and $Q_\Delta$, respectively. This flexibility may be calculated using the real and reactive power domain of the asset and the current operation point of the asset, $P_0$ and $Q_0$. Thus, the amount of flexibility an asset has is a transformation of the power domain around the operating point, given as $$P_\Delta(\theta) = P_\varepsilon - P_0,$$

and the flexibility of the reactive power is a similar transformation using the reactive power domain and the current operating point $$Q_\Delta(\theta) = Q_\varepsilon - Q_0.$$

$\theta$ is the angle measured from the operating point. The resulting flexibility is depicted in FIG. 27. However, the temporal characteristics of the asset, shown in FIG. 28, should be accounted for and are developed below.

The latency of an asset is the time delay before changes to the power output can be made. The latency may include multiple factors including starting latency or a control latency. Starting latency is a property of the asset. By way of non-limiting example, a diesel generator may not supply power right when turned on. Control latency is the time between data being received, adjustments made to the output power, computationally or by an operator, to the time the control command is received by an asset. All latencies to be aggregated into a single latency variable, $\lambda$.

The ramp rate defines how quickly an asset may ramp up or down, after the latency, from the current operating position over time, t. The real power output when ramping up is given as $$P(t)^+ = \begin{cases} 0, & \text{if } t \le \lambda \\ \dfrac{dP^+}{dt}(t-\lambda) & \text{if } t > \lambda \end{cases},$$

and when ramping down is given by $$P(t)^- = \begin{cases} 0, & \text{if } t \le \lambda \\ \dfrac{dP^-}{dt}(t-\lambda) & \text{if } t > \lambda \end{cases}.$$

Similarly, the reactive power is given as $$Q(t)^+ = \begin{cases} 0, & \text{if } t \le \lambda \\ \dfrac{dQ^+}{dt}(t-\lambda) & \text{if } t > \lambda \end{cases},$$

when ramping up, and $$Q(t)^- = \begin{cases} 0, & \text{if } t \le \lambda \\ \dfrac{dQ^-}{dt}(t-\lambda) & \text{if } t > \lambda \end{cases}$$

when ramping down. The latency and ramp rate constraints are depicted by the temporal flexibility in real power shown in the bottom plot in FIG. 28. The shaded region of FIG. 28 represents the real power domain and the bounds are defined by the latency and ramp rates from the operation point, the maximum flexibility, and energy constraints. The energy constraint of the asset is discussed below.

It is possible for assets to be constrained with energy limitations in the amount of real power when acting as a source providing power, or as a sink absorbing power. In the case of battery storage, it is constrained on both ends where it has an initial energy of $E_0$, and may only be charged (sink) to 100%, or $E_{max}$, and may only output power (source) until it is fully drained at 0%, or $E_{min}$. The energy of the system changes as $$E(t) = E_0 + \int_{t=0}^{t} P(t) * dt,$$

where P(t) is the operating real power over time. When an asset runs out of energy or the ability to absorb energy, the real power may go to zero.

Figure 29:
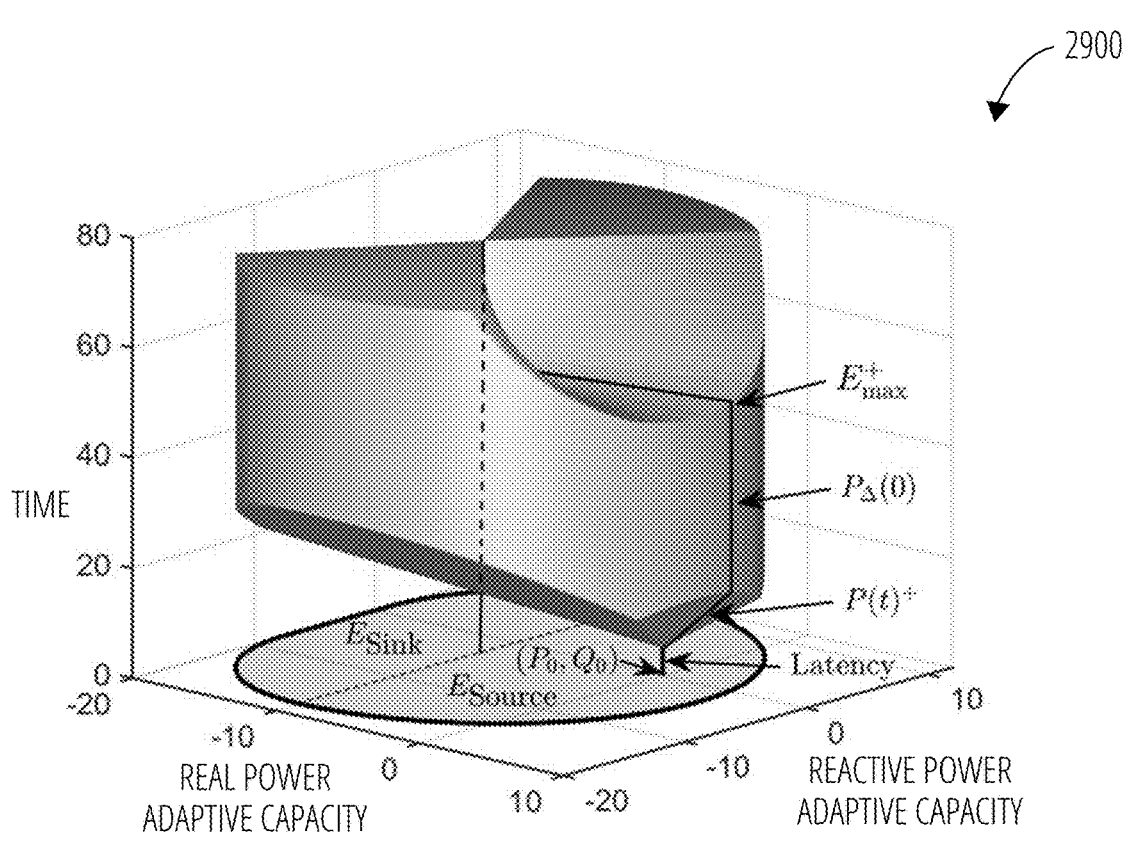
FIG. 29 is a three-dimensional plot illustrating an example of an asset's adaptive capacity manifold that represents the maximum change in real and reactive power from current operation over time.

FIG. 29 is a three-dimensional plot illustrating an example of an asset's adaptive capacity manifold 2900 that represents the maximum change in real and reactive power from current operation over time. The adaptive capacity of the asset is the bounded region between the flexibility and the temporal constraints in the positive and negative planes with respect to the operating point. The real power in the positive plane is given as $$P_{AC}(\theta, t) = \min[P(t)^+, P_\Delta(\theta)],$$
$$\tfrac{3\pi}{2} \le \theta \le \tfrac{\pi}{2}$$

and in the negative plane as $$P_{AC}(\theta, t) = -\min[|P(t)^-|, |P_\Delta(\theta)|].$$
$$\tfrac{\pi}{2} \le \theta \le \tfrac{3\pi}{2}$$

The reactive power is given $$Q_{AC}(\theta, t) = \min[Q(t)^+, Q_\Delta(\theta)]$$
$$0 \le \theta \le \pi$$

in the positive plane, and $$Q_{AC}(\theta, t) = -\min[|Q(t)^-|, |Q_\Delta(\theta)|].$$
$$\pi \le \theta \le 2\pi$$

in the negative plane. The resulting adaptive capacity using the ongoing example in this section is depicted by the manifold in FIG. 29. The manifold surface represents the maximum change the asset may make in real and reactive power, from the current operating point, over time. Recall that the x/y axis represent the adaptive capacity from the operating power. Therefore, when the energy limit has been reached the output power goes to zero, which is indicated by the dashed line separating where the asset transitions between a sink and a source.

It is expected that the MDS will include a collection of distributed assets. The adaptive capacity may be an aggregation of local assets, such as a microgrid. The aggregation of assets determines the adaptive capacity of the controllable assets in the microgrid including the network connection. The aggregation in terms of real power is $$P_{AC}(\theta, t) = \sum_{k=1}^{n} P_{AC_k},$$

and the reactive power is given by $$Q_{AC}(\theta, t) = \sum_{k=1}^{n} Q_{AC_k},$$

where n represents the total number of assets. This metric may be utilized as an operational metric.

Power distribution is a real-time system. Therefore a resilience metric should reflect the real-time operation and conditions on the system. In this context, Algorithm 1 updates the adaptive capacity using threshold triggers in power outputs, energy changes, and environmental conditions, which are denoted as "C". Relevant environmental conditions depend on the assets in the system but may include factors such as solar irradiation, wind velocity, head pressure, etc. The operational metric is outlined by Algorithm 1, an example of which is shown below.

---

Algorithm 1: Real-Time Adaptive Capacity Algorithm

---

Input : System assets, Real-time system data
Output: Assets adaptive capacity
1 begin
2 |   Initialize $P_\epsilon$, $Q_\epsilon$ -continued Algorithm 1: Real-Time Adaptive Capacity Algorithm

```
 3  |  while system running
 4  |  |  P_δ = |P_{0n-1} - P_{0n}|
 5  |  |  Q_δ = |Q_{0n-1} - Q_{0n}|
 6  |  |  E_δ = |E_{0n-1} - E_{0n}|
 7  |  |  C_δ = |C_{0n-1} - C_{0n}|
 8  |  |  if any δ > threshold
 9  |  |  |  Update P_ε, Q_ε
10  |  |  |  Update P_Δ, Q_Δ
11  |  |  |  for time = 0 to t_{end}
12  |  |  |  |  Update P(t), Q(t)
13  |  |  |  |  Update E(t)
14  |  |  |  |  for θ = 0 to 2π
15  |  |  |  |  |  Solve P_{AC}(θ, t)
16  |  |  |  |  |  Solve Q_{AC}(θ, t)
17  |  |  |  |  end
18  |  |  |  end
19  |  |  end
20  |  |  for k = 1 to n
21  |  |  |  ΣP_{AC_k}(θ, t)
22  |  |  |  ΣQ_{AC_k}(θ, t)
23  |  |  end
24  |  end
25  end
```

Figure 30:
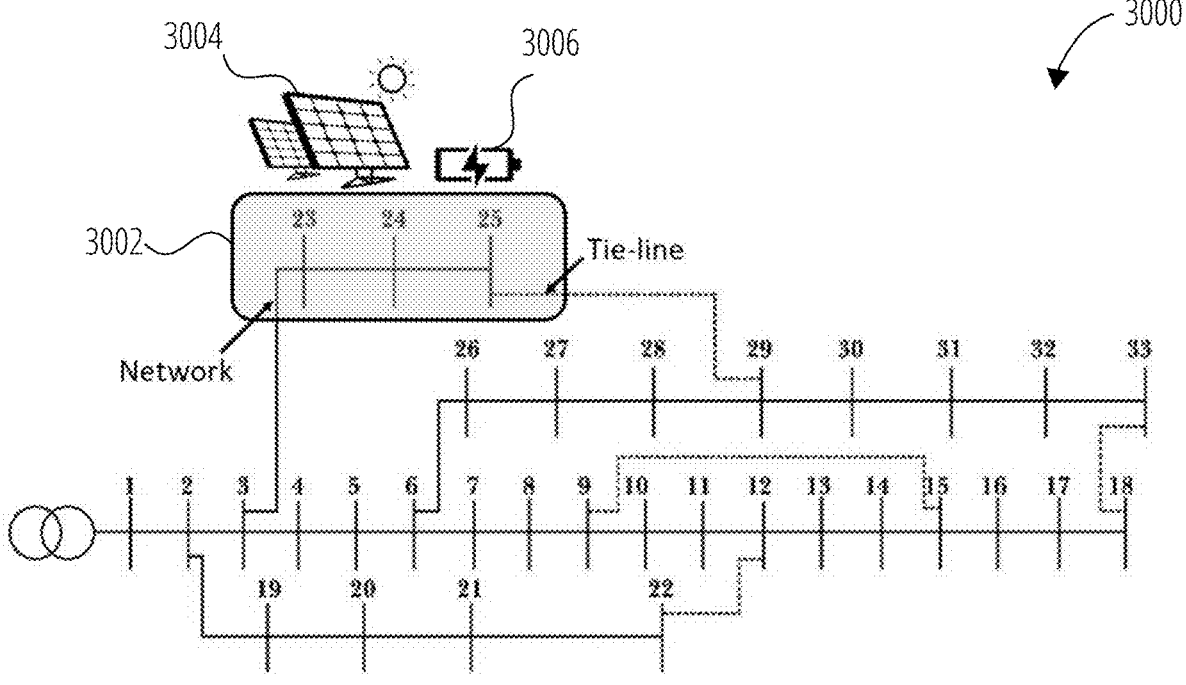
FIG. 30 is an example of an IEEE-33 bus distributed system.

FIG. 30 is an example of an IEEE-33 bus distributed system 3000. The adaptive capacity resilience metric disclosed herein may be demonstrated using the modified IEEE-33 bus distributed system 3000. A selected portion 3002, or microgrid, of the IEEE-33 bus distributed system 3000 may be used to demonstrate in a case study the resilience of the system under two different scenarios. The first scenario represents the IEEE-33 bus distributed system 3000 under normal operation and the second scenario corresponds the network line experiences an outage.

The original IEEE model was designed as a radial network configuration. However, many studies have adapted the model to include tie-lines, thus, resembling a MDS meshed network, shown in FIG. 30. The section of the IEEE-33 bus distributed system 3000 used for this study has been highlighted and additional solar 3004 and battery storage 3006 assets have been added. The capacity limitations on the power line conductor for the network is given as 1,050 KW and 1,050 kVAR, and the tie-line limits are 500 kW and 500 kVAR for real and reactive power, respectively. Loading on buses 23-25 for the real power is 90, 420, and 420 kW, and the reactive power is 50, 200, and 200 kVAR, respectively.

To resemble a MDS, solar 3004 generation and battery storage 3006 asset have been added to the model. Their limits are based on a high penetration of DERs. The maximum power is 30% of the maximum load that can be supplied by the network conductor, 315 kW. The battery storage 3006 is assumed to have a total capacity of 1,260 kWh. In other words, the batter battery storage 3006 under its max output (315 kW) would go from fully charged to empty in four hours. The asset operational characteristics are given in Table 8.

TABLE 8

Assets Power Parameters

| | Limits | | | | Case I | | Case II | |
|---|---|---|---|---|---|---|---|---|
| | $P_{max}$ | $P_{min}$ | $Q_{max}$ | $Q_{min}$ | $P_0$ | $Q_0$ | $P_0$ | $Q_0$ |
| Network | 1,050 | −1,050 | 1,050 | −1,050 | 930 | 450 | 0 | 0 |
| Tie-line | 500 | −500 | 500 | −500 | 0 | 0 | 450 | 217 |

TABLE 8-continued

Assets Power Parameters

| | Limits | | | | Case I | | Case II | |
|---|---|---|---|---|---|---|---|---|
| | $P_{max}$ | $P_{min}$ | $Q_{max}$ | $Q_{min}$ | $P_0$ | $Q_0$ | $P_0$ | $Q_0$ |
| Solar PV | 315 | 0 | 315 | −315 | 315 | 0 | 283 | 137 |
| Battery | 315 | −315 | 315 | −315 | −315 | 0 | 197 | 96 |

Two scenarios are considered to demonstrate the difference in adaptive capacity of the system assets acting as a microgrid. The first scenario is under what may be considered normal operation and the second scenario is when network connection has been lost, such as a storm outage or potentially a cyberattack, where the attacker forces a breaker open. For these cases, the loading conditions on the system are assumed to be constant and the assets' operational power output for both cases is given in Table 8.

Figure 31:
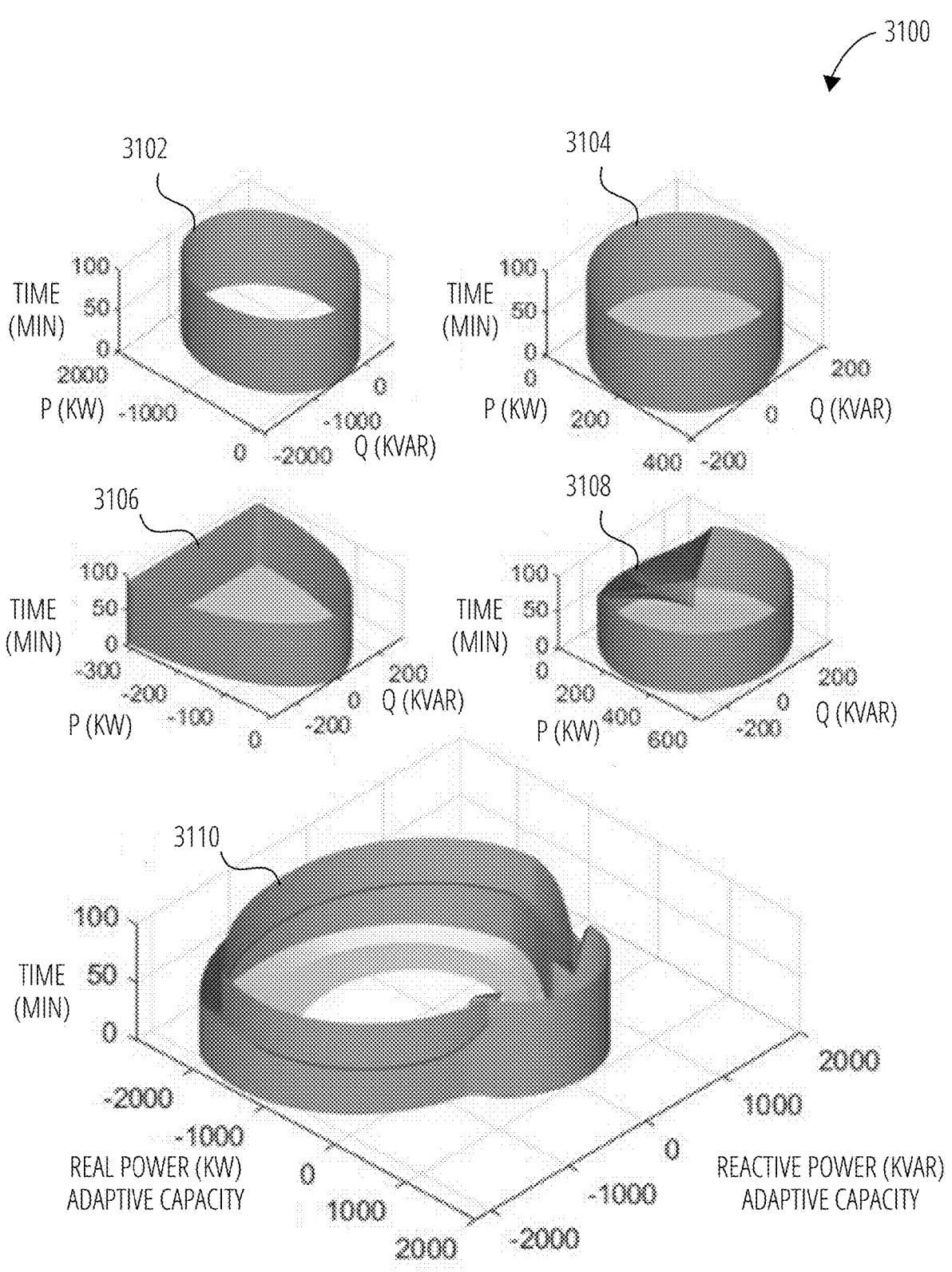
FIG. 31 illustrates examples of three-dimensional plots of adaptive capacities of assets of the IEEE-33 bus distributed system of FIG. 30 under normal conditions.

FIG. 31 illustrates examples of three-dimensional plots of adaptive capacities 3100 of assets of the IEEE-33 bus distributed system 3000 of FIG. 30 under normal conditions. The adaptive capacities 3100 include a network connection adaptive capacity 3102, a tie-line connection active capacity 3104, a solar generation active capacity 3106, a battery storage active capacity 3108, and an aggregated active capacity 3110 corresponding to an aggregation of the assets.

Under normal operation the load is fully supplied by the network and the solar generation is therefore being used to charge the battery storage asset, which is currently assumed to be at 75% of capacity. The temporal flexibility of the assets' real and reactive power in the positive and negative direction is shown in the top plot of FIG. 33.

Figure 32:
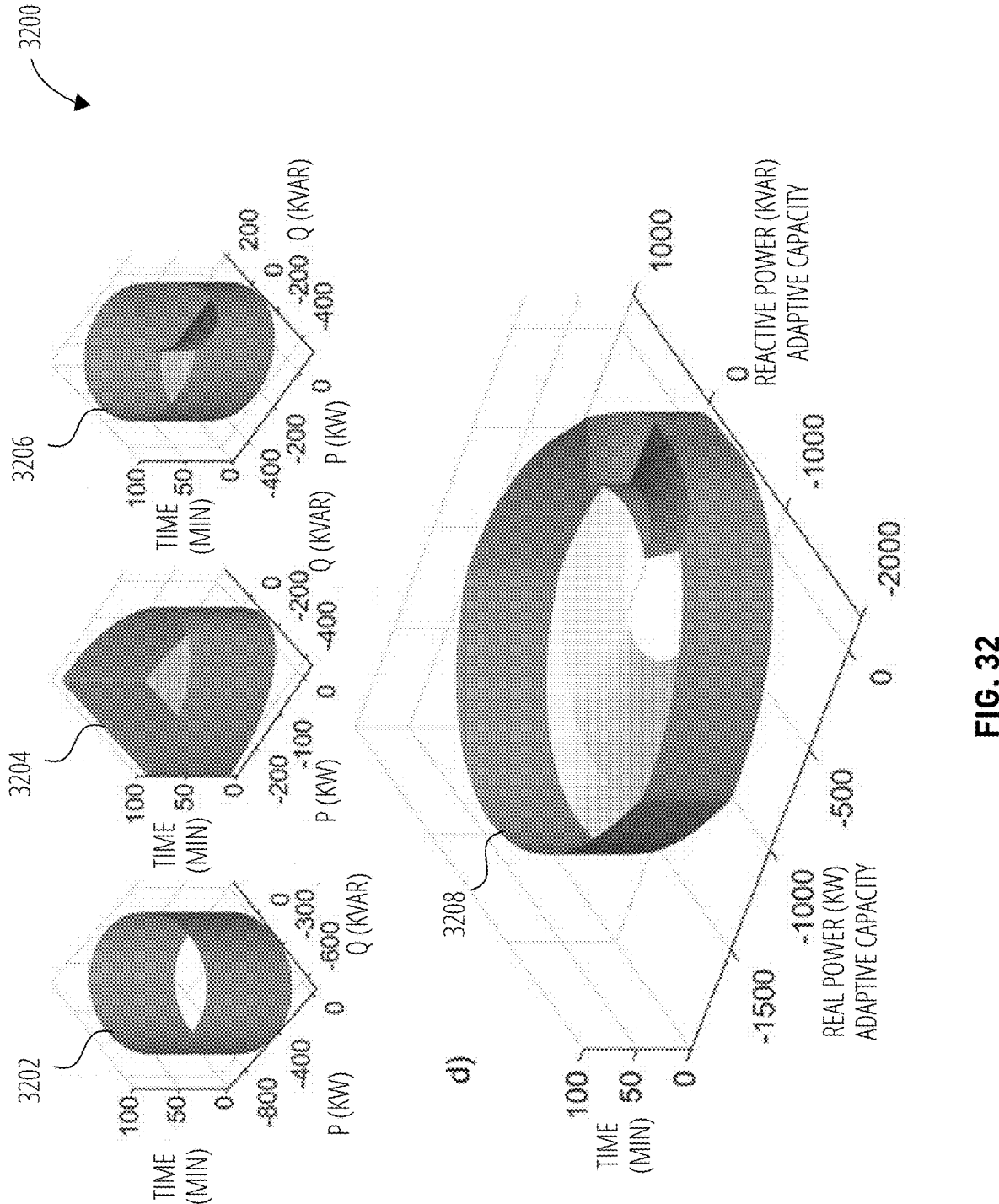
FIG. 32 illustrates examples of three-dimensional plots of adaptive capacities of assets of the IEEE-33 bus distributed system of FIG. 30 when a network connection is lost.

FIG. 32 illustrates examples of three-dimensional plots of adaptive capacities 3200 of assets of the IEEE-33 bus distributed system 3000 of FIG. 30 when a network connection is lost. The adaptive capacities 3200 include a tie-line connection adaptive capacity 3202, a solar generation active capacity 3204, a battery storage active capacity 3206, and an aggregation active capacity 3208 corresponding to an aggregation of the assets.

The second case considered a loss of the network connection with reconfiguration where the tie-line is being used to supply power. However, based on its limiting characteristics, it cannot fully support the high loading conditions. In this situation, the solar asset is supplying power at its full capacity and the battery storage is able to supply the reaming load. In this case, it is assumed that the battery has 197 kWh of stored energy, and therefore may maintain its output of 197 kW for one hour. The temporal flexibility in real and reactive power is shown in the bottom plot of FIG. 33.

Figure 33:
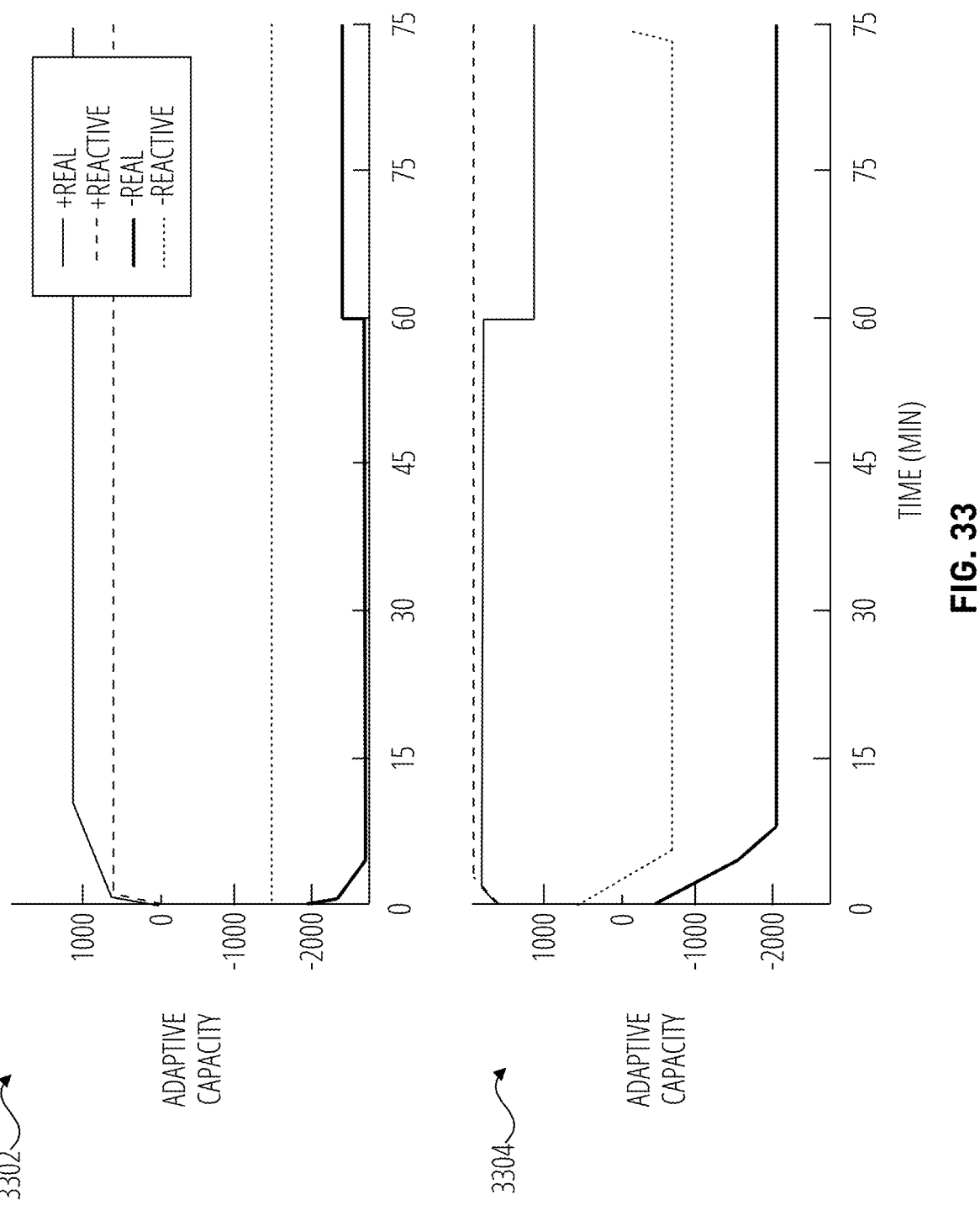
FIG. 33 illustrates examples of normal operation adaptive capacities and network loss adaptive capacities for the IEEE-33 bus distributed system 3000 of FIG. 30.

FIG. 33 illustrates examples of normal operation adaptive capacities 3302 and network loss adaptive capacities 3304 for the IEEE-33 bus distributed system 3000 of FIG. 30. FIG. 33 illustrates flexibility at power factor angles in the direction of real (+real and −real) (kW) and reactive (+reactive and −reactive) (kVAR) power.

Results of the case study bring to light a few concepts in reliability and resilience of power systems. For example, even when the network was lost the system is reliable, as no load needed to be shed. However, when evaluating the systems using the proposed adaptive capacity metric there is a quantifiable impact to the resilience of the system. This is visible by examining the difference in manifolds and easy to distinguish by inspection of FIG. 33. The top plot (normal operation adaptive capacities 3302) shows that there is adaptive capacity in the real and reactive power in all directions, but is most "constrained" by the real (1,149 kW) and reactive (627 kVAR) power in the positive direction. In the case of losing network connection this constraint becomes 113 kW and 171 kVAR. Therefore, the ability to adapt to a future disturbance has been dramatically reduced. In fact, the system may lose capability to supply the real power necessary in one hour when the battery storage runs out of energy. This may result in a loss of the ability to maintain the frequency of the system if loads are not shed.

Disclosed herein is a resilience metric based on adaptive capacity for modern distribution systems that have a high penetration of distributed resources. The proposed metric provides insight to the ability to control aggregated assets in terms of real and reactive power over time. The metric may be used to analyze a microgrid under different scenarios, such as a loss of network connection, without limitation. The metric is demonstrated, indicating the distributed resources may maintain the loads when the connection is lost; however, the system's adaptive capacity is greatly reduced, having very little capability to support stability of voltage and frequency if further disruptions occur.

Future work with respect to improvements to the adaptive capacity metric include replacing the linear ramp rates with non-linear rates. Similarly, the real and reactive bounds in certain assets that are not constant, may be replaced by a function or table to provide better accuracy in the metric. For example, the ramp rate of a hydro generator may not be constant but may depend on the head pressure. Additionally, the maximum power may also depend on the pressure and may be reflected in the metric.

Figure 34:
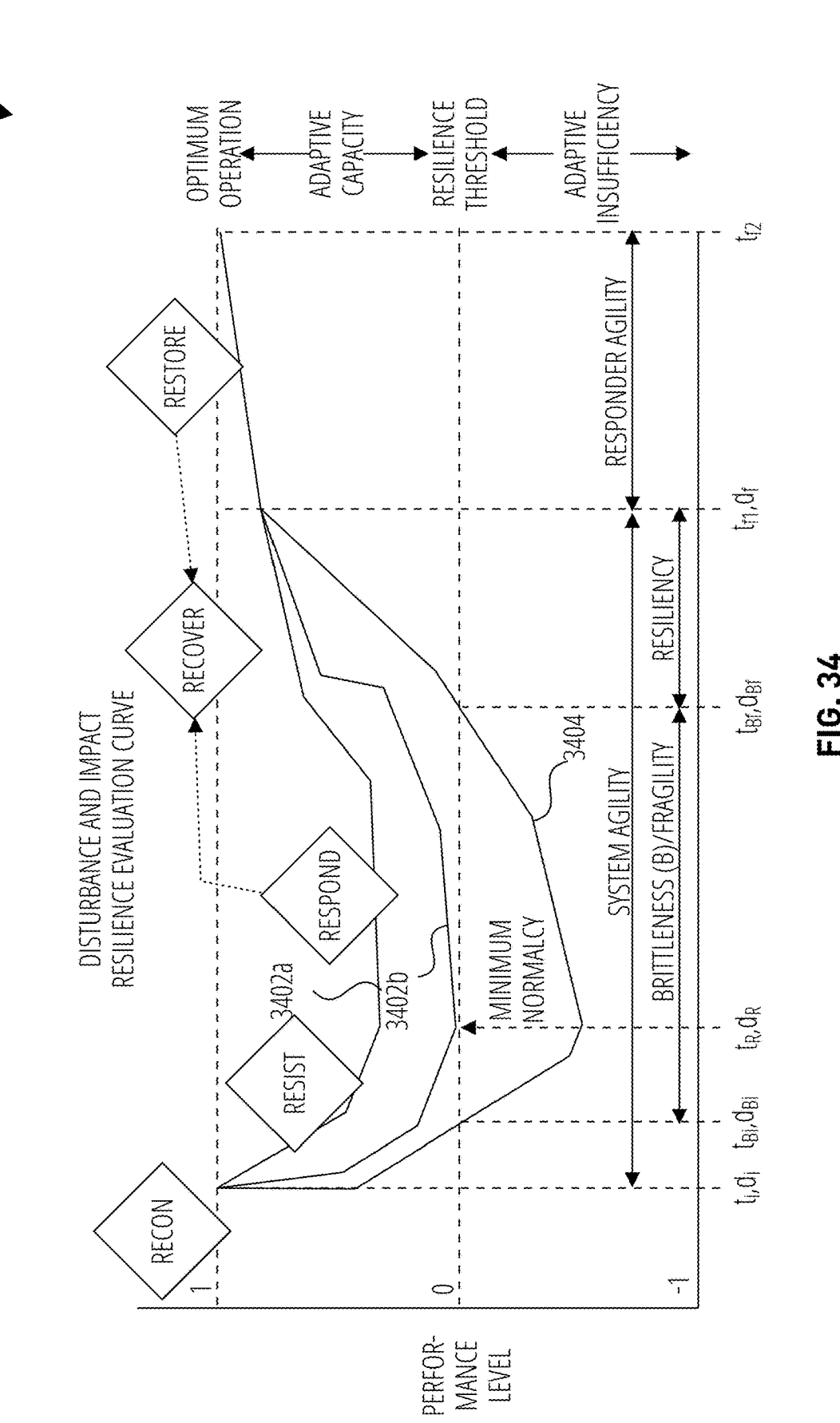
FIG. 34 is a plot illustrating a disturbance and impact resilience evaluation curve, according to some embodiments.

FIG. 34 is a plot illustrating a disturbance and impact resilience evaluation curve 3400, according to some embodiments. The disturbance and impact resilience evaluation curve 3400 includes resilient system plots 3402a and 3402b, an un-resilient system plot 3404, and epochs of resilience including recon, resist, respond, recover, and restore. Motivated by decreased cost and climate change concerns, the penetration of solar photovoltaic (PV) energy generation and battery energy storage has been continually increasing. The variability in solar PV power generation has led to many new challenges for utilities and researchers. One challenge is the quantification of the resilience contribution to the grid from its assets.

A framework for evaluating the resilience contribution of solar generation and battery storage assets on the grid is disclosed herein. A metric provides a quantifiable adaptive capacity measure in terms of real and reactive power and includes uncertainty for solar PV assets. A case study using very short-term and short-term solar generation forecast demonstrates the framework and provides useful insight to the resilience solar and battery storage assets may contribute to the grid.

The electrical power system is the most vital component of our nation's critical infrastructure. Modern society has become increasingly dependent on its ability to supply electrical power without interruption. Historically, reliability metrics have been adopted to ensure its continuous operation. However, there has been an increasing amount of distributed resources that provide intermittent and uncertain amounts of power generation. This has presented utilities and researchers with new challenges.

Reliability metrics have not adequately prepared the electric grid for component failures during extreme events such as hurricanes, winter storms, flooding, and wildfires. In the U.S. between 2003 and 2012 extreme weather events caused an estimated 679 power outages that affected at least 50,000 customers. Additionally, there has been an increasing frequency and intensity of these events due to climate change. The cost of weather related outages may be between substantially $25 and $70 billion annually. Furthermore, prolonged power outages put the public safety at risk. Data indicates that the 2003 blackout in New York resulted in approximately 90 deaths. In order to curb climate change, global action has been taken to reduce the amount of carbon emissions. In power generation, this has resulted in an increasing penetration of renewable sources like solar PV and wind power generation.

The increasing presence of renewable generation on the power system may have been spurred by climate change concerns. However, the dramatic reduction in investment have made it cost competitive with traditional resources. In early 2011, solar generation made up less than 0.1% of the U.S. generation supply at just 3 gigawatts. By 2017 this number had grown to over 47 gigawatts. From 2010 to 2017, the adjusted cost for solar PV installed kilowatt-hour (kWh) dropped from $0.52 to $0.16 for residential, from $0.40 to $0.11 for commercial, and from $0.28 to $0.06 for utility scale generation. The Solar Energy Technologies Office set a 2030 goal for a further 50% reduction to $0.03 per kWh. Achieving this goal would make solar one of the cheapest sources of electricity generation and push further expansion of solar PV installation.

Integrating large amounts of variable and uncertain solar PV generation onto the electric grid is a growing concern. Power system operators accommodate for variability in system load and solar PV generation through systems of reserve power that adjust output levels in dispatchable plants. In this context, the notional measure of resilience is how near a system is to its boundary. In other words, how much reserve power the system has available. Thus, resilience in this context is a measure of the adaptive capacity of the system. In power systems, a resilience metric methodology based on assets aggregated adaptive capacity, in terms of real and reactive power, to quantify the system resilience looking forward in time may be used. The metric may be extended to an operational metric with the ability to capture asymmetric assets, such as solar generation. The adaptive capacity of real and reactive power is of interest because it may be used to maintain stability in both frequency and voltage. To maintain frequency, the balance of real power generation needs to meet demand, and the balancing of reactive power is needed to maintain voltage.

Proposed herein is a metric based on the adaptive capacity to evaluate the resilience contribution that solar PV generation and battery storage add to the grid. The uncertainty of solar PV assets and its effect on the contribution it provides to the adaptive capacity of the grid may be captured by this metric.

Resilience may be associated with the ability to anticipate a possible disaster, adopt effective measures to reduce losses or failures, and restore quickly. This is captured by the five "R's" of resilience; recon, resist, respond, recover, and restore, by the Disturbance and Impact Resilience Evaluation (DIRE) curve, shown in FIG. 34.

It can be seen that resilience is neither a short-term or long-term property. It encompasses time frames prior to the impact of the disturbance through the return to normalcy. The reconnaissance phase requires the system to understand the state and forecast potential threats. System operators may focus on optimal economic efficiency rather than considering the response to an unexpected disturbance. However, some disturbances may be forecast and operators may consider valuing resilience of the system as well as economic efficiency. Resist is the phase which tends to be a measure of the inertial components of the system, such as spinning synchronous machines of generators and large motors. In general, the resist phase is of short duration. Assets that contribute to the resist phase slow the disturbance as opposed to devices that require measurements and control decisions in the respond phase through a control feedback loop. The respond phase includes assets that provide real and reactive power as well as reconfiguration of the network to bring power back online to customers. Restore requires line crews to fix physical damage to the system and bring it to the pre disturbance level.

A resilience threshold may be a maximum acceptable level of degradation of the system. There are numerous metrics that can be used to quantify resilience, such as demand not served and maximum number of customers out of service. These metrics do a relatively good job at describing power system resilience; however, they do not capture the contribution from individual assets. Additionally, they look back in time and quantify resilience as the result of an event. Therefore, they do not give an operational perspective on resilience.

The output of solar PV generation is variable due to the sun changing position throughout the day and seasons. This regularly leads to a 10% change in generation over 15 minutes. However, meteorological phenomena such as moving cloud cover, contribute to uncertainty in the generation and may cause rapid changes in power output. The size of the PV system, cloud speed, cloud height, and others factors influence the rate of change in power generation output. Different approaches for forecasting solar irradiance and PV generation may be broadly classified into four approaches; statistical based on historical measured data, artificial intelligence or machine learning such as neural networks, physics based numerical weather prediction models or satellite images, and hybrid models.

The practical use of solar forecasting may be characterized at different time horizons. From the perspective of power system operation, very short-term (seconds to minutes) and short-term (up to 48-72 hours) forecasts are particularly useful for activities like real-time unit scheduling, storage control, automatic generation control, and electricity trading. Medium-term forecast considers week-long forecast and may be used for maintenance scheduling. Long-term forecast may be months or years and useful for solar PV plant planning. Very short-term and short-term time horizons that correlate to the respond and recover of the "R's" of resilience, recon, resist, respond, recover, and restore, are discussed below.

There are various evaluation indices to apply to forecasting accuracy. The commonly used indices include mean bias error, mean absolute error, mean square error, and root mean square error. These are all statistical formulas that may be used to measure the difference between the predicted forecast and measured data. Rather than analyze the accuracy of solar forecast generation, embodiments disclosed herein may demonstrate how the uncertainty correlates to resilience of solar PV assets.

Figure 35:
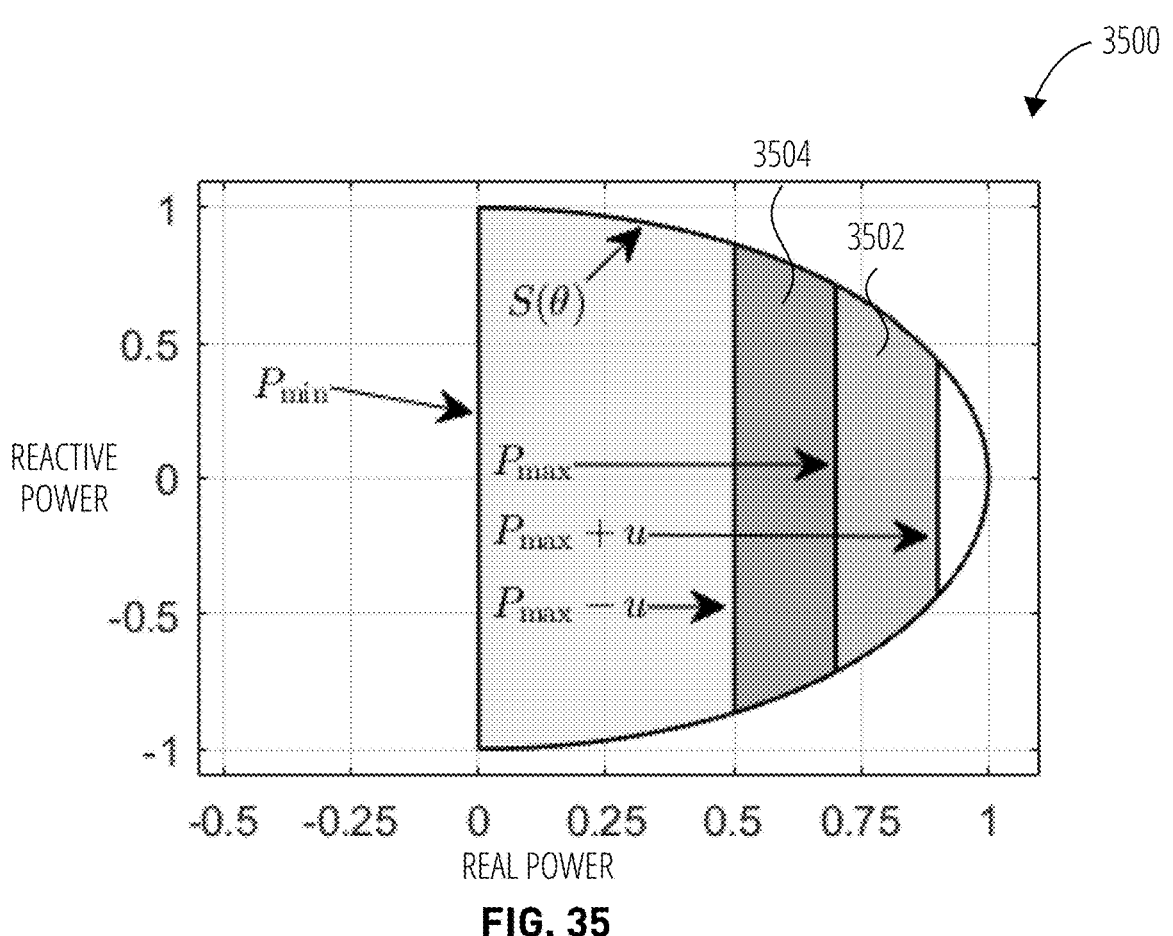
FIG. 35 is a plot illustrating a solar asset normalized power capability, according to some embodiments.

FIG. 35 is a plot illustrating a solar asset normalized power capability 3500, according to some embodiments. A resilience metric for solar and battery storage assets may be based on assets' adaptive capacities. The following operations may be taken to calculate the assets' adaptive capacities: determine the potential real and reactive power contribution, the flexibility from the operating point, consider temporal constraints, and then calculate the adaptive capacity.

The potential contribution in real and reactive power an asset has on the grid may be determined. The power output of an asset is constrained by the apparent power in the complex S-plane and the limiting power output in the positive and negative plane. The apparent power in the S-plane is given as $$S(\theta) = \sqrt{P^2 + Q^2},$$

where P and Q are the nameplate capacity in real and reactive power, respectively. The nameplate capacity depends on the real power plane. In the positive plane it is the nameplate capacity when the asset is a source. In the negative plane it is the nameplate capacity as a sink. As a non-limiting example, a battery is a sink at max charging. The real and reactive power components of the apparent power are given as $$P(\theta) = S \cos(\theta),$$

and $$Q(\theta) = S \sin(\theta),$$

respectively. The power contribution of assets are limited by the apparent power and the limit of real power. Therefore, the contribution limit of the asset is given as $$P(\theta) = \begin{cases} \min[P(\theta), P_{max}], & 0 \leq \theta \leq \dfrac{\pi}{2} \\ \min[P(\theta), P_{max}], & \dfrac{3\pi}{2} \leq \theta < 2\pi, \\ -\min[|P(\theta)|, |P_{min}|], & \dfrac{\pi}{2} < \theta < \dfrac{3\pi}{2} \end{cases}$$

where $P_{max}$ and $P_{min}$ are the maximum output as a source in the positive plane and the maximum output as a sink in the negative plane, respectively.

In the context of solar assets, which only contribute to the grid as a power source, the real power in the negative plane is zero, $P_{min}=0$. Additionally, solar assets don't have a constant real power contribution due to changes in solar intensity. This results in an uncertainty, u, in the maximum real power generation. Therefore, the contribution of real power from solar assets is limited by $$P(\theta)_{Solar} = \begin{cases} \min[P(\theta), P_{max} \pm u], & 0 \leq \theta \leq \dfrac{\pi}{2} \\ \min[P(\theta), P_{max} \pm u], & \dfrac{3\pi}{2} \leq \theta < 2\pi. \\ 0, & \dfrac{\pi}{2} < \theta < \dfrac{3\pi}{2} \end{cases}$$

The resulting output bounds of a solar asset is shown notionally by the normalized output in FIG. 35. The bounding constraints on the output $S(\theta)$, $P_{min}$, and $P_{max} \pm u$ may be seen in FIG. 35. The green region represents the positive uncertainty 3502, the red region is the negative uncertainty 3504, and the line between them is the maximum real power output, which is consider the forecasted output.

Figure 36:
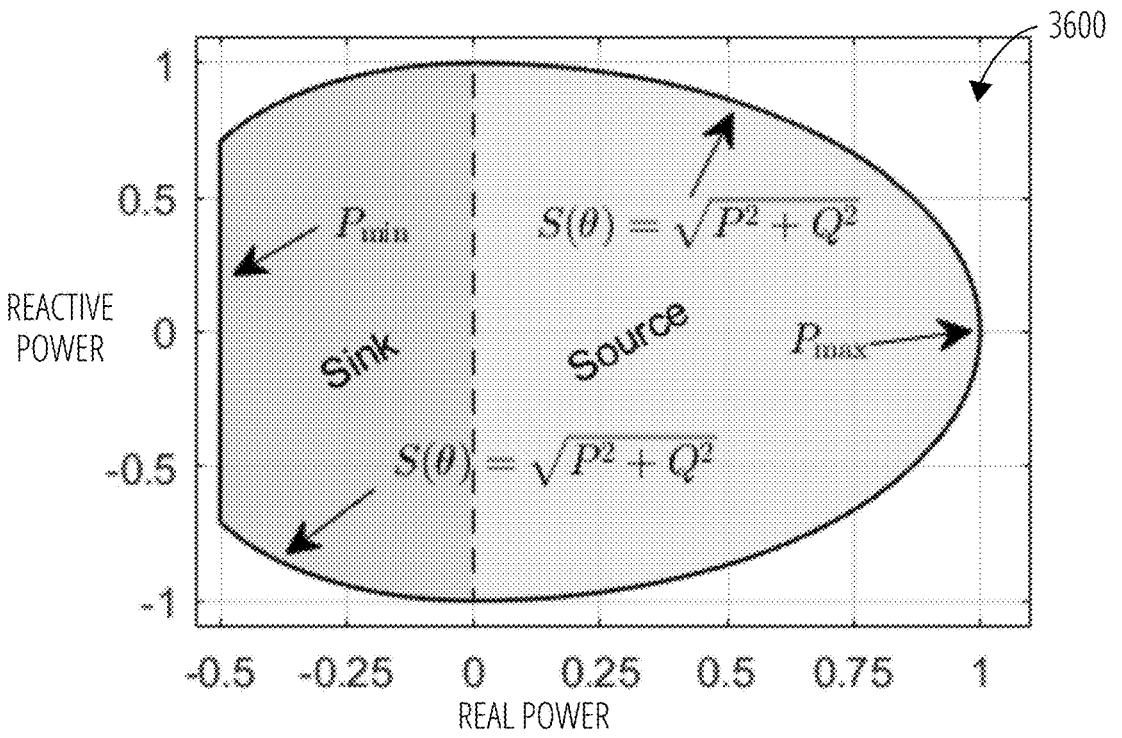
FIG. 36 is a plot illustrating a battery asset normalized power capability, according to some embodiments.

FIG. 36 is a plot illustrating a battery asset normalized power capability 3600, according to some embodiments. Battery storage assets may operate in both the positive and negative plane as a source and a sink. However, their nameplate capacity in real power in the positive and negative plane may not be the same. Therefore, the power in the negative plane is not zero. The resulting contribution in real and reactive power of a battery storage asset is shown notionally by the normalized output in FIG. 36. FIG. 36 shows that the battery asset may only operate at half the real power as a sink as compared to when it is operating as a source.

Figure 37:
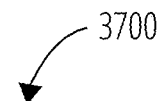
FIG. 37 is a plot illustrating real and reactive normalized solar asset power flexibility, according to some embodiments.
Figure 37:
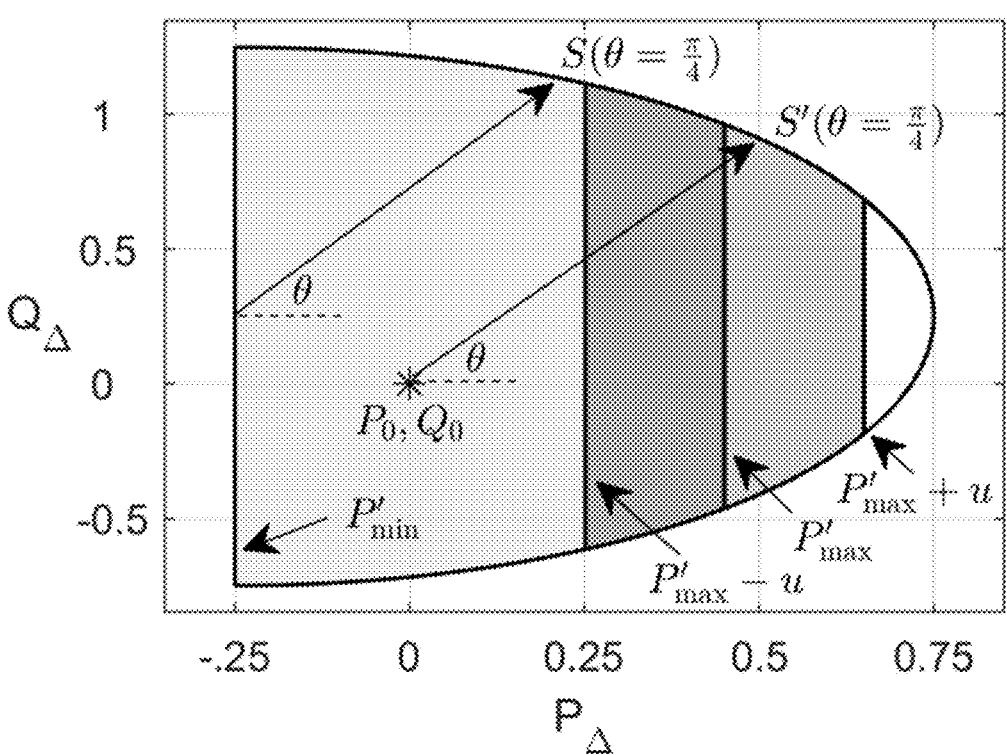

FIG. 37 is a plot illustrating real and reactive normalized solar asset power flexibility 3700, according to some embodiments. Next, the flexibility of the asset is determined. The flexibility is a measure from the current operating point to the operating capability limits. Thus, the flexibility is a translation from P=0, Q=0 to the operating point $P_0$, $Q_0$. The limits of the operating power S, $P_{max}$ and $P_{min}$ take the form S', $P'_{max}$, and $P'_{min}$ after the translation for the flexibility. The flexibility in real power is given mathematically as $$P_\Delta(\theta) = \begin{cases} \min[S'\cos(\theta), P'_{max} \pm u], & 0 \le \theta \le \frac{\pi}{2} \\ \min[S'\cos(\theta), P'_{max} \pm u], & \frac{3\pi}{2} \le \theta \le 2\pi \\ -\min[|S'\cos(\theta)|, |P'_{min}|], & \frac{\pi}{2} < \theta < \frac{3\pi}{2} \end{cases}.$$

Battery assets have an uncertainty of at least substantially zero. The flexibility in reactive power for both types of assets (batteries and solar) is given as $$Q_\Delta(\theta) = S' \sin(\theta)$$

The flexibility of a solar asset with uncertainty is shown in FIG. 37. The current operation point is P=0.25 and Q=−0.25.

Figure 38:
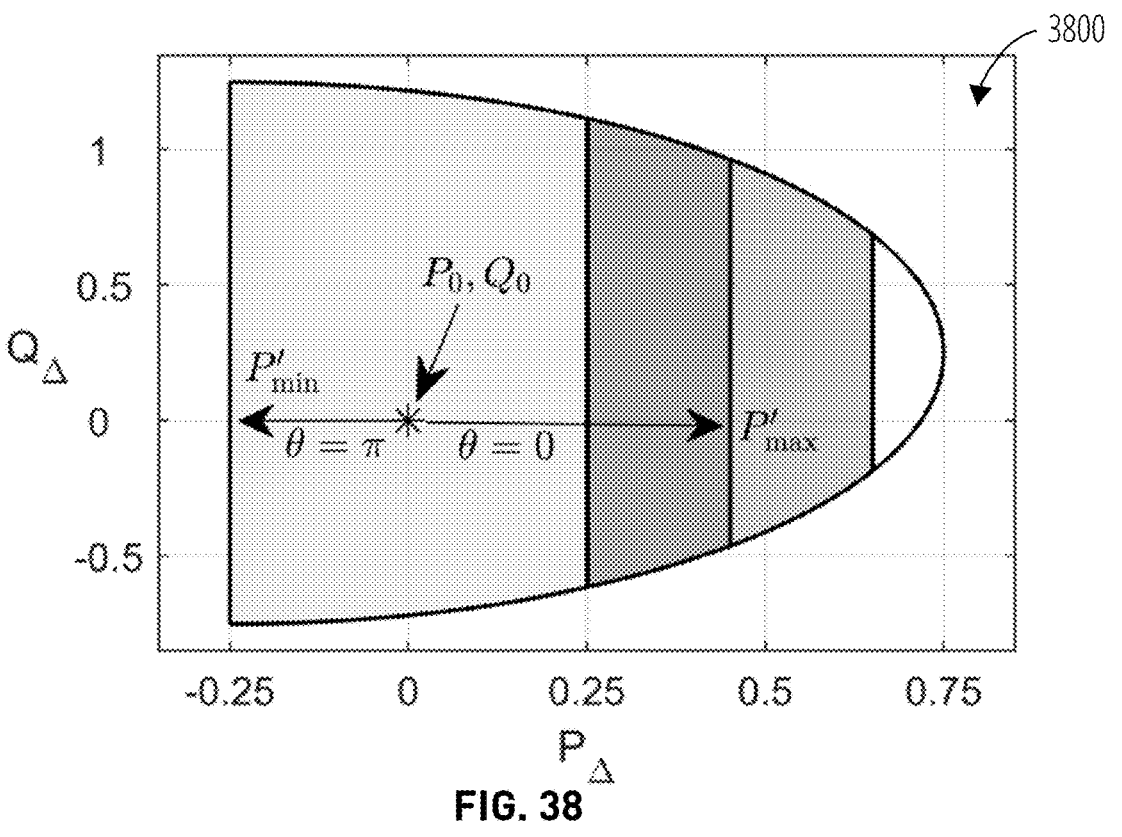
FIG. 38 is a plot illustrating real and reactive normalized solar asset power flexibility, according to some embodiments.

FIG. 38 is a plot illustrating real and reactive normalized solar asset power flexibility 3800, according to some embodiments.

Figure 39:
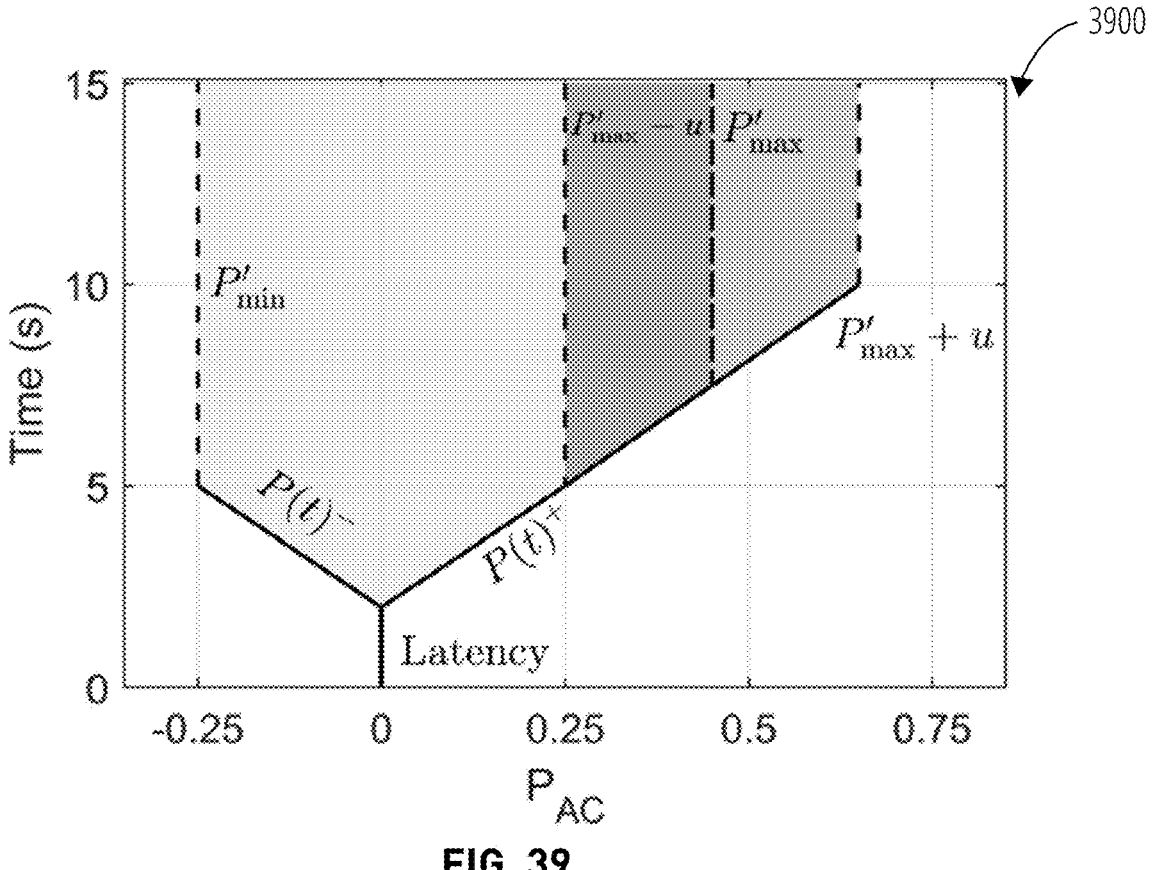
FIG. 39 is a plot illustrating a real normalized solar asset flexibility, according to some embodiments.

FIG. 39 is a plot illustrating a real normalized solar asset flexibility 3900, according to some embodiments. Referring to FIG. 38 and FIG. 39 together, the temporal limitations of the asset over the flexibility region are considered. Temporal constraints may include latency, ramp rates, and energy limitations. The latency, λ, is the time before a control action makes changes to the power output of the system. The ramp rate is how quickly the asset adjusts the power output from the current operating point after the latency. The temporal constraint in real power is given as $$P(t) = \begin{cases} 0, & t \le \lambda \\ \frac{dP}{dt}(t - \lambda), & t > \lambda \end{cases},$$

and the reactive power is given as $$Q(t) = \begin{cases} 0, & t \le \lambda \\ \frac{dQ}{dt}(t - \lambda), & t > \lambda \end{cases},$$

where t is the future time from current operation. Ramp rates may be dependent on direction and may be non-linear. In other words, the asset may ramp down quicker than it can ramp up. The temporal real power ramps up as $P(t)^+$ and as $P(t)^-$ when ramping down. The same is done for the reactive power.

With the flexibility and temporal constraints, the adaptive capacity at the power factor angles may be calculated. The adaptive capacity in real power is given as $$P_{AC}(\theta, t) = \begin{cases} \min[P_\Delta, P(t)^+], & 0 \le \theta \le \frac{\pi}{2} \\ \min[P_\Delta, P(t)^+], & \frac{3\pi}{2} \le \theta \le 2\pi \\ -\min[|P_\Delta|, |P(t)^-|], & \frac{\pi}{2} < \theta < \frac{3\pi}{2} \end{cases},$$

and the adaptive capacity in reactive power is given as $$Q_{AC}(\theta, t) = \begin{cases} \min[Q_\Delta, Q(t)^+], & 0 \le \theta \le \pi \\ -\min[|Q_\Delta|, |Q(t)^-|], & \pi < \theta < 2\pi \end{cases}.$$

The adaptive capacity in real power at a power factor angle of 0 and π is illustrated in FIG. 38 and FIG. 39. FIG. 38 illustrates that the flexibility of the asset is constrained by the maximum and minimum power at these power factor angles. FIG. 39 indicates the temporal constraints of the asset. A manifold shows the three dimensional view of these calculations at all power factor angles.

Figures 40, 41:
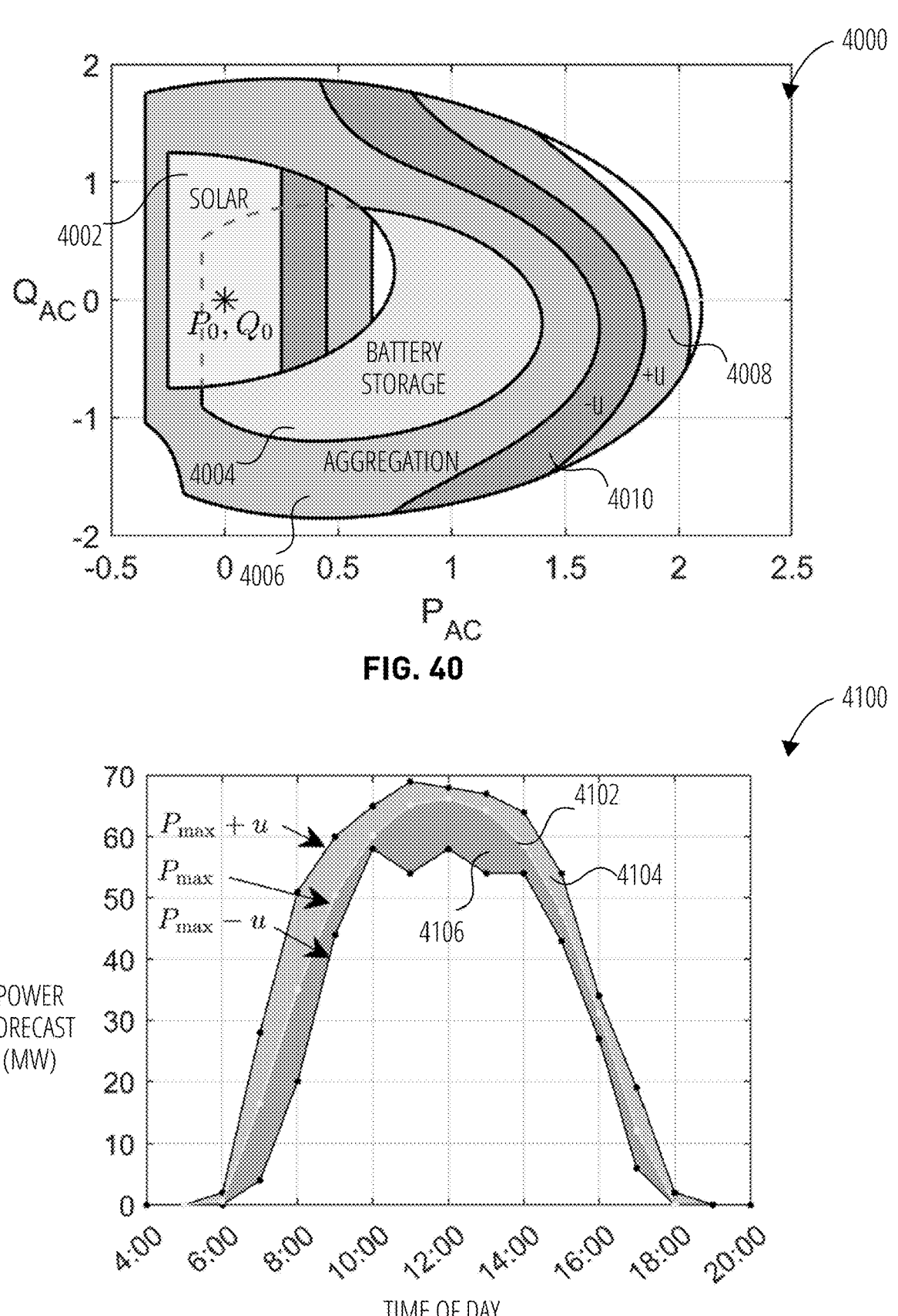
FIG. 40 is a plot illustrating active capacities of a solar asset, a battery asset, and an aggregation of the assets, according to some embodiments.
FIG. 41 is a plot of an example of day-ahead solar forecast data.

FIG. 40 is a plot illustrating active capacities 4000 of a solar asset, a battery asset, and an aggregation of the assets, according to some embodiments. The active capacities 4000 include a solar active capacity 4002, a battery storage active capacity 4004, and an aggregate active capacity 4006. The adaptive capacity of assets may be aggregated together to give the aggregate active capacity 4006. The aggregation of real power is given as $$P_{AC}(\theta, t) = \sum_{k=1}^{n} P_{AC_k},$$

and the aggregation of reactive power is given as $$Q_{AC}(\theta, t) = \sum_{k=1}^{n} Q_{AC_k},$$

where n is the number of assets. The aggregation of a solar and battery asset is shown in FIG. 40. The aggregate active capacity 4006 is the sum of the active capacities of the individual assets at any given power factor angle. Aggregate upper uncertainty 4008 and aggregate lower uncertainty 4010 for the aggregate active capacity 4006 are also shown in FIG. 40.

FIG. 41 is a plot of an example of day-ahead solar forecast data 4100. The day-ahead solar forecast data 4100 includes a forecast 4102 (yellow line), an upper uncertainty 4104 (shaded green), and a lower uncertainty 4106 (shaded red). The resilience metric purposed in a case study may use very short-term and short-term solar PV forecast data.

National Renewable Energy Laboratory (NREL) provides synthetic yearlong data for approximately 6,000 simulated PV plants. The forecast data includes 60-minute intervals for both day-ahead and 4 hour-ahead predictions. The data was generated using the 3TIER based on numerical weather predication simulations. In this work, solar data from Saturday, Aug. 19, 2006, in Arizona at location 33.45, −112.95 (latitude, longitude) was selected. The forecast data does not provide uncertainty. Therefore, uncertainty is generated. The accuracy of uncertainty may not necessarily be high, but the effect it has on the adaptive capacity of solar PV generation is useful. The forecast data and uncertainty used in the case studies is shown in FIG. 41.

Very short-term solar generation forecast are on the order of seconds or minutes. At this time scale the latency and ramp rate constraints are important for the assets' adaptive capacity. To demonstrate the very short-term adaptive capacity of a solar PV asset the forecast data in FIG. 41 at noon is used. A current power generation output of 50 MW is applied, a 1 second latency is used, and ramp rates for the real power in the positive and negative direction are assumed to be 10 MW/s and the reactive in both directions to be 10 MVAR/s. The resulting adaptive capacity of the asset using the forecasted power data is shown by the yellow plot in the top plot of FIG. 42.

Figure 42:
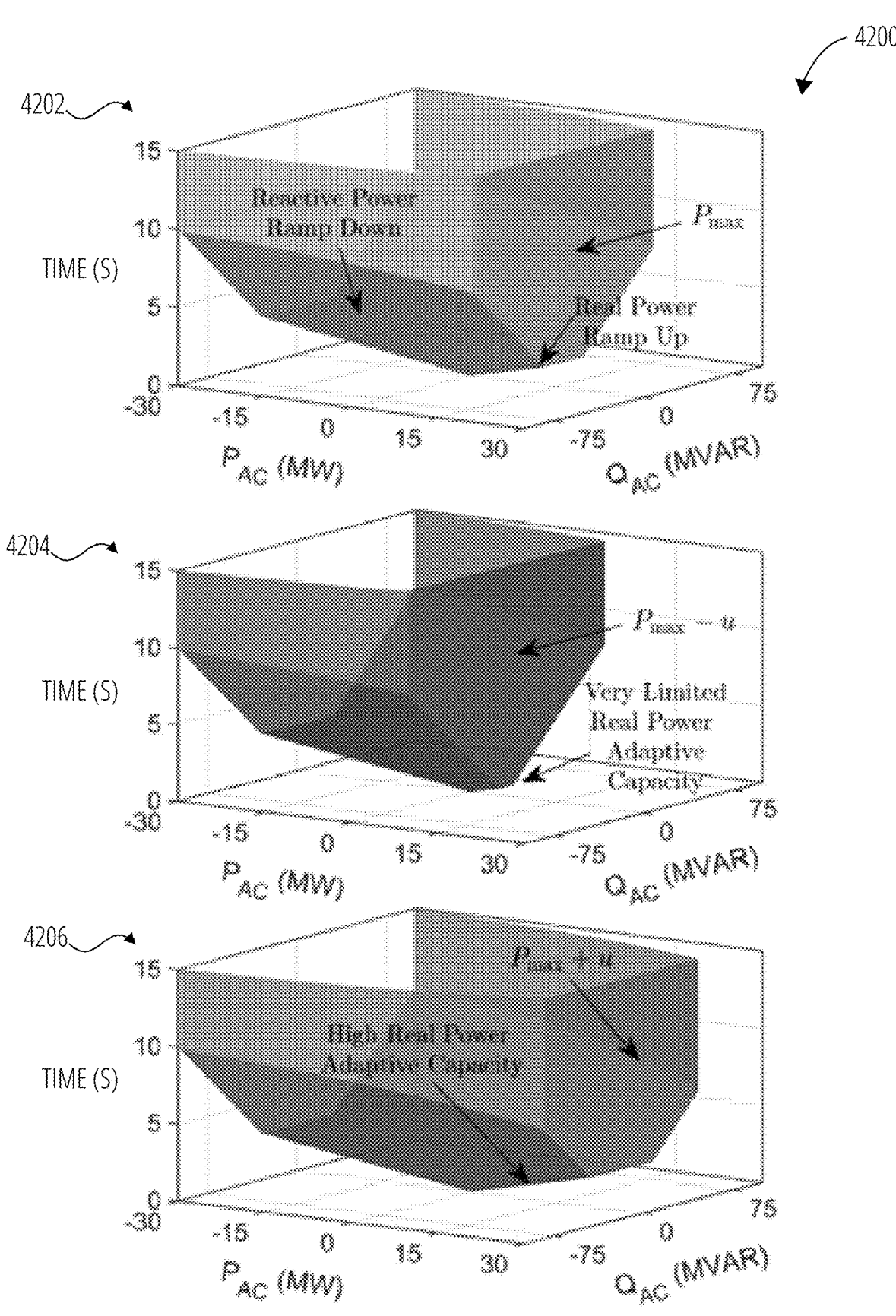
FIG. 42 illustrates plots of examples of short-term adaptive capacities.
Figure 43:
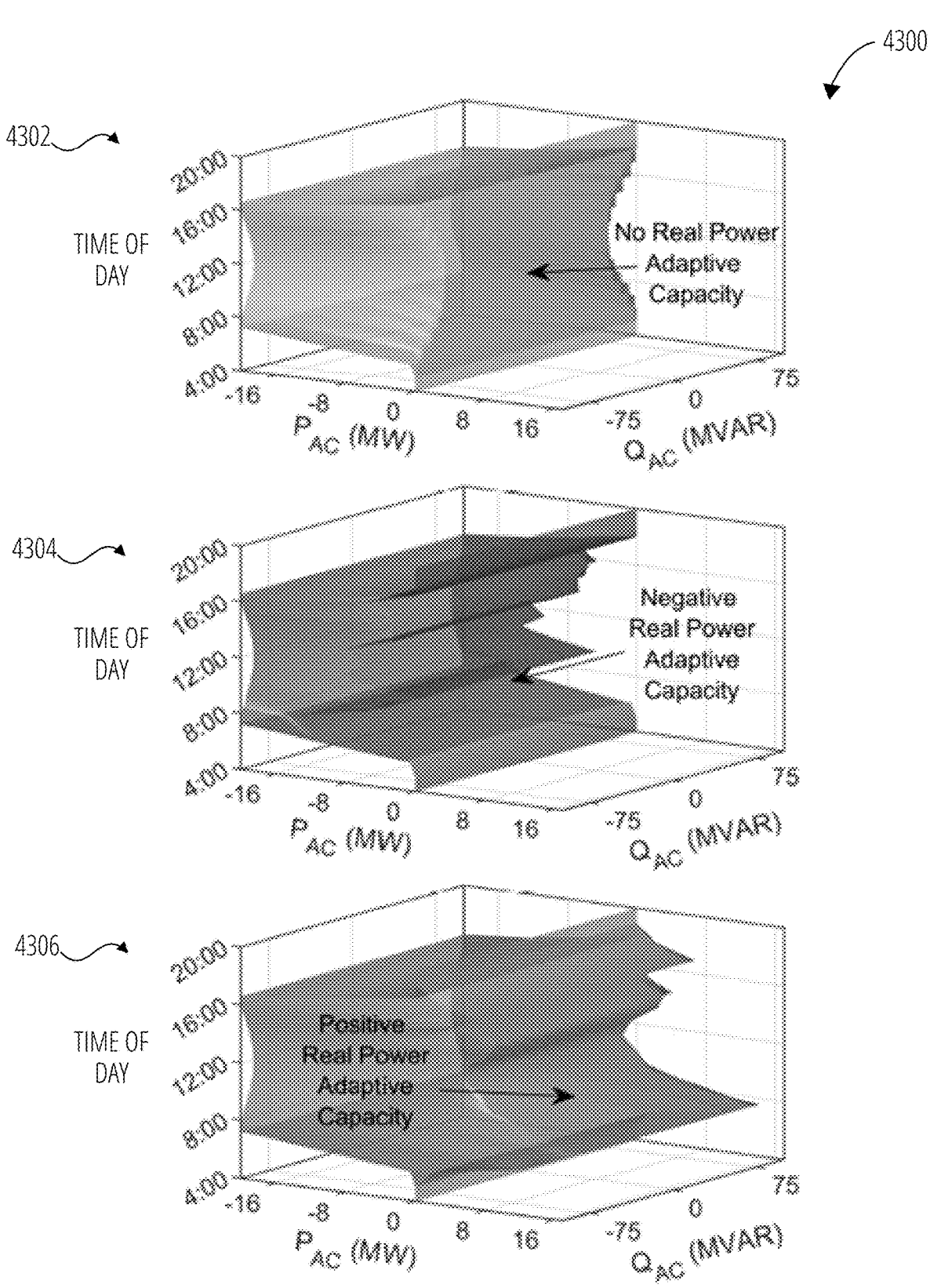
FIG. 43 illustrates plots of examples of solar asset day-long adaptive capacities.

FIG. 42 illustrates plots of examples of short-term adaptive capacities 4200. The short-term adaptive capacities 4200 include a top plot 4202, a middle plot 4204, and a bottom plot 4206. In FIG. 42, the middle plot 4204 represents the negative uncertainty, and the bottom plot 4206 represents the positive uncertainty. The plots have been zoomed-in near the operating point to show the difference in the adaptive capacity in the positive real direction (plots in the negative real direction are identical). FIG. 42 illustrates that when solar generation is in the negative uncertainty direction the adaptive capacity in real power is very small. On the other hand, when the solar generation is in the positive uncertainty direction there is additional adaptive capacity in real power. FIG. 43 shows the solar asset day-long adaptive capacities 4300 for the short-term forecast using day-long forecast data.

FIG. 43 illustrates plots of examples of solar asset day-long adaptive capacities 4300. The solar asset day-long adaptive capacities 4300 includes a top plot 4302, a middle plot 4304, and a bottom plot 4306. In this scenario, the short-term power forecast is considered to be day-ahead forecast power generation over a day, e.g., the full data shown in FIG. 41. It is assumed that the forecasted generation will be the operating point of the asset over the day. The results of the adaptive capacity, again near the origin to highlight the real power adaptive capacity differences, are shown in FIG. 43.

In FIG. 43 the top plot 4302 represents the asset adaptive capacity at the solar forecast, the middle plot 4304 represents the adaptive capacity for the negative uncertainty, and the bottom plot 4306 represent the adaptive capacity for the positive uncertainty. It can be seen that when the forecast generation is correct the adaptive capacity in the positive real power direction is zero. When the generation is at the positive uncertainty the solar PV asset contributes to additional real power adaptive capacity, therefore adding to the resilience of the overall grid. On the other hand, when the generation is at the negative uncertainty the real power adaptive capacity is negative and the asset may be considered a disturbance on the power system. In this case, reserve power may be used in order to maintain the desired frequency of the grid. For this reason, the addition of battery storage to this scenario may be considered.

The additional battery storage asset is assumed to have a maximum power output of 20 MW as a source and −10 MW as a sink with ±20 MVAR reactive capability. The operating point is assumed to be idle, where $P_0=0$ and $Q_0=0$. The results of the aggregation of the solar adaptive capacity at negative uncertainty and the battery storage asset is shown in FIG. 44.

Figure 44:
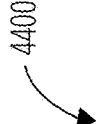
FIG. 44 is a plot illustrating an example of aggregate day-long adaptive capacity.

FIG. 44 is a plot illustrating an example of aggregate day-long adaptive capacity 4400. FIG. 44 illustrates that the addition of the battery asset contributes to the adaptive capacity in the positive real power. Therefore, the system has the capability to respond to disturbances in this direction. In other words, there is reserve power for an operator to maintain frequency stability of the system.

A framework for considering the resilience contribution of solar and battery storage assets to the grid is disclosed herein. An addition of uncertainty in adaptive capacity results from solar generation assets. When solar generation is above the forecast solar assets provide additional adaptive capacity in the positive direction of real power. However, when solar generation is below the forecasted generation, the adaptive capacity in the positive real power direction is negative, and may be considered a disturbance to the system. The addition of battery storage in this case may provide the needed adaptive capacity in real power.

Resilience metrics disclosed herein may be used to influence control decisions and result in a lower loss of power served to consumers during physical degradation and cyber-attack scenarios.

Figure 45:
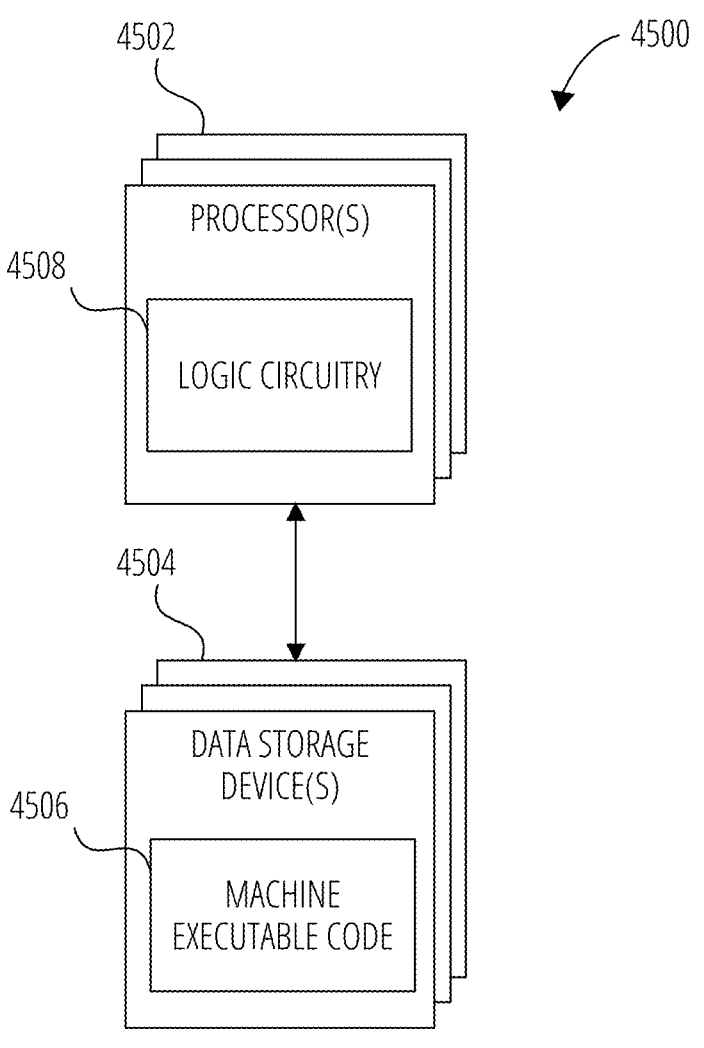
FIG. 45 is a block diagram of circuitry that, in some embodiments, may be used to implement various functions, operations, acts, processes, and/or methods disclosed herein.

It will be appreciated by those of ordinary skill in the art that functional elements of embodiments disclosed herein (e.g., functions, operations, acts, processes, and/or methods) may be implemented in any suitable hardware, software, firmware, or combinations thereof. FIG. 45 illustrates non-limiting examples of implementations of functional elements disclosed herein. In some embodiments, some or all portions of the functional elements disclosed herein may be performed by hardware specially configured for carrying out the functional elements.

FIG. 45 is a block diagram of circuitry 4500 that, in some embodiments, may be used to implement various functions, operations, acts, processes, and/or methods disclosed herein. The circuitry 4500 includes one or more processors 4502 (sometimes referred to herein as "processors 4502") operably coupled to one or more data storage devices (sometimes referred to herein as "storage 4504"). The storage 4504 includes machine executable code 4506 stored thereon and the processors 4502 include logic circuitry 4508. The machine executable code 4506 includes information describing functional elements that may be implemented by (e.g., performed by) the logic circuitry 4508. The logic circuitry 4508 is adapted to implement (e.g., perform) the functional elements described by the machine executable code 4506. The circuitry 4500, when executing the functional elements described by the machine executable code 4506, should be considered as special purpose hardware configured for carrying out functional elements disclosed herein. In some embodiments the processors 4502 may be configured to perform the functional elements described by the machine executable code 4506 sequentially, concurrently (e.g., on one or more different hardware platforms), or in one or more parallel process streams.

When implemented by logic circuitry 4508 of the processors 4502, the machine executable code 4506 is configured to adapt the processors 4502 to perform operations of embodiments disclosed herein. For example, the machine executable code 4506 may be configured to adapt the processors 4502 to perform at least a portion or a totality of operations of the DER integrated distribution grid utility 312 of FIG. 3, the resilience-icon diagram 400 of FIG. 4A and FIG. 4B, the main overview graphical user interface 500 of FIG. 5, the ASR overview graphical user interface 600 of FIG. 6, the architecture 1400 of FIG. 14, cyber-sensor architecture 1500 of FIG. 15, the functional flow diagram 1600 of FIG. 16, the cyber-physical health characterization 1808 of FIG. 18, and/or the IEEE-33 bus distributed system 3000 of FIG. 30.

The processors 4502 may include a general purpose processor, a special purpose processor, a central processing unit (CPU), a microcontroller, a programmable logic controller (PLC), a digital signal processor (DSP), an application specific integrated circuit (ASIC), a field-programmable gate array (FPGA) or other programmable logic device, discrete gate or transistor logic, discrete hardware components, other programmable device, or any combination thereof designed to perform the functions disclosed herein. A general-purpose computer including a processor is considered a special-purpose computer while the general-purpose computer is configured to execute functional elements corresponding to the machine executable code 4506 (e.g., software code, firmware code, hardware descriptions) related to embodiments of the present disclosure. It is noted that a general-purpose processor (may also be referred to herein as a host processor or simply a host) may be a microprocessor, but in the alternative, the processors 4502 may include any conventional processor, controller, microcontroller, or state machine. The processors 4502 may also be implemented as a combination of computing devices, such as a combination of a DSP and a microprocessor, a plurality of microprocessors, one or more microprocessors in conjunction with a DSP core, or any other such configuration.

In some embodiments the storage 4504 includes volatile data storage (e.g., random-access memory (RAM)), non-volatile data storage (e.g., Flash memory, a hard disc drive, a solid state drive, erasable programmable read-only memory (EPROM), etc.). In some embodiments the processors 4502 and the storage 4504 may be implemented into a single device (e.g., a semiconductor device product, a system on chip (SOC), etc.). In some embodiments the processors 4502 and the storage 4504 may be implemented into separate devices.

In some embodiments the machine executable code 4506 may include computer-readable instructions (e.g., software code, firmware code). By way of non-limiting example, the computer-readable instructions may be stored by the storage 4504, accessed directly by the processors 4502, and executed by the processors 4502 using at least the logic circuitry 4508. Also by way of non-limiting example, the computer-readable instructions may be stored on the storage 4504, transferred to a memory device (not shown) for execution, and executed by the processors 4502 using at least the logic circuitry 4508. Accordingly, in some embodiments the logic circuitry 4508 includes electrically configurable logic circuitry 4508.

In some embodiments the machine executable code 4506 may describe hardware (e.g., circuitry) to be implemented in the logic circuitry 4508 to perform the functional elements. This hardware may be described at any of a variety of levels of abstraction, from low-level transistor layouts to high-level description languages. At a high-level of abstraction, a hardware description language (HDL) such as an IEEE Standard hardware description language (HDL) may be used. By way of non-limiting examples, Verilog™, System Verilog™ or very large scale integration (VLSI) hardware description language (VHDL™) may be used.

HDL descriptions may be converted into descriptions at any of numerous other levels of abstraction as desired. As a non-limiting example, a high-level description can be converted to a logic-level description such as a register-transfer language (RTL), a gate-level (GL) description, a layout-level description, or a mask-level description. As a non-limiting example, micro-operations to be performed by hardware logic circuits (e.g., gates, flip-flops, registers, without limitation) of the logic circuitry 4508 may be described in a RTL and then converted by a synthesis tool into a GL description, and the GL description may be converted by a placement and routing tool into a layout-level description that corresponds to a physical layout of an integrated circuit of a programmable logic device, discrete gate or transistor logic, discrete hardware components, or combinations thereof. Accordingly, in some embodiments the machine executable code 4506 may include an HDL, an RTL, a GL description, a mask level description, other hardware description, or any combination thereof.

In embodiments where the machine executable code 4506 includes a hardware description (at any level of abstraction), a system (not shown, but including the storage 4504) may be configured to implement the hardware description described by the machine executable code 4506. By way of non-limiting example, the processors 4502 may include a programmable logic device (e.g., an FPGA or a PLC) and the logic circuitry 4508 may be electrically controlled to implement circuitry corresponding to the hardware description into the logic circuitry 4508. Also by way of non-limiting example, the logic circuitry 4508 may include hard-wired logic manufactured by a manufacturing system (not shown, but including the storage 4504) according to the hardware description of the machine executable code 4506.

Regardless of whether the machine executable code 4506 includes computer-readable instructions or a hardware description, the logic circuitry 4508 is adapted to perform the functional elements described by the machine executable code 4506 when implementing the functional elements of the machine executable code 4506. It is noted that although a hardware description may not directly describe functional elements, a hardware description indirectly describes functional elements that the hardware elements described by the hardware description are capable of performing.

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, etc.) of the computing system. In some embodiments, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims) are generally intended as "open" terms (e.g., the term "including" should be interpreted as "including, but not limited to,"

the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventors.

What is claimed is:

1. A system, comprising:
physical equipment including one or more assets;
network equipment to enable at least one of the one or more assets to engage in network communications over one or more networks, the network communications including network communications of packets over the one or more networks;
a human machine interface (HMI) operably coupled to the physical equipment and to the network equipment; and
one or more processors configured to:
determine a physical health metric indicating a physical health of the physical equipment, the physical health metric determined based, at least in part, on detected anomalies in operation of the physical equipment;
determine a cyber health metric indicating a cyber health of the network equipment, the cyber health metric determined based, at least in part, on detected anomalies in traffic behavior of the network communications of the packets, the detected anomalies in the traffic behavior corresponding to cyberattacks on the one or more networks, the traffic behavior of the network communications of the packets identified from captured and analyzed packet header features of the packets;
determine a resilience metric for the physical equipment, the resilience metric including a real power component and a reactive power component determined based, at least in part, on an aggregation of real components and reactive components of adaptive capacities of the one or more assets;
generate a graphical user interface for display in the HMI, the graphical user interface including a diagram having a physical condition indicator, a cybernetic condition indicator, and a resilience condition indicator, the physical condition indicator based, at least in part, on the physical health metric, the cybernetic condition indicator based, at least in part, on the cyber health metric, and the resilience condition indicator based, at least in part, on the resilience metric; and
receive, via the HMI, a corrective action for processing in response to an adverse condition or threat indicated by the diagram of the graphical user interface, the corrective action to correct or prevent a system violation relating to a physical fault associated with the detected anomalies in the operation of the physical equipment when indicated by at least the physical condition indicator in the diagram, the corrective action to correct or prevent a system violation relating to a cyberattack-induced fault associated with the detected anomalies in the traffic behavior corresponding to a cyberattack when indicated by at least the cybernetic condition indicator in the diagram.

2. The system of claim 1, wherein the resilience metric is indicative of a magnitude and a duration of a disturbance during which the physical equipment is predicted to continue to operate within predefined normal operational parameters.

3. The system of claim 1, wherein the one or more processors are further configured to generate the graphical user interface including the diagram comprising a resilience-icon diagram, the resilience-icon diagram including the physical condition indicator, the cybernetic condition indicator, and the resilience condition indicator.

4. The system of claim 3, wherein the one or more processors are further configured to display resilience-icon diagrams for each of a plurality of aggregated system resources of an electrical power distribution system.

5. The system of claim 1, wherein the physical equipment includes electrical power distribution equipment.

6. The system of claim 1, wherein the physical equipment includes a solar generator asset.

7. The system of claim 6, wherein the one or more processors are configured to determine a solar resilience metric for the solar generator asset, the solar resilience metric based, at least in part, on a real component and a reactive component of an adaptive capacity of the solar generator asset, the solar resilience metric taking into consideration an uncertainty of the adaptive capacity of the solar generator asset.

8. The system of claim 6, wherein the physical equipment further includes a battery power storage asset.

9. The system of claim 8, wherein the one or more processors are configured to determine a battery resilience metric for the battery power storage asset, the battery resilience metric taking into consideration operation of the battery power storage asset as a power source during battery power discharge and as a power sink during battery power storage asset charging.

10. The system of claim 1, wherein the detected anomalies in the traffic behavior corresponding to the cyberattacks include multiple ones of a Denial-of-Service (DoS) attack, a reconnaissance attack, a replay attack, a data-insertion attack, a false-data-insertion attack, a Distributed Network Protocol 3 (DNP3) data injection attack, an IP scan attack, and a port scan attack.

11. The system of claim 1, wherein, in the graphical user interface, the diagram having the cybernetic condition indicator, the physical condition indicator, and the resilience condition indicator provides differentiation between physical faults associated with the physical equipment and cyber-attack-induced faults associated with the network equipment.

12. A cyber-physical system, comprising:
physical equipment;
network equipment configured to enable the physical equipment to engage in network communications over one or more networks, the network communications including network communications of packets over the one or more networks;
a physical anomaly detection system (ADS) configured to detect anomalies in operation of the physical equipment and provide a physical component of a cyber-physical metric based on the detected anomalies in the operation of the physical equipment;
a cyber ADS configured to detect anomalies in traffic behavior of the network communications of the packets over the one or more networks and provide a cyber component of the cyber-physical metric based on the detected anomalies in the traffic behavior, the detected anomalies in the traffic behavior corresponding to cyberattacks on the one or more networks, the traffic behavior of the network communications of the packets identified based on analysis of packet header features extracted from the packets; and
human machine interface (HMI) operably coupled to the physical equipment and to the one or more networks, the HMI to:
present, for display, integrated information from the physical ADS and the cyber ADS, the integrated information including the cyber-physical metric indicating the physical component and the cyber component; and
receive a corrective action for processing in response to an adverse condition or threat indicated by the displayed integrated information, the corrective action to correct or prevent a system violation relating to a physical fault associated with the detected anomalies in the operation of the physical equipment when indicated by at least the physical component of the cyber-physical health metric, the corrective action to correct or prevent a system violation relating to a cyberattack-induced fault associated with the detected anomalies in the traffic behavior corresponding to a cyberattack when indicated by at least the cyber component of the cyber-physical health metric.

13. The cyber-physical system of claim 12, wherein the cyber ADS is configured to detect the anomalies in the behavior of the network communications of the packets by:

dissecting the packets communicated through the one or more networks;
extracting the packet header features from dissected packets; and
detecting anomalies in the traffic behavior of the network communications of the packets based on analysis of the extracted packet header features.

14. The cyber-physical system of claim 13, wherein the cyber ADS is configured to detect the anomalies in the traffic behavior of the network communications of the packets using a machine learning algorithm.

15. The cyber-physical system of claim 14, wherein:
the cyber ADS is configured to train the machine learning algorithm using normal extracted packet header features from normal traffic behavior of the network communications of the packets corresponding to normal operation of the cyber-physical system; and
the machine learning algorithm is configured to detect the anomalies in the behavior of the network communications responsive to differences between the extracted packet header features and the normal extracted packet header features.

16. The cyber-physical system of claim 13, wherein the cyber ADS is configured to use a rolling window to analyze the packets.

17. The cyber-physical system of claim 16, wherein the rolling window is substantially one second in length.

18. The cyber-physical system of claim 17, further comprising one or more processors configured to determine a resilience metric for the physical equipment, the resilience metric including a real power component and a reactive power component based, at least in part, on an aggregation of real components and reactive components of adaptive capacities of one or more assets of the physical equipment.

19. The cyber-physical system of claim 12, wherein, in the HMI, the cyber-physical metric indicating the physical component and the cyber component indicates an extent to which respective ones of the detected anomalies in the operation of the physical equipment and the detected anomalies in the traffic behavior corresponding to the cyberattack affect an overall cyber-physical health of the cyber-physical system.

20. The cyber-physical system of claim 12, wherein respective ones of the physical ADS and the cyber ADS are configured in temporal synchronization with each other to detect anomalies substantially in real-time.

21. An electrical power distribution system, comprising:
physical equipment including a solar generator asset and a battery power storage asset;
network equipment configured to enable the physical equipment to engage in network communications over one or more networks, the network communications including network communications of packets over the one or more networks;
a human machine interface (HMI) operably coupled to the physical equipment and to the network equipment; and
one or more processors configured to:
determine a physical health metric indicating a physical health of the physical equipment, the physical health metric determined based, at least in part, on detected anomalies in operation of the physical equipment;
determine a cyber health metric indicating a cyber health of the network equipment, the cyber health metric determined based, at least in part, on detected anomalies in traffic behavior of the network communications of the packets, the detected anomalies in the traffic behavior corresponding to cyberattacks on the one or more networks, the traffic behavior of the
network communications of the packets identified
from captured and analyzed packet header features
of the packets;
determine a resilience metric for the physical equipment, the resilience metric including a real power
component and a reactive power component based,
at least in part, on the physical health of the physical
equipment and the cyber health of the network
equipment;
generate integrated information for display in the HMI,
the integrated information indicating an overall
cyber-physical health of the system, the integrated
information including the physical health metric, the
cyber health metric, and the resilience metric; and
receive, via the HMI, a corrective action for processing
in response to an adverse condition or threat indi-
cated by the displayed integrated information, the
corrective action to correct or prevent a system
violation in the system relating to a physical fault
associated with the detected anomalies in the opera-
tion of the physical equipment when indicated by at
least the physical health metric in the displayed
integrated information, the corrective action to cor-
rect or prevent a system violation in the system
relating to a cyberattack-induced fault associated
with the detected anomalies in the traffic behavior
corresponding to a cyberattack when indicated by at
least the cyber health metric in the displayed inte-
grated information.

\* \* \* \* \*